(12) United States Patent
Fukuoka et al.

(10) Patent No.: US 6,844,210 B2
(45) Date of Patent: Jan. 18, 2005

(54) ORGANIC ELECTROLUMINESCENCE DEVICE AND METHOD OF MANUFACTURING SAME

(75) Inventors: Kenichi Fukuoka, Sodegaura (JP); Mitsuru Eida, Sodegaura (JP)

(73) Assignee: Idemitsu Kosan Co., Ltd. (JP)

( * ) Notice: Subject to any disclaimer, the term of this patent is extended or adjusted under 35 U.S.C. 154(b) by 242 days.

(21) Appl. No.: 10/201,903

(22) Filed: Jul. 25, 2002

(65) Prior Publication Data

US 2003/0075714 A1 Apr. 24, 2003

Related U.S. Application Data

(60) Division of application No. 09/727,454, filed on Dec. 4, 2000, now Pat. No. 6,469,438, and a continuation of application No. PCT/JP00/02182, filed on Apr. 4, 2000.

(30) Foreign Application Priority Data

Apr. 5, 1999 (JP) .......................................... 11-097727

(51) Int. Cl.$^7$ .............................................. H01L 21/00
(52) U.S. Cl. ............................ 438/22; 438/27; 438/29; 438/30; 438/48
(58) Field of Search .............................. 438/22, 27, 29, 438/30, 48, 82; 313/504, 506; 257/72, 98, 222

(56) References Cited

U.S. PATENT DOCUMENTS 5,294,870 A    3/1994  Tang et al. .................. 313/504
5,932,895 A    8/1999  Shen et al. .................... 257/89
6,091,195 A    7/2000  Forrest et al. ............... 313/504
6,249,372 B1 * 6/2001  Kobayashi et al. ......... 359/326

FOREIGN PATENT DOCUMENTS

| EP | 0 653 902 A1 | 5/1995 |
| JP | 5-3081 | 1/1993 |
| JP | 7-78689 | 3/1995 |
| JP | 7-240277 | 9/1995 |

* cited by examiner

*Primary Examiner*—Hsien-Ming Lee
(74) *Attorney, Agent, or Firm*—Parkhurst & Wendel, L.L.P.

(57) ABSTRACT

A method of manufacturing an organic electroluminescence device containing an organic layer formed between electrodes, at least one of which is a transparent electrode, the method including a step of forming the transparent electrode and the organic layer that satisfies the following inequality (a) or inequality (b) or both:

Min−20 nm<$t$<Min+20 nm     (a)

Max−20 nm<$t$<Max+20 nm     (b)

wherein t is the total optical path length (nm), Min is the optical path length (nm) at which the CIEx chromaticity coordinates or CIEy chromaticity coordinates measured according to JIS Z 8701 exhibit a minimum value, and Max is the optical path length (nm) at which the CIEx chromaticity coordinates or CIEy chromaticity coordinates measured according to JIS Z 8701 exhibit a maximum value.

4 Claims, 35 Drawing Sheets

ORGANIC ELECTROLUMINESCENCE DEVICE AND METHOD OF MANUFACTURING SAME

CROSS REFERENCE TO RELATED APPLICATION

This is a Divisional application of Ser. No. 09/727,454 filed on Dec. 4, 2000, now U.S. Pat. 6,469,438, and is a continuation application of PCT International Application of PCT/JP00/02182 filed on Apr. 4, 2000.

TECHNICAL FIELD

The present invention relates to an organic electroluminescence device (hereinafter sometimes called "organic EL device" or "EL device"). More particularly, the present invention relates to an organic EL device suitably used for display apparatuses for home use or industrial use, light sources for printer heads, and the like.

BACKGROUND ART

An example of conventional organic EL devices is disclosed in JP-A-7-78689. The organic EL device disclosed in this patent application has an objective of obtaining high luminescent brightness. This EL device is characterized in that the wavelength of an interference peak (A2) is coincided with the wavelength of a intensity peak (B2) of light produced in an organic light-emitting layer as shown in FIG. 20. Specifically, an interference effect occurs when light produced in an organic light-emitting layer passes through several thin film layers. The objective of the invention of the above-described patent application is to accord the wavelength of the interference peak due to this interference effect with the wavelength of the intensity peak for light produced in the light-emitting layer.

However, if the interference peak wavelength due to the interference effect is coincided with the intensity peak wavelength, a tendency for a color purity (CIE chromaticity coordinates) decrease is experienced. For example, a blue light of organic EL device with a intensity peak wavelength in the range of 400 to 490 nm includes green light components with a high luminous efficacy. If the interference peak wavelength is coincided with the intensity peak wavelength, the intensity of the green light components is also increased, resulting in a tendency for a decrease in the color purity (CIE chromaticity coordinates).

Also, JP-A-7-240277 discloses an organic EL device in which the total optical thickness of high refractive index transparent electrodes and organic light-emitting layers is designed so as to increase the center wavelength value.

However, in this organic EL device, a color purity decreases because an increase in the center wavelength value also entails an increase in the intensity at neighborhood of the center wavelength.

A constant CIE color coordinate value can be obtained if the thickness of the organic light-emitting layers is definitely uniform and does not fluctuate any more. However, this is not practical because such an organic light-emitting layer can be produced only at the extreme sacrifice of production yield.

As a result of extensive studies to solve these problems, the inventors of the present invention have found the following things, namely, the CIE chromaticity coordinate values which is measured in accordance with JIS Z 8701, periodically varies with peaks and valleys corresponding to the total optical path length of a transparent electrode and an organic layer. Thus, a change in the CIE chromaticity coordinate value can be decreased if the thickness of the organic layer is determined taking the values for such peaks and valleys into consideration so that the interference peak wavelength and the intensity peak wavelength are staggered to a certain extent.

Specifically, an object of the present invention is to provide an organic EL device exhibiting only a slight change in the color purity (CIE chromaticity coordinates) even if the total optical path length of a transparent electrode and an organic layer changes in a prescribed range, and a method of efficiently manufacturing such an organic EL device.

DISCLOSURE OF THE INVENTION (1) One embodiment of the present invention provides an organic EL device containing an organic layer formed between electrodes at least one of which is a transparent electrode, wherein the total optical path length (t) of the transparent electrode and the organic layer satisfies the following inequality (a) or inequality (b) or both:

$$\text{Min}-20 \text{ nm} < t < \text{Min}+20 \text{ nm} \quad (a)$$

$$\text{Max}-20 \text{ nm} < t < \text{Max}+20 \text{ nm} \quad (b)$$

wherein t is the total optical path length (nm), Min is the optical path length (nm) at which the CIEx chromaticity or CIEy chromaticity measured according to JIS Z 8701 exhibits a minimum value, and Max is the optical path length (nm) at which the CIEx chromaticity coordinates or CIEy chromaticity coordinates measured according to JIS Z 8701 exhibit a maximum value.

This configuration ensures excellent color purity even if there is a fluctuation (deviation) in thickness of organic layers in a prescribed range, because the use of the optical path length value close to maximum or minimum values exhibits only a small change in the color purity (in the CIE chromaticity coordinates).

With regard to the unit (nm) for the total optical path length (t) of the transparent electrode and the organic layer, and the unit of Min and Max which are the optical path lengths at which the CIEx chromaticity coordinates or CIEy chromaticity coordinates exhibit a maximum or minimum, they are sometimes omitted for the sake of convenience.

(2) In the organic EL device of the present invention, it is preferable that the total optical path length (t) of the transparent electrode and the organic layer be coincided with the optical path length at which the CIEx chromaticity coordinates or CIEy chromaticity coordinates exhibit a minimum value (Min) or the optical path length at which the CIEx chromaticity coordinates or CIEy chromaticity coordinates exhibit a maximum value (Max).

This configuration ensures excellent color purity even if there is the fluctuation in the thickness of organic layers in a prescribed range because the use of the maximum or minimum values as the optical path length value exhibits only a small change in the color purity (in the CIE chromaticity coordinates).

(3) In the organic EL device of the present invention, it is preferable that the intensity peak wavelength (S1) of the organic layer be in the range of about 400 to 490 nm and the total optical path length (t1) of the transparent electrode and the organic layer be coincided with the optical path length at which the CIEy chromaticity coordinates exhibit a minimum value (Min).

This configuration ensures an organic EL device exhibiting excellent pure blue.

This is because a color tone change of blue light is affected by the CIEy chromaticity coordinates rather than the CIEx chromaticity coordinates. The additional reason for causing the total optical path length (t1) to coincide with a minimum value is that the color tone change of blue light is smaller when the total optical path length (t1) coincides with a minimum value.

(4) In the organic EL device of the present invention, it is preferable that the intensity peak wavelength (S2) of the organic layer be in the range of about 580 to 700 nm and the total optical path length (t2) of the transparent electrode and the organic layer be coincided with the optical path length at which the CIEx chromaticity coordinates exhibit a maximum value (Max) or at which the CIEy chromaticity coordinates exhibit a minimum value (Min).

This configuration ensures an organic EL device exhibiting excellent pure red.

This is because a color tone change of red light is affected by the CIEx chromaticity coordinates rather than the CIEy chromaticity coordinates. The additional reason for causing the total optical path length (t2) to coincide with a maximum value or minimum value (a peak or valley) is that the color tone change of red light is small when the total optical path length (t1) coincides with either a maximum value or a minimum value.

(5) In the organic EL device of the present invention, it is preferable that the intensity peak wavelength (S3) of the organic layer be in the range of about 500 to 570 nm and the total optical path length (t3) of the transparent electrode and the organic layer be coincided with the optical path length at which the CIEy chromaticity coordinates exhibit a maximum value (Max).

This configuration ensures an organic EL device exhibiting excellent pure green. This is because a color tone change of green light is affected by the CIEy chromaticity coordinates rather than the CIEx chromaticity coordinates. The additional reason for causing the total optical path length (t3) to coincide with a maximum value is that the color tone change of green light is smaller when the total optical path length (t3) coincides with a maximum value.

(6) In the organic EL device of the present invention, it is preferable that the distribution of the total optical path length (t) of the transparent electrode and the organic layer in the plane be within ±20 nm.

This configuration mitigates and reduces the change in the color purity (CIE chromaticity coordinates) due to thickness distribution of the transparent electrodes and organic layers.

Here, the distribution in the plane within ±20 nm means that the difference between the maximum and the minimum value of the optical path length in the plane measured by using an ellipsometer is 40 nm or less.

(7) In the organic EL device of the present invention, it is preferable that the organic EL device be provided with an optical path length correcting layer for adjusting the value of the total optical path length (t) of the transparent electrode and the organic layer.

This configuration ensures easy adjustment of the total optical path length (t) of the transparent electrode and the organic layer, which may decrease the change in the color purity (in the CIE chromaticity coordinates) even if the organic layer suffers from the thickness deviation (fluctuation) in a prescribed range.

(8) Another embodiment of the present invention is an organic EL device comprising a blue light emitting organic layer having a intensity peak wavelength of about 400 to 490 nm, a green light emitting organic layer having a intensity peak wavelength of about 500 to 570 nm, and a red light emitting organic layer having a intensity peak wavelength of about 580 to 700 nm, formed between electrodes at least one of which is a transparent electrode, wherein the total optical path length (t1) of the transparent electrode and the blue light emitting organic layer satisfies the inequality, Min−20 nm<t1<Min+20 nm, wherein Min is the optical path length (nm) at which the CIEy chromaticity coordinates measured according to JIS Z 8701 exhibits a minimum value; the total optical path length (t3) of the transparent electrode and the green light emitting organic layer satisfies the inequality, Max−20 nm<t3<Max+20 nm, wherein Max is the optical path length (nm) at which the CIEy chromaticity coordinates measured according to JIS Z 8701 exhibits a maximum value; or the total optical path length (t2) of the transparent electrode and the red light emitting organic layer satisfies the inequality, Max−20 nm<t2<Max+20 nm, wherein Max is the optical path length (nm) at which the CIEx chromaticity coordinates measured according to JIS Z 8701 exhibit a maximum value.

This configuration minimizes the change in the color purity (in the CIE chromaticity coordinates) for each three primary colors (red, blue, green) even if there is the fluctuation in the thickness of organic layers in a prescribed range.

Therefore, a color display with excellent color tone is ensured even in the case where the area occupied by the organic layer in the organic EL device is enlarged.

(9) Another embodiment of the present invention is an organic EL device comprising a blue light emitting organic layer having a intensity peak wavelength of about 400 to 490 nm, a green light emitting organic layer having a intensity peak wavelength of about 500 to 570 nm, and a red light emitting organic layer having a intensity peak wavelength of about 580 to 700 nm, formed between electrodes at least one of which is a transparent electrode, wherein the total optical path length (t1) of the transparent electrode and the blue light emitting organic layer satisfies the inequality, Min−20 nm<t1<Min+20 nm, wherein Min is the optical path length (nm) at which the CIEy chromaticity coordinates measured according to JIS Z 8701 exhibits a minimum value; the total optical path length (t3) of the transparent electrode and the green light emitting organic layer satisfies the inequality, Max−20 nm<t3<Max+20 nm, wherein Max is the optical path length (nm) at which the CIEy chromaticity coordinates measured according to JIS Z 8701 exhibits a maximum value; and the total optical path length (t2) of the transparent electrode and the red light emitting organic layer satisfies the inequality, Max−20 nm<t2<Max+20 nm, wherein Max is the optical path length (nm) at which the CIEx chromaticity coordinates measured according to JIS Z 8701 exhibit a maximum value.

This configuration minimizes the change in the color purity (in the CIE chromaticity coordinates) for any one of three primary colors (red, blue, green) even if there is the fluctuation in the thickness of organic layers in a prescribed range.

Therefore, a color display with excellent color tone is ensured even in the case where the area occupied by the organic layer in the organic EL device is enlarged.

(10) In forming the organic EL device of the present invention, it is preferable to provide a color changing medium on the light emitting side (namely the EL light extracting side).

This configuration ensures a full color display by appropriately combining color changing media such as a color filter or color changing device even if one type of the organic layer is used.

Therefore, the configuration of the organic EL device can be simplified and the production becomes easy, even if the organic EL device is for a full color display.

(11) Still another embodiment of the present invention provides a method of manufacturing an organic EL device containing an organic layer formed between electrodes at least one of which is a transparent electrode,
wherein the method comprising a forming step of the transparent electrode and the organic layer which satisfies the following inequality (a) or inequality (b) or both:

$$\text{Min}-20 \text{ nm} < t < \text{Min}+20 \text{ nm} \quad (a)$$

$$\text{Max}-20 \text{ nm} < t < \text{Max}+20 \text{ nm} \quad (b)$$

wherein t is the total optical path length (nm), Min is the optical path length (nm) at which the CIEx chromaticity coordinates or CIEy chromaticity coordinates measured according to JIS Z 8701 exhibit a minimum value, and Max is the optical path length (nm) at which the CIEx chromaticity coordinates or CIEy chromaticity coordinates measured according to JIS Z 8701 exhibit a maximum value.

This method ensures efficient manufacture of organic EL devices with a minimal change in the color purity (CIE chromaticity coordinates) even if there is the fluctuation in the thickness of organic layers in a prescribed range.

(12) In the method of manufacturing the organic EL device of the present invention, it is preferable that an organic layer be formed on a previously fabricated transparent electrode and the total optical path length (t) be adjusted.

This method of manufacture enables the use of a prescribed transparent electrode, for example, a commercially available transparent electrode as is, and adjustment of the total optical path length (t) by adjusting the thickness and refractive index of the organic layer.

(13) In the method of manufacturing the organic EL device of the present invention, it is preferable to provide a step of forming an optical path length correcting layer for adjusting the value of the total optical path length (t) of the transparent electrode and the organic layer.

This method of manufacture ensures easy adjustment of the total optical path length of the transparent electrode and the organic layer, enabling efficient production of an organic EL device which suffers a minimal change in the color purity (CIE chromaticity coordinates) even if the thickness fluctuation occurs in the organic layer in a prescribed range.

BEST MODE FOR CARRYING OUT THE INVENTION

Figure 1:
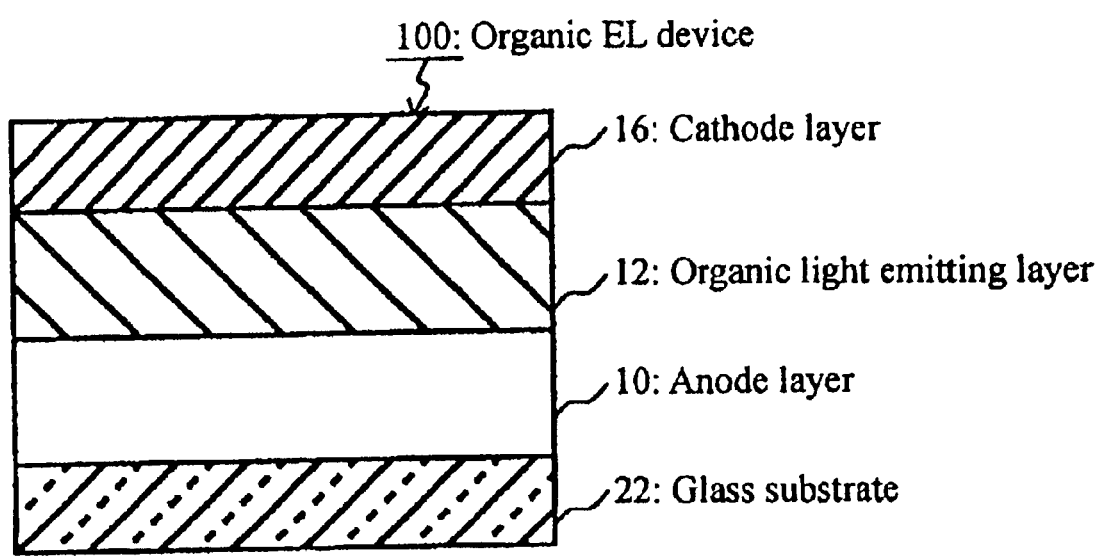
FIG. 1 shows a cross-sectional view of the organic EL device in the first and second embodiments.

Embodiments of the present invention will be explained with reference to the drawings. The drawings schematically show the sizes, shapes, and positional relationships of the components to assist understanding of the present invention. Accordingly, the present invention shall not be limited to the embodiments shown in the drawings. Hatching to indicate sections is sometimes omitted in the drawing.

(First embodiment)

As shown in FIG. 1, an organic EL device 100 of the first embodiment has a transparent electrode layer (an anode layer) 10, a blue light emitting organic layer 12 of which the intensity peak wavelength (SI) is between 400 and 490 nm, and a cathode layer 16 formed on a glass substrate 22 in this order.

In the organic EL device 100 of the first embodiment, the total optical path length (t1) of the transparent electrode 10 and the blue light emitting organic layer 12 satisfies the inequality Min−20 nm<t1<Min+20 nm.

Here, "Min" is the optical path length at which the CIEy chromaticity coordinates measured according to JIS Z 8701 exhibits a minimum value.

In the case where an electron injection layer, an electron transport layer, a positive hole injection layer, a positive hole transport layer, or any other organic layers are provided in addition to the blue light emitting organic layer 12, the optical path length of these layers may be included the blue light emitting organic layer in designing the organic EL device of this embodiment.

The relationship between the total optical path (hereinafter may be simply called "optical path") of the transparent electrode 10 and the blue light emitting organic layer 12 and the minimum values (values of valleys) of the CIE chromaticity coordinates will be described referring to FIGS. 2 to 7. Furthermore, the constitution of the organic EL device 100 shown in FIG. 1 will be specifically described.

(1) The relationship between the total optical path length of a transparent electrode and a blue light emitting organic layer and the values of peaks and valleys of the CIEy chromaticity coordinate.

Figure 2:
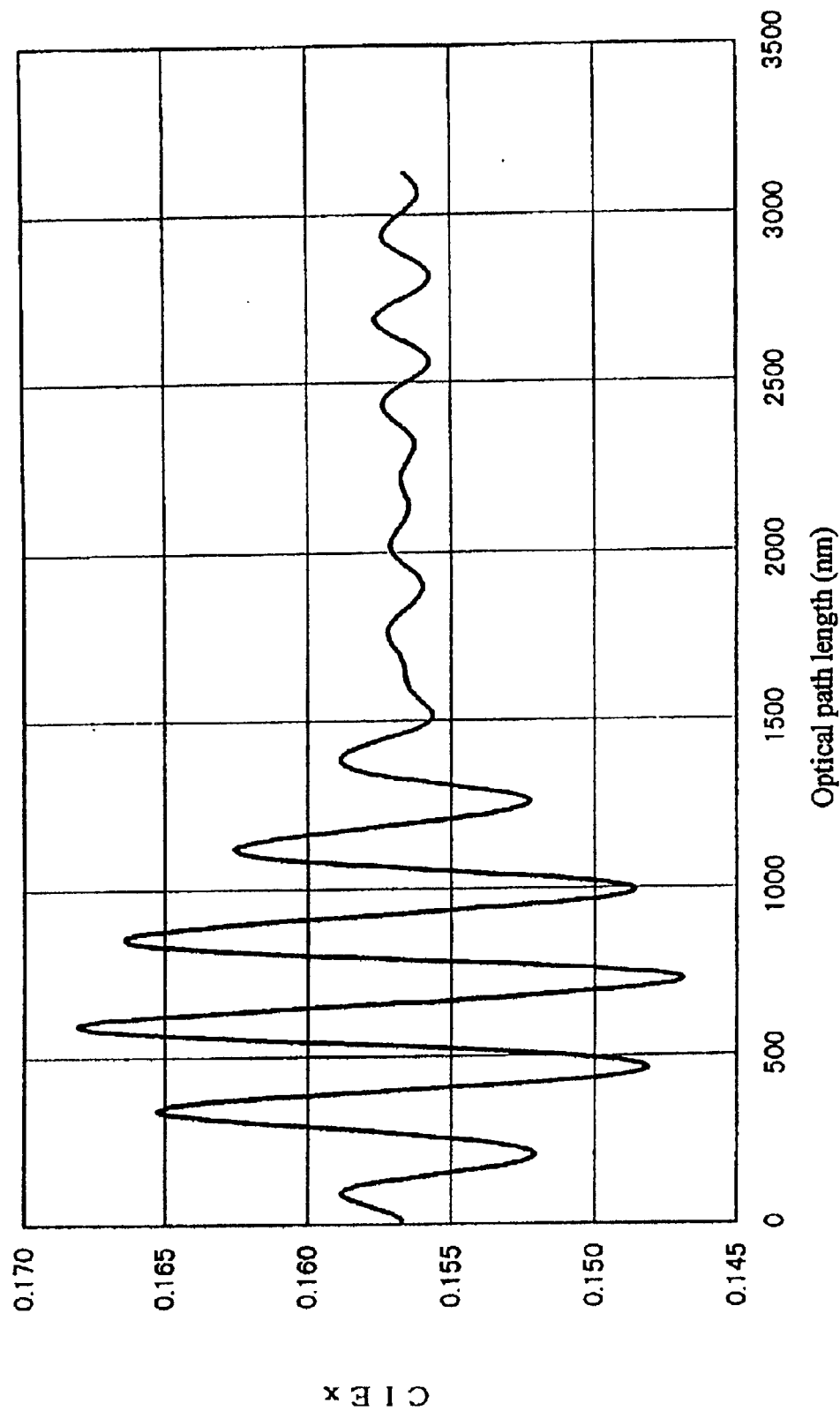
FIG. 2 is a drawing showing the relationship between the total optical path length (t1) of a transparent electrode and a blue light emitting organic layer and the CIEx chromaticity coordinate value of EL luminescence.

FIG. 2 is a drawing showing the relationship between the total optical path length (t1) of a transparent electrode and a blue light emitting organic layer and the CIEx chromaticity coordinate value of EL luminescence. In FIG. 2, the value (nm) of the total optical path length (t1) is taken along the horizontal axis, and the value of the CIEx chromaticity coordinates is taken along the vertical axis.

Figure 3:
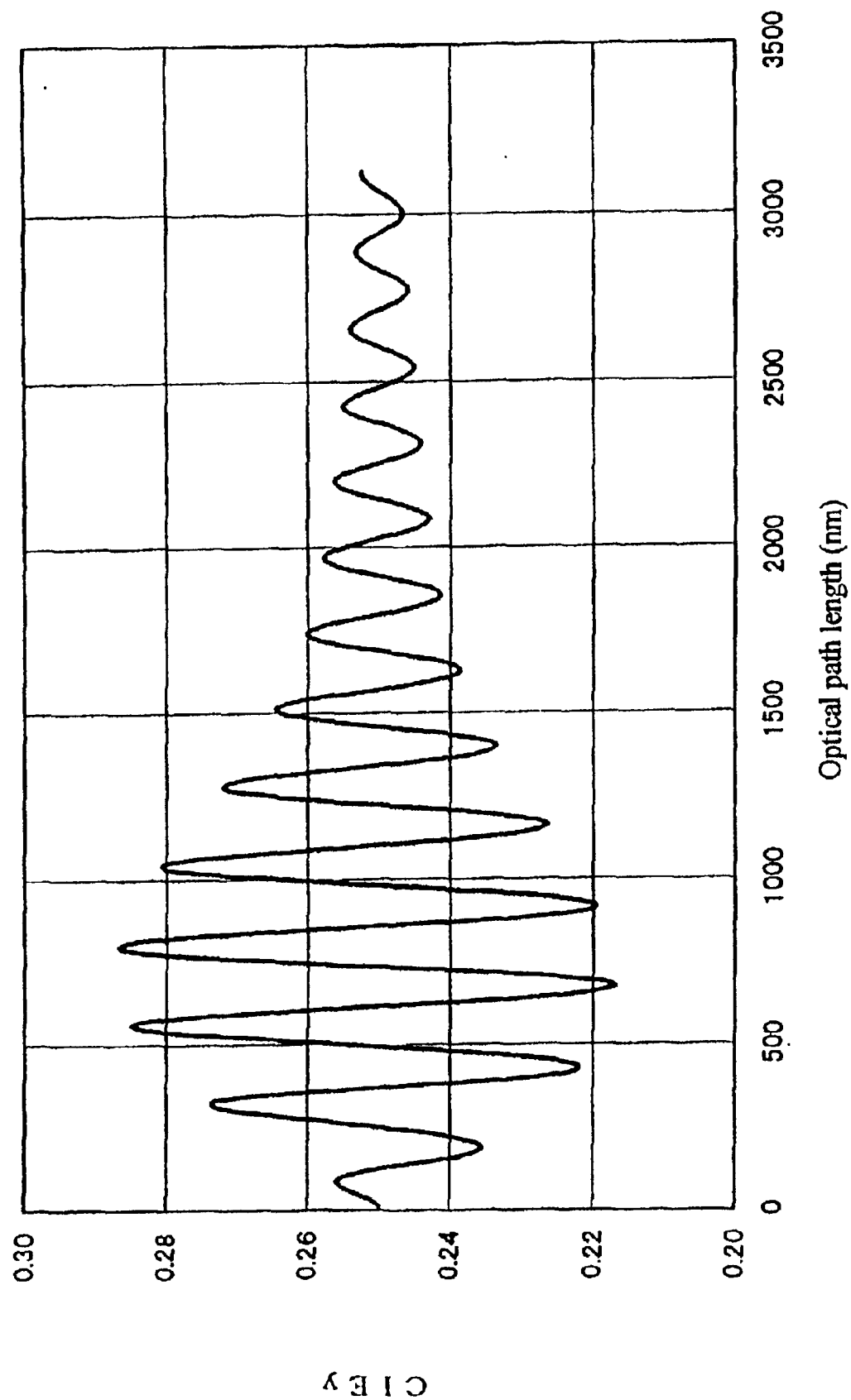
FIG. 3 is a drawing showing the relationship between the total optical path length (t1) of a transparent electrode and a blue light emitting organic layer and the CIEy chromaticity coordinate value of EL luminescence.

FIG. 3 is a drawing showing the relationship between the total optical path length (t1) of a transparent electrode and a blue light emitting organic layer and the CIEy chromaticity coordinate value of EL luminescence. In FIG. 3, the value (nm) of the total optical path length (t1) is taken along the horizontal axis, and the value of the CIEy chromaticity coordinates is taken along the vertical axis.

Figure 4:
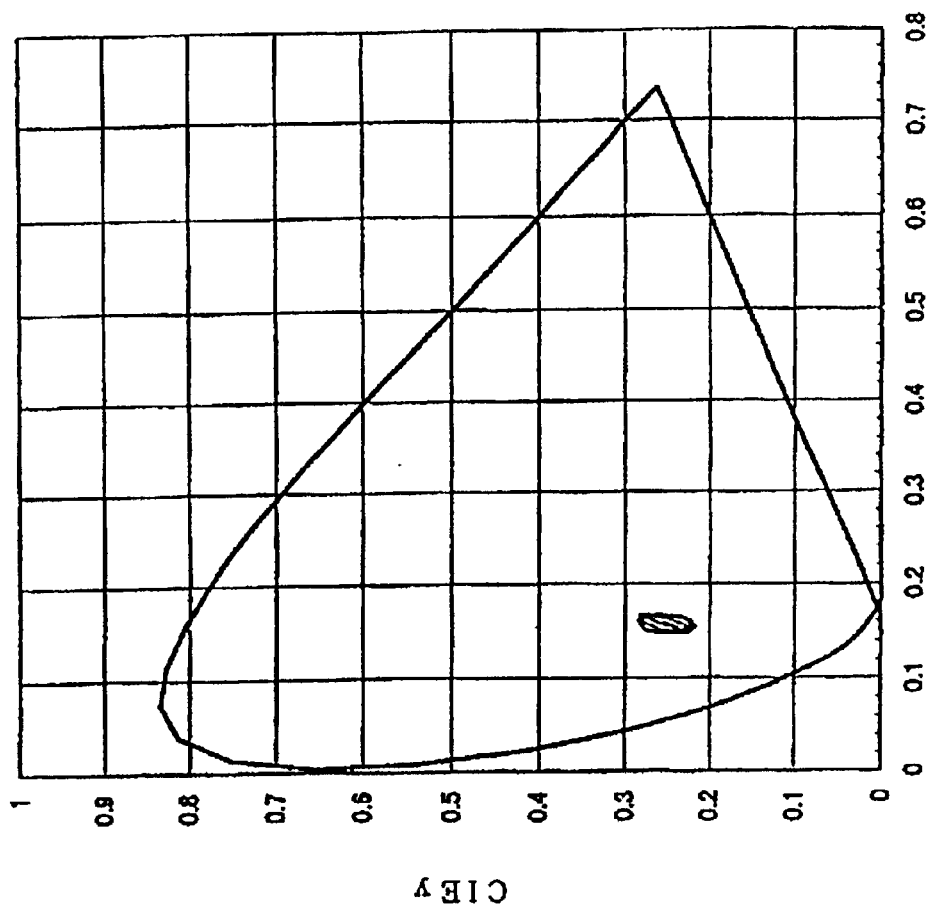
FIG. 4 is a drawing showing the CIE chromaticity coordinates of blue light luminescence.
Figure 5:
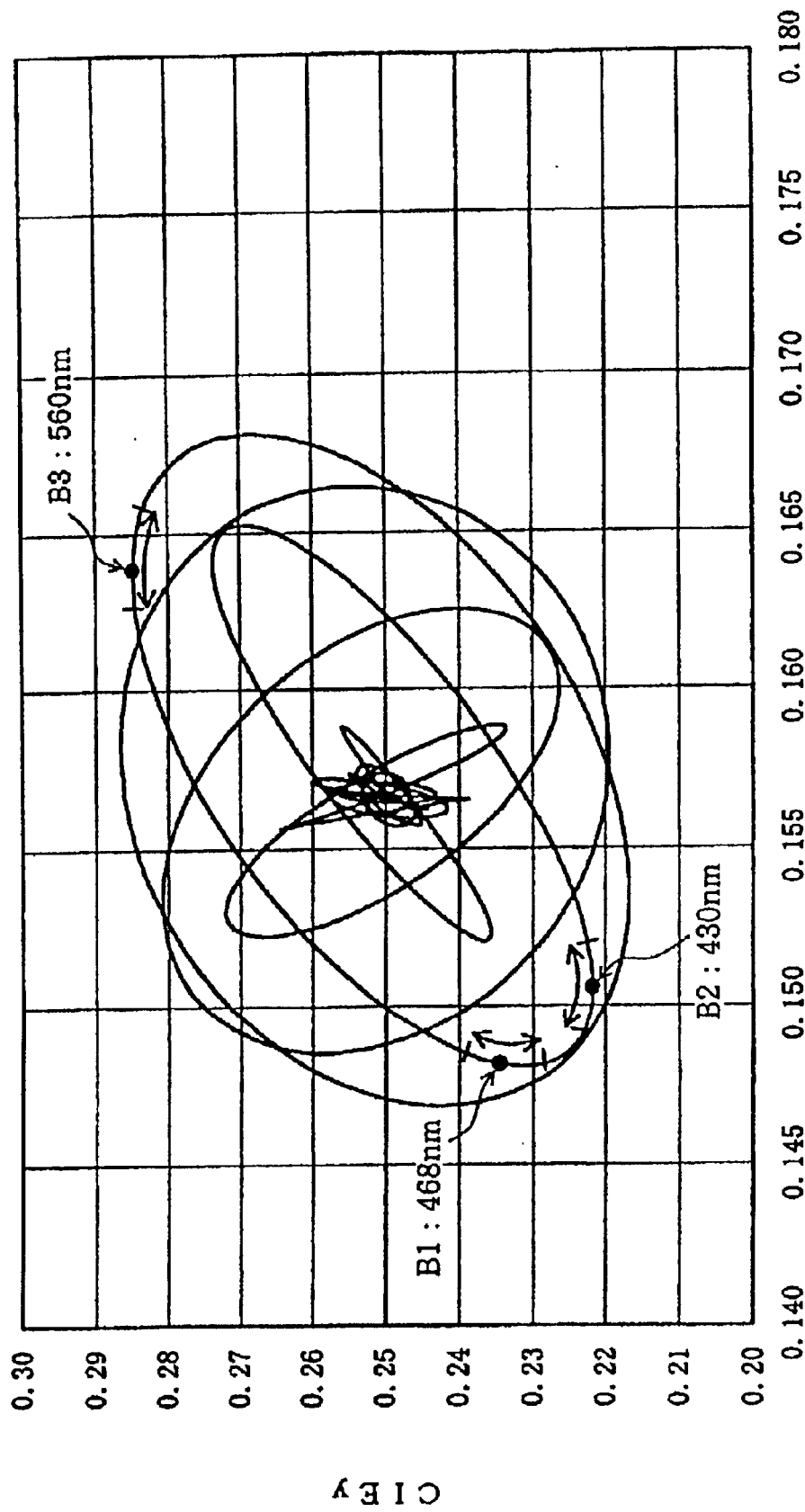
FIG. 5 is a drawing showing an enlarged view of the CIE chromaticity coordinates of blue light luminescence.

For reference, the CIE chromaticity coordinates (calculated value) for luminescence from a blue light emitting organic layer is shown in FIG. 4 and an enlarged view of FIG. 4 is shown in FIG. 5. In these Figures, the value of the CIEx chromaticity coordinates is taken along the horizontal axis, and the value of the CIEy chromaticity coordinates is taken along the vertical axis. Generally, in the case of blue luminescence, the CIEx chromaticity coordinate value is about 0.11–0.17 and the CIEy chromaticity coordinate value is about 0.07–0.29.

As can be seen from FIGS. 2 and 3, the values of the CIEx chromaticity coordinates and the CIEy chromaticity coordinates periodically change with the change in the total optical path length of a transparent electrode and a blue light emitting organic layer.

The CIEx chromaticity coordinate value exhibits a minimum value in the cycle (hereinafter referred to as minimum vale (Min)) and a maximum value in the cycle (hereinafter referred to as a maximum vale (Max)) at each of the following total optical path lengths.

Minimum values (Min): about 200 nm, 470 nm, 750 nm, 970 nm

Maximum vales (Max): about 90 nm, 340 nm, 600 nm, 840 nm

The CIEy chromaticity coordinate value exhibits a minimum value in the cycle (hereinafter referred to as a minimum vale (Min)) and a maximum value in the cycle (hereinafter referred to as maximum vale (Max)) at each of the following total optical path lengths.

Minimum values (Min): about 190 nm, 430 nm, 670 nm, 930 nm

Maximum vales (Max): about 90 nm, 340 nm, 560 nm, 810 nm

The smaller the fluctuation in the values for the CIEy chromaticity coordinates and the CIEx chromaticity coordinates, the smaller the color change in the blue luminescence. However, in the case of blue light, the fluctuation in the CIEy chromaticity coordinates gives a more evident (strong) recognition of a blue color change to the human eye than the fluctuation in the CIEx chromaticity coordinates.

Therefore, even if there is some fluctuations in the total optical path length of the blue light emitting organic layer, the change in the CIEy chromaticity coordinate value, which gives a greater effect on the color tone, can be minimized by relating the total optical path length with a minimum value (Min) or maximum value (Max) of the CIEy chromaticity coordinates.

For example, when the total optical path length is 468 nm as indicated by B1 in FIG. 5, wherein the total optical path length is related to neither a minimum value (Min) nor maximum value (Max) of the CIEy chromaticity coordinates value, and has the fluctuation of ±20 nm, the CIEy chromaticity coordinates value changes in the range of 0.2280 to 0.2384. The difference (b1) between the maximum and the minimum values is 0.0104.

In contrast, when the total optical path length (t1) is 430 nm as indicated by B2 in FIG. 5, wherein the total optical path length is related to a minimum value (Min) of the CIEy chromaticity coordinates value, the CIEy chromaticity coordinates value changes in the range of 0.2219 to 0.2228, with the difference (b2) between the maximum and minimum values being as small as 0.0009, even if there is the fluctuation of ±20 nm in the total optical path length. Specifically, the value is only 9% (0.104×9/100%, hereinafter calculated in the same manner) or less of the value when the total optical path length is related to neither a minimum value (Min) nor a maximum value (Max).

In the same manner, when the total optical path length (t1) is 560 nm as indicated by B3 in FIG. 5, wherein the total optical path length is related to a maximum value (Max) of the CIEy chromaticity coordinates value, the CIEy chromaticity coordinates value changes in the range of 0.2834 to 0.2848, with the difference (b3) between the maximum and minimum values being 0.0014.

Specifically, the value is only 14% or less of the value when the total optical path length is related to neither a minimum value (Min) nor a maximum value (Max).

There are no limitations to the method of causing the total optical path length of the transparent electrode and blue light emitting organic layer to be related to a minimum value (Min) or a maximum value (Max) of the CIE chromaticity coordinates value. This can be achieved by appropriately changing the refractive index of the transparent electrode, the thickness of the transparent electrode, the refractive index of the blue light emitting organic layer, and the thickness of the blue light emitting organic layer. An alternative preferable method is to provide an optical path length correction layer as shown in the fourth and fifth embodiments.

Figure 6:
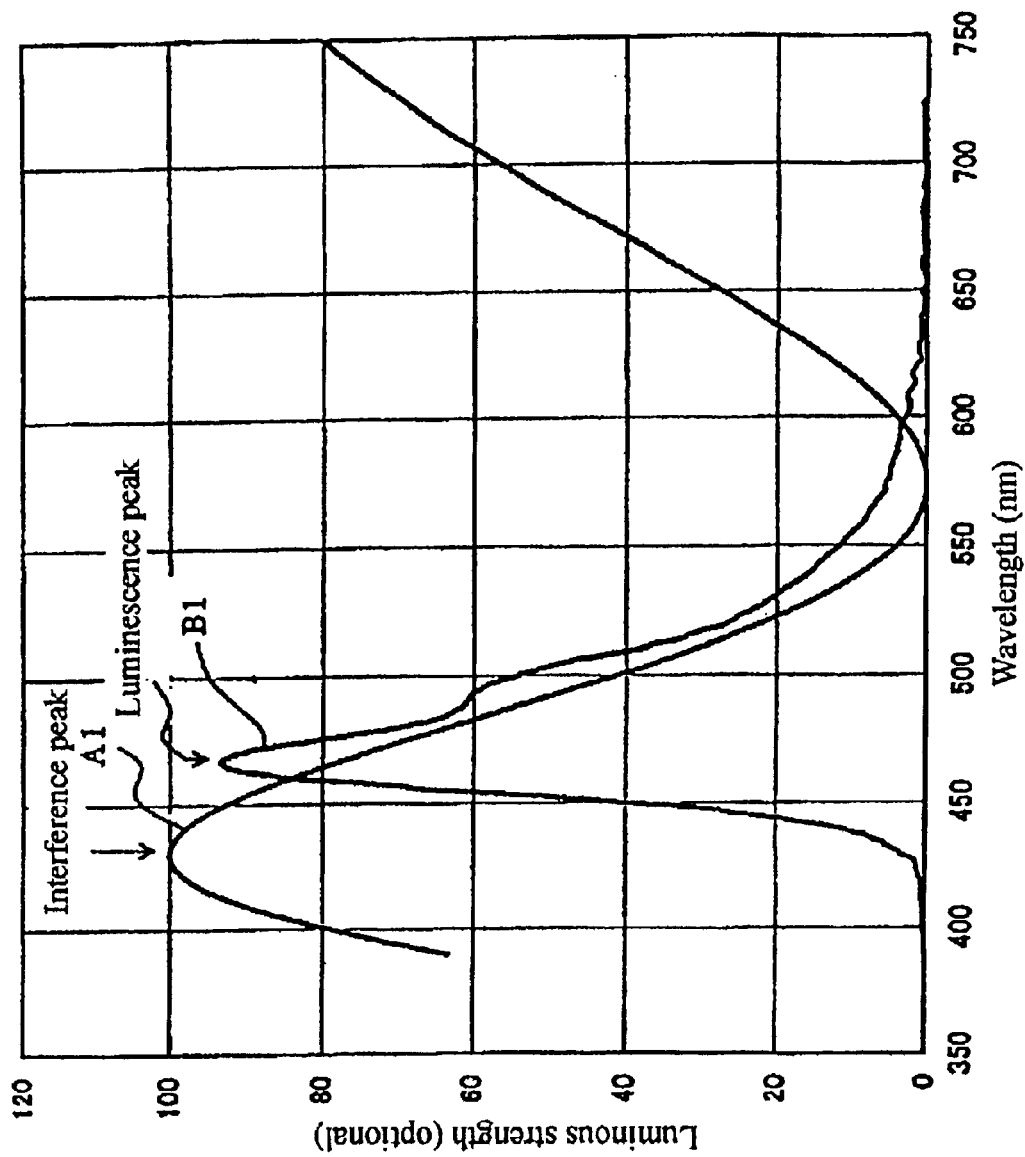
FIG. 6 is a drawing showing the relationship between the interference peak (A1) and the intensity peak (B1) of the blue light emitting organic layer in the first embodiment.

FIG. 6 is a drawing showing the relationship between an interference peak and the intensity peak when a blue light is emitted in the first embodiment. In FIG. 6, the interference peak is indicated by A1 and the intensity peak is indicated by B1. In this example, the total optical path length of a transparent electrode and a blue light emitting organic layer is 430 nm which is related to a minimum value (Min) of the CIEy chromaticity coordinates. In this figure, however, interference factors are standardized so that the maximum value is 100 and the minimum value is 0 to clearly indicate the interference peak position. On the other hand, actual luminescence values are indicated without standardization.

As can be seen in FIG. 6, there is an about 37 nm wavelength difference between the interference peak A1 (wavelength: 431 nm) and the intensity peak B1 (wavelength: 468 nm) in the first embodiment.

Figure 7:
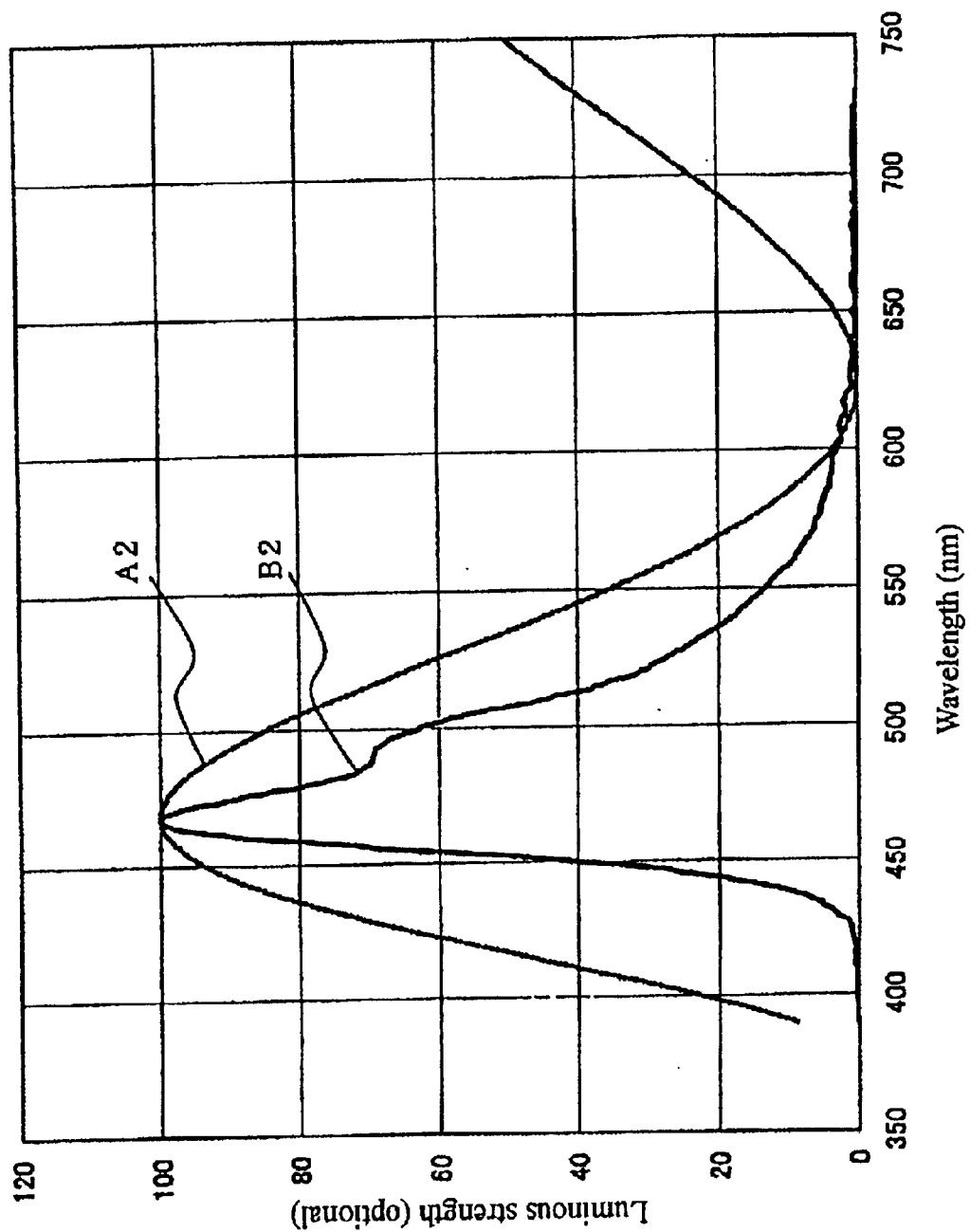
FIG. 7 is a drawing showing the relationship between the interference peak (A2) and the intensity peak (B2) of the blue light emitting organic layer in a conventional organic EL device.

On the other hand, FIG. 7 shows the relationship among the interference peak, intensity peak, and wavelength when a blue light is emitted by a conventional organic EL device.

In FIG. 7, the interference peak is indicated by A2 and the intensity peak is indicated by B2. In this conventional case, the total optical path length (nm) of the transparent electrode and the blue light emitting organic layer is 468 nm as indicated by B1 in FIG. 5 in order to accord the interference peak A2 with the intensity peak B2. However, in the case of this total optical path length, the CIEy chromaticity coordinate value exhibits neither a minimum value (Min) nor a maximum value (Max).

Therefore, if the relationship shown in FIG. 2 and FIG. 3 is taken into consideration, the change in the CIE chromaticity coordinates value in the organic EL device of the first embodiment is decreased by relating the total optical path length of the transparent electrode and the organic layer to either a minimum value (Min) or a maximum value (Max), preferably to a minimum value (Min) of the CIEy chromaticity coordinates, even if there is the certain fluctuation in the total optical path length and there is a difference between the interference peak (A1) and the intensity peak (B1). This eventually decreases a visual blue color change.

On the other hand, in the conventional organic EL device in which the total optical path length of the transparent electrode and blue light emitting organic layer is related to neither a maximum value (Max) nor a minimum value (Min), the change in the CIE chromaticity coordinates value due to the fluctuation of the total optical path length is bigger and significant problems even if the interference peak A2 is coincided with the intensity peak B2. As a result, the change in a visualized blue color becomes bigger and significant problems.

Although the value of EL luminescence somehow decreases by the discrepancy of the interference peak (A1) of a blue light emitting organic layer and the intensity peak (B1) in the organic EL device of the first embodiment, the decrease is as small as about 7% as compared with a conventional organic EL device in which the interference peak (A2) and the intensity peak (B2) are identical. Thus, with regard to the decrease of EL luminescence, there are no problems in practical use.

Figure 32:
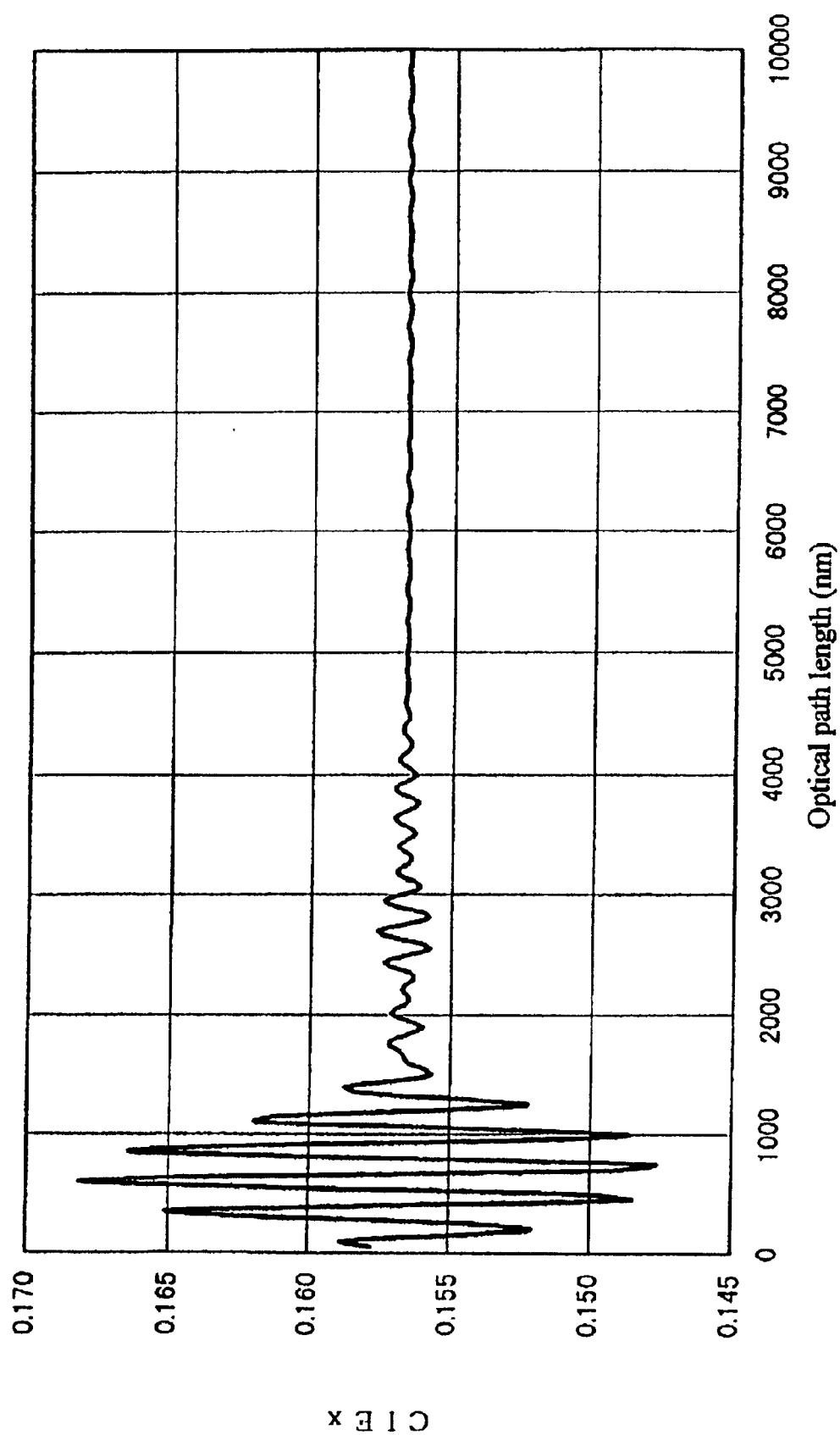
FIG. 32 is a drawing showing the relationship between the total optical path length (t1) of a transparent electrode and a blue light emitting organic layer and the CIEx chromaticity coordinate value of EL luminescence when the total optical path length (t1) is long.
Figure 33:
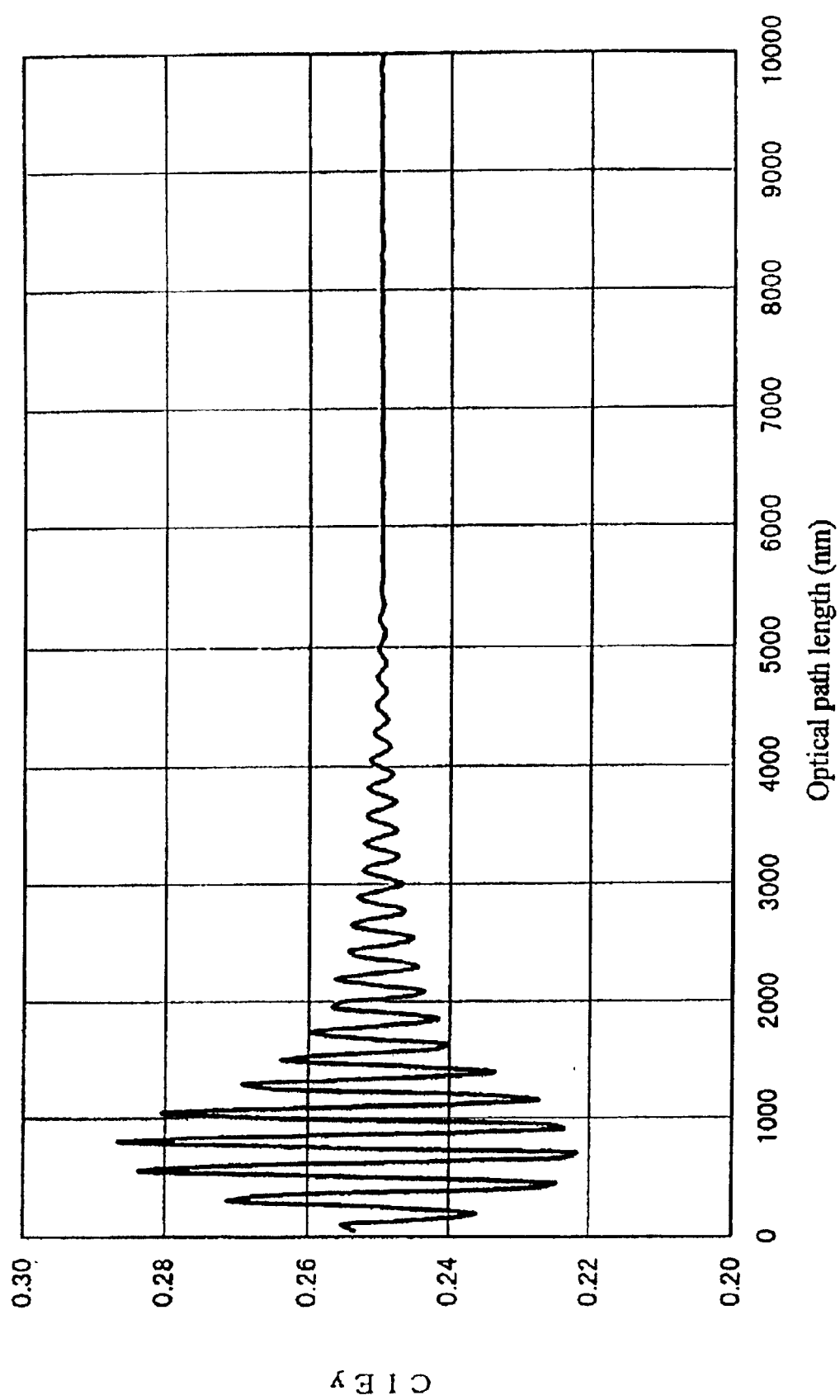
FIG. 33 is a drawing showing the relationship between the total optical path length (t1) of a transparent electrode and a blue light emitting organic layer and the CTEy chromaticity coordinate value of EL luminescence when the total optical path length (t1) is long.

A further decrease in the change of the CIE chromaticity coordinate value due to the fluctuation of the total optical path length of the transparent electrode and the blue light emitting organic layer has been confirmed to be achieved by increasing the thickness of the blue light emitting organic layer to 2,000 nm or more, preferably 3,000 nm or more, and more preferably 5,000 nm or more, as indicated by FIGS. 32 and 33.

Accordingly, if the organic EL device is for an application in which it is possible to increase the thickness of the blue light emitting organic layer, a more excellent color tone and a blue color with minimal color change can be realized not only by making the total optical path length that exhibiting either a maximum value (Max) or a minimum value (Min) in the CIE chromaticity coordinates, but also by increasing the thickness of the blue light emitting organic layer.

In other words, when the thickness of the blue light emitting organic layer is less than 2,000 nm, adjusting the total optical path length to the length exhibiting either a maximum value (Max) or a minimum value (Min) in the CIE chromaticity coordinates, as mentioned above, is an extremely effective means for obtaining an excellent color tone and a blue color with minimum color change.

(2) Organic Layer

The organic layer is formed with including the organic light-emitting layer at least, and more preferably, it's voluntary consist of the hole injection layer, the hole transportation layer, the hole barrier layer, the electron injection layer, the electron transportation layer and electron barrier layer. The typical construction of the layers will be explained by following.

(a) Organic Light-Emitting Layer

The organic layer includes the blue organic light-emitting material in the first embodiment. Although the blue organic light-emitting material is not specifically restricted, it preferably has the following three functions at the same time for example.

(i) Electric charge injecting function: the function of allowing holes to be injected from the anode layer or the hole injection layer during application of electric field and, at the same time, allowing electrons to be injected from the cathode layer or the electron injection layer.
(ii) Transport function: the function of allowing injected holes and electrons to move by the force of an electric field.
(iii) Light-emitting function: the function of providing the field for electrons and holes to recombine, causing them to emit light.

Thus, it is desirable that the organic light-emitting layer contains one or more aromatic compounds having a styryl group. By using such aromatic compounds having this styryl group, excellent emitting property and the durability may be obtained.

The organic light-emitting layer may further comprise other compounds. Such other compounds include fluorescent whitening agents such as benzothiazoles, benzoimidazoles, benzooxazoles, and the like; metal chelated oxinoid compounds and styrylbenzene compounds. We note that the these compounds are suitable not only for the blue organic light-emitting material of the first embodiment but also for the green organic light-emitting materials of the second embodiment and the red organic light-emitting materials of the third embodiment.

Also, illustrating specific compounds, for example, the compounds disclosed in JP-A-59-194393 are exemplified. Among these, typical examples are fluorescent bleaching agents including a benzoxazole compound such as 2,5-bis(5,7-di-t-pentyl-2-benzoxazolyl)-1,3,4-thiadiazole, 4,4'-bis(5,7-di-t-pentyl-2-benzoxazolyl)stilbene, 4,4'-bis(5,7-di-(2-methyl-2-butyl)-2-benzoxazolyl)stilbene, 2,5-bis(5,7-di-t-pentyl-2-benzoxazolyl)thiophene, 2,5-bis(5-α, α-dimethylbenzyl-2-benzoxazolyl)thiophene, 2,5-bis(5-7-di(2-methyl-2-butyl)-2-benzoxazolyl)-3,4diophenylthiophene, 2,5-bis(5-methyl-2-benzoxazolyl)thiophene, 4,4'-bis(2-benzoxazolyl)biphenyl, 5-methyl-2-[2-[4-(5-methyl-2-benzoxazolyl)phenyl]vinyl]benzoxazole, 2-[2-(4-chlorophenyl)vinyl]naphtho[1,2-d]oxazole, and the like; benzothiazole derivative compound such as 2-2'-(p-phenylenedivinylene)bisbenzothiazole and the like; and benzoimidazole derivative compound such as 2-[2-[4-(2-benzoimidazdyl)phenyl]vinyl]benzoimidazole, 2-[2-(4-carboxyphenyl)vinyl]benzoimidazole, and the like. In addition, other useful compounds are enumerated in Chemistry of Synthetic Dyes, 628–637, P640, (1971).

As the above-mentioned chelated oxinoid compounds, the compounds disclosed in JP-A-63-295695 can be used. Among these, typical examples are 8-hydroxyquinoline metal complexes such as tris(8-quinolinol) aluminum, bis (8-quinolinol) magnesium, bis(benzo[f]-8-quinolinol) zinc, bis(2-methyl-8-quinolinolate) aluminum oxide, Tris(8-quinolinol) indium, tris(5-methyl-8-quinolinol) aluminum, 8-quinolinollithium, tris(5-chloro-8-quinolinol) gallium, bis (5-chloro-8-quinolinol) calcium, poly[zinc(II)-bis(8-hydroxy-5-quinolinonyl)methane], and the like and dilithium epinetridione.

As the above-mentioned styryl benzene compounds and derivatives, the compounds disclosed in the specifications of EPCs No. 0319881 and No. 0373582 can be also used. Typical examples of these styryl benzene compounds are 1,4-bis(2-methylstyryl)benzene, 1,4-bis(3-methylstyryl) benzene, 1,4-bis(4-methylstyryl)benzene, distyrylbenzene, 1,4-bis(3-ethylstyryl)benzene, 1,4-bis(2-methylstyryl)-2-methylbenzene, 1,4-bis(2-methylstyryl)-2-ethylbenzene, and the like.

Further, distyryl pyrazine derivatives disclosed in JP-A-2-252793 can be used as the material for the emitting layer. Typical examples of these derivatives are 2,5-bis(4-methylstyryl)pyrazine, 2,5-bis(4-ethylstyryl)pyrazine, 2,5-bis[2-(1-naphthyl)vinyl]pyrazine, 2,5-bis(4-methoxystyryl) pyrazine, 2,5-bis[2-(4-biphenyl)vinyl] pyrazine, 2,5-bis[2-(1-pyrenyl)vinyl]pyrazine, and the like. In addition, the polyphenyl compounds disclosed in the specification of EPC No. 0387715 can be used as the material for the emitting layer.

Other than the above-mentioned fluorescent bleaching agents, metal chelated oxinoid and styryl benzene, the following compounds can be used as the material for the emitting layer: 12-phthaloperinone (J. Appl. Phys., Vol 27, L713, (1988)), 1,4-diphenyl-1,3-butadiene, 1,1,4,4-tetraphenyl-1,3 butadiene(Appl. Phys. Lett., Vol 56, L799, (1990)), naphthalimide derivatives (JP-A-2-305886), perillene derivatives (JP-A-2-189890), oxadiazole derivatives (JP-A-2-216791 or oxadiazole derivatives disclosed by Hamada et al. at the conference of Appl. Phys), aldazine derivatives (JP-A-2-220393), pyraziline derivatives (JP-A-2-220394), cyclopentadiene derivatives (JP-A-2-289675), pyrrolopyrrole derivatives (JP-A-2-296891), styrylamine derivatives (Appl. Phys. Lett., Vol 56, L799, (1990)), coumarine compounds (JP-A-2-191694), and macromolecular compounds described in the International Disclosure Official Gazette WO90/13148 or Appl. Phys. Lett., Vol 58, 18, P1982 (1991).

In the present invention, as the materials used for the emitting layer, aromatic dimethylidine compounds (compounds disclosed in the specification of EPC No. 0388768 or JP-A-3-231970) are preferably used. Specific Examples of such compounds are 1,4-phenylenedimethylidyne, 4,4-phenylenedimethylidyne, 2,5-xylenedimethylidyne, 2,6-naphthylenedimethylidyne, 1,4-biphenylenedimethylidyne, 1,4-pterephenylenedimethylidyne, 9,10-anthracenediyldimethylidyne, 4,4'-bis(2,2-di-t-butylphenylvinyl), 4,4'-bis(2,2-diphenylvinyl), and derivatives of these.

Furthermore, it is desirable to use organic light-emitting materials comprising a dopant such as coumarin compounds and the like which can enhance the blue color light to red color light into the host materials such as an organic light-emitting material having distyrylaryllen moiety, for example, 4,4-bis(2,2-diphenylbinyl) biphenyl and the like.

In addition, the thickness of the organic light-emitting layer may be determined in considering the optical path length, and usually it is favorable in the range of 5 nm to 5 micrometer. This reason is that if the thickness of the organic light-emitting layer is below 5 nm, the light emitting strength and the durability may decrease. To the contrary, if the thickness of the organic light-emitting layer is over 5 micrometer, the injection voltage may increase.

Therefore, the thickness of the organic light-emitting layer is favorably in the range of 10 nm to 3 micrometer and more favorably in the range of 20 nm to 1 micrometer.

Moreover, the organic light-emitting layer may be structured of one layer made from one or more of the above materials, or may be a plural of layers in which one organic light-emitting layer made from compounds differing from the compound of the other layer are laminated on other layer.

(b) Hole Injecting Layer

Any material optionally selected from photo-conductive materials conventionally used as a material for transferring a charge of holes and from known materials used for a hole injecting layer of an organic EL device can be used as the material for the hole injecting layer provided as required. The material for the hole injecting layer which has a function either as a hole injecting layer or as a barrier for an electron may be either an organic or inorganic compound.

Given as examples of these conventional materials are triazole derivatives (see the specification of U.S. Pat. No. 3,112,197, etc.), oxadiazole derivatives (see the specification of U.S. Pat. No. 3,189,447, etc.), imidazole derivatives (JP-B-37-16096, etc.), polyarylalkane derivatives (see the specifications of U.S. Pat. Nos. 3,615,402, 3,820,989, 3,542, 544, JP-B-45-555, JP-B-51-10983, JP-A-51-93224, JP-A-55-17105, JP-A-56-4148, JP-A-55-108667, JP-A-55-156953, and JP-A-56-36656, etc.), pyrazoline derivatives and pyrazolone derivatives (see the specifications of U.S. Pat. Nos. 3,180,729, 4,278,746, JP-A-55-88064, JP-A-55-88065, JP-A-49-105537, JP-A-55-51086, JP-A-56-80051, JP-A-56-88141, JP-A-57-45545, JP-A-54-112637, and JP-A-55-74546, etc.), phenylenediamine derivatives (see the specifications of U.S. Pat. No. 3,615,404, JP-A-51-10105, JP-A-46-3712, JP-A-47-25336, JP-A-54-53435, JP-A-54-110536, and JP-A-54-119925, etc.), arylamine derivatives (see the specifications of U.S. Pat. Nos. 3,567,450, 3,180, 703, 3,240,597, 3,658,520, 4,232,103, 4,175,961, 4,012,376, JP-A-49-35702, JP-A-39-27577, JP-A-55-144250, JP-A-56-119132, JP-A-56-22437, and DRP No. 1,110,518, etc.), amino substituted chalcone derivatives (see the specification of U.S. Pat. No. 3,526,501, etc.), oxazole derivatives (see the specification of U.S. Pat. No. 3,257,203, etc.), styrylanthracene derivatives (see the specification of JP-A-56-46234, etc.), fluorenone derivatives (see the specification of JP-A-54-110837 and etc.), hydrazone derivatives (see the specifications of U.S. Pat. No. 3,717,462, JP-A-54-59143, JP-A-55-52063, JP-A-55-52064, JP-A-55-46760, JP-A-55-85495, JP-A-57-11350, JP-A-57-148749, and JP-A-2-311591, etc.), stilbene derivatives (see the specifications of JP-A-61-210363, JP-A-61-228451, JP-A-61-14642, JP-A-61-72255, JP-A-62-47646, JP-A-62-36674, JP-A-62-10652, JP-A-62-30255, JP-A-60-93445, JP-A-60-94462, JP-A-60-174749, and JP-A-60-175052, etc.), silazane derivatives (see the specification of U.S. Pat. No. 4,950,950, etc.), polysilane compounds (see the specification of JP-A-2-204996, etc.), aniline copolymers (see the specification of JP-A-2-282263, etc.), and electroconductive macromolecular oligomers (especially a thiophene oligomer) disclosed in JP-A-1-211399.

As the materials used for the hole injecting layer, the above compounds can be used. Among these, polphyrin compounds (disclosed in JP-A-63-2956965) and aromatic tertiary amines and styrylamine compounds (see the specifications U.S. Pat. No. 4,127,412, JP-A-53-27033, JP-A-54-58445, JP-A-54-149634, JP-A-54-64299, JP-A-55-79450, JP-A-55-144250, JP-A-56-119132, JP-A-61-295558, JP-A-61-98353, and JP-A-63-295695, etc.) are preferable. It is especially preferable to use the aromatic tertiary amines.

Typical examples of the above porphyrin compounds are porphin, 1,10,15,20-tetraphenyl-21H, 23H-porphin copper (II), 1,10,15,20-tetraphenyl-21H, 23H-porphin zinc (II), 5,10,15,20-tetrakis(pentafluorophenyl)-21H, 23H-porphin, silicon phthalocyanine oxide, aluminum phthalocyanine chloride, phthalocyanine (non-metal), dilithium phthalocyanine, copper tetramethylphthalocyanine, copper phthalocyanine, chromium phthalocyanine, zinc phthalocyanine, lead phthalocyanine, titanium phthalocyanine oxide, magnesium phthalocyanine, copper octamethylphthalocyanine, and the like.

Typical examples of the above aromatic tertiary amine and styrylamine compounds are N,N,N',N'-tetraphenyl-4,4'-diaminophenyl, N,N'-diphenyl-N,N'-bis-(3-methylphenyl)-[1,1'-biphenyl]-4,4'-diamine (hereinafter abbreviated as "TPD"), 2,2-bis (4-di-p-tolylaminophenyl)propane, 1,1-bis (4-di-p-tolylaminophenyl)cyclohexane, N,N,N',N'-tetra-p-tolyl-4,4'-diaminophenyl, 1,1-bis(4di-p-tolylaminophenyl)-4-phenylcyclohexane, bis(4-dimethylamino-2-methylphenyl)phenylmethane, bis(4di-p-tolylaminophenyl) phenylmethane, N,N'-diphenyl-N,N'-di(4-methoxyphenyl)-4,4'-diaminobiphenyl, N,N,N',N'-tetraphenyl-4,4'-diaminophenyl ether, 4,4-bis(diphenylamino) quadriphenyl, N,N,N-tri(p-tolyl)amine, 4-(di-p-tolylamino)-4'-[4(di-p-tolylamino)styryl]stilbene, 4-N,N-diphenylamino-(2-diphenylvinyl)benzene, 3-methoxy-4'-N,N-diphenylaminostylbenzene, N-phenylcarbazole, and the like.

Also, the above-mentioned aromatic dimethylidine compounds shown as the material for the emitting layer can be utilized as the material used for the hole injecting layer.

With regard to the thickness of the hole injecting layer, there are no restrictions to it, but it is favorable to be generally in the range of 5 nm to 5 micrometer.

Also, this hole injecting layer may be structured of one layer made from one or more of the above materials or may be a layer in which other hole injecting layers made from compounds differing from the compound of that layer are laminated on that layer.

(c) Electron Injecting Layer

The electron injecting layer provided as required may have the function of transferring, to the emitting layer, the electrons injected from the cathode. Optional compounds selected from conventionally known compounds may be used.

Typical examples of these compounds include nitro-substituted fluorene derivatives; anthraquinodimethane derivatives disclosed in JP-A-57-149259, JP-A-58-55450, and JP-A-63-104061; diphenylquinone derivatives, thiopyrane dioxide derivatives, heterocyclic tetracarboxylic acid anhydrides such as naphthaleneperillene and the like, and carbodiimides which are all disclosed in Polymer Preprints, Japan Vol. 37. No. 3 (1988) p. 681 and the like; fluorenylidenemethane derivatives disclosed in Japanese Journal of Applied Physics, 27, L269 (1988), JP-A-60-696657, JP-A-61-143764, and JP-A-61-148159; anthraquino-nedimethane and anthrone derivatives disclosed in JP-A-61-225151 and JP-A-61-233750; oxadiazole derivatives disclosed by the above-described Hamada et al. at the conference of Appl. Phys; and a series of an electron transfer compounds disclosed in JP-A-59-194393.

Incidentally, though the above electron transfer compounds are disclosed as the materials used for the emitting layer in JP-A-59-194393, it is confirmed as a result of the studies of the present inventors that these compounds can be used as the materials for the electron injecting layer.

Further, included as examples of the materials for the electron injecting layer are metal complexes of 8-quinolinole, specifically, tris(8-quinolinole) aluminum (hereinafter abbreviated as "Alq"), tris(5,7-dibromo-8-quinolinole) aluminum, tris(2-methyl-8-quinolinole) aluminum, and metal complexes produced by replacing the Primary metals of these metal complexes with In, Mg, Cu, Ca, Sn, Ga, or Pb. Other than the above, metal-free or metal phthalocyanine compounds of 8-quinolinole derivatives or compounds produced by replacing the terminal group of these compounds with an alkyl group, sulphonic acid group, or the like. Also, the distyryl pyrazine derivatives can be used as the materials for the electron injecting layer.

This electron injecting layer may be structured of one layer made from one or more of the above materials or may be a layer in which other electron injecting layers made from compounds differing from the compound of that layer are laminated on that layer.

There are no restrictions as to the thickness of the electron injecting layer. However, the thickness of the electron injecting layer is generally from 5 nm to 5 micrometer.

This reason is that if the thickness of the electron injecting layer is below 5 nm, the light emitting strength and the durability may decrease. To the contrary, if the thickness of the electron injecting layer is over 5 micrometer, the injection voltage may increase.

Therefore, the thickness of the electron injecting layer is favorably in the range of 10 nm to 3 micrometer and more favorably in the range of 20 nm to 1 micrometer.

(3) Electrodes (a) Anode Layer

As an anode layer, metals, alloys, electrically conductive compounds with a large work function (for example, 4 eV or more), or mixtures thereof may be used to obtain the good hole injection property. Specifically, indium tin oxide (ITO), CuI (copper iodide), tin oxide, zinc oxide, gold, platinum, palladium, and the like may be used either individually or in combinations of two or more.

Although the thickness of the anode layer is not specifically restricted, such a thickness is preferably in the range of 10 to 1,000 nm, and more preferably 10 to 200 nm.

(b) Cathode Layer

As a cathode layer, metals, alloys, electric conductive compounds with a small work function (for example, less than 4 eV), or mixtures thereof may be used to obtain the good electron injection property. Specifically, magnesium, aluminum, indium, lithium, sodium, silver, and the like may be used either individually or in combination of two or more.

Although the thickness of the cathode layer is not specifically restricted, such a thickness is preferably in the range of 10 to 1,000 nm, and more preferably 10 to 200 nm.

Incidentally, to obtain the emitting light outside, each anode or cathode should be transparent.

(4) Support Substrate

Support substrates will be explained. Any materials for such support substrates which can show the good mechanical property, low moisture permeability and oxygen permeability and which are usually used for the conventional EL device may be used. Such materials include glasses, ceramics and the like.

(5) Structural Embodiments

Although the organic EL device of the first embodiment of the following structure (i) has been described, it is also preferable to employ the following structures (ii) to (iv) in which other structural elements such as a hole injection layer and an electron injection layer are combined. In the following structures (i) to (iv), the substrate may be provided below the cathode layer as well as the anode layer.

(i) Substrate/anode layer/organic light-emitting layer/cathode layer
(ii) Substrate/anode layer/hole injection layer/organic light-emitting layer/cathode layer
(iii) Substrate/anode layer/organic light-emitting layer/electron injection layer/cathode layer
(iv) Substrate/anode layer/hole injection layer/organic light-emitting layer/electron injection layer/cathode layer In addition, it is desirable to provide a color conversion layer on the light emitting side to make the EL device of the first embodiment should be a full color type display.

Figure 28:
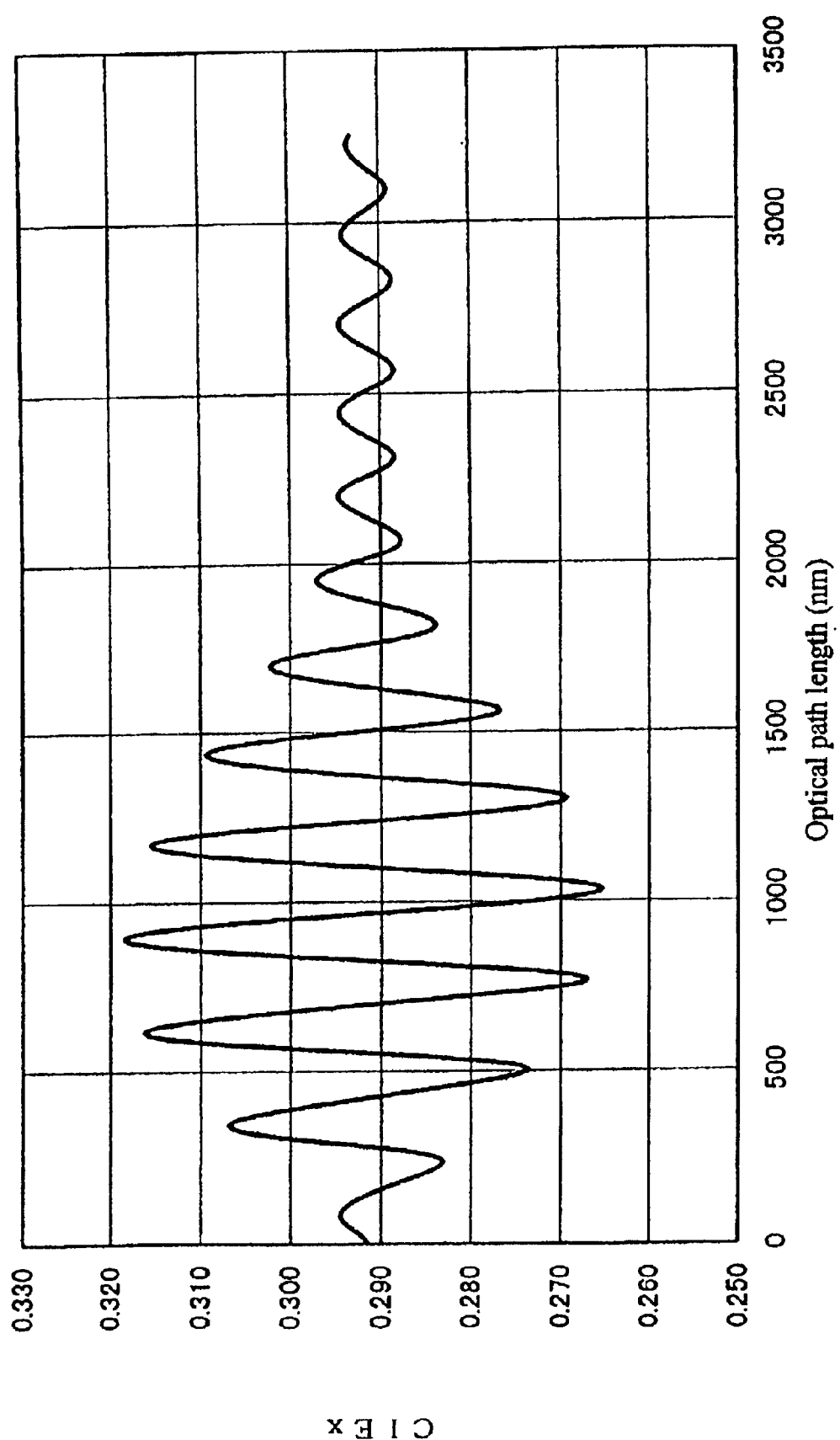
FIG. 28 is a drawing showing the relationship between the total optical path length and each CIEx chromaticity coordinate value of EL luminescence in the case where a GCCM is combined in the first embodiment.
Figure 29:
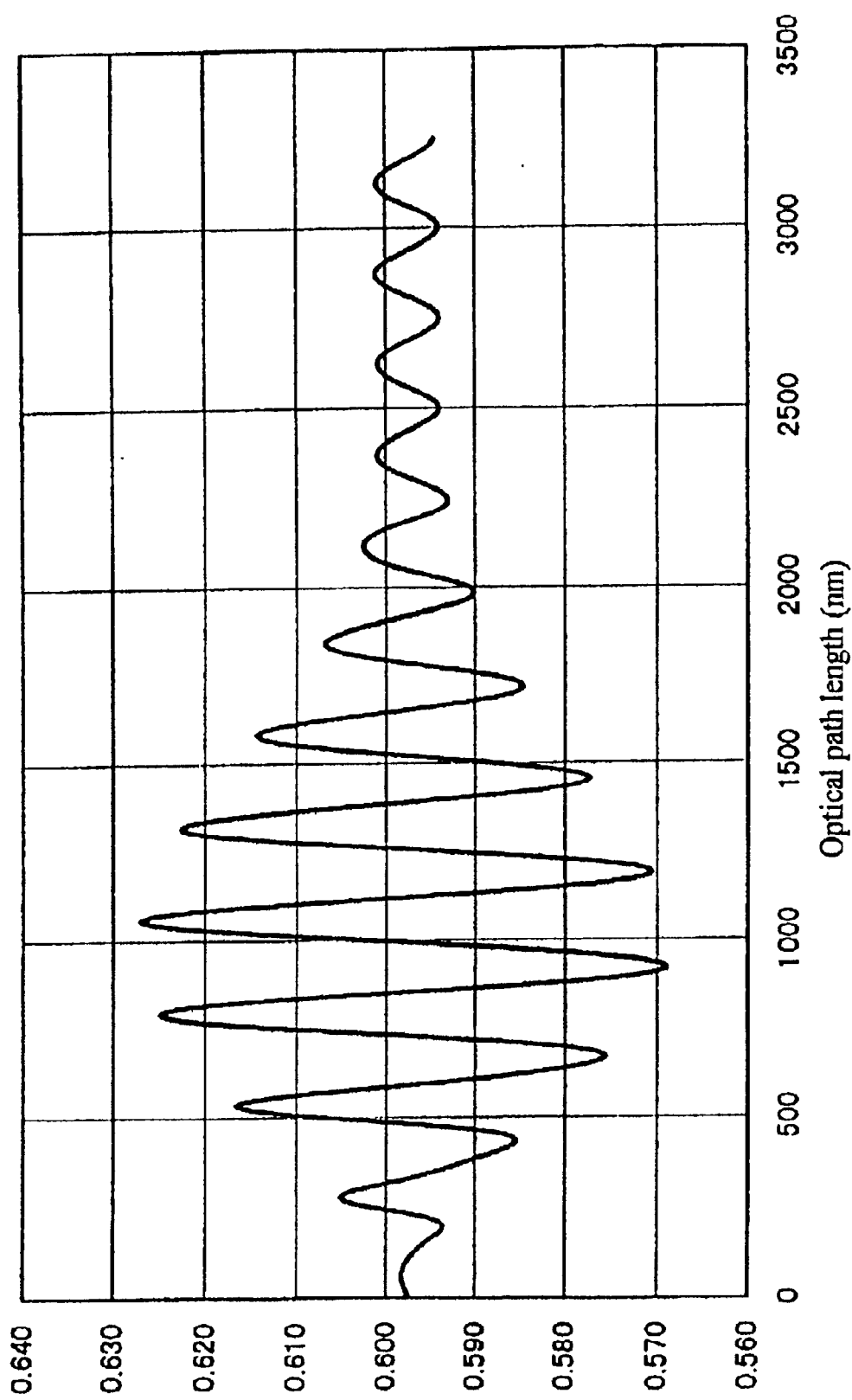
FIG. 29 is a drawing showing the relationship between the total optical path length and each CIEy chromaticity coordinate value of EL luminescence in the case where a GCCM is combined in the first embodiment.

For example, when a green color conversion layer (hereinafter may be called "GCCM" of "green color changing medium") is provided on the luminescence side, the relationship between the total optical path including the GCCM and the CIEx chromaticity coordinates is shown in FIG. 28, and the relationship between the total optical path including the GCCM and the CIEy chromaticity coordinates is shown in FIG. 29.

Figure 30:
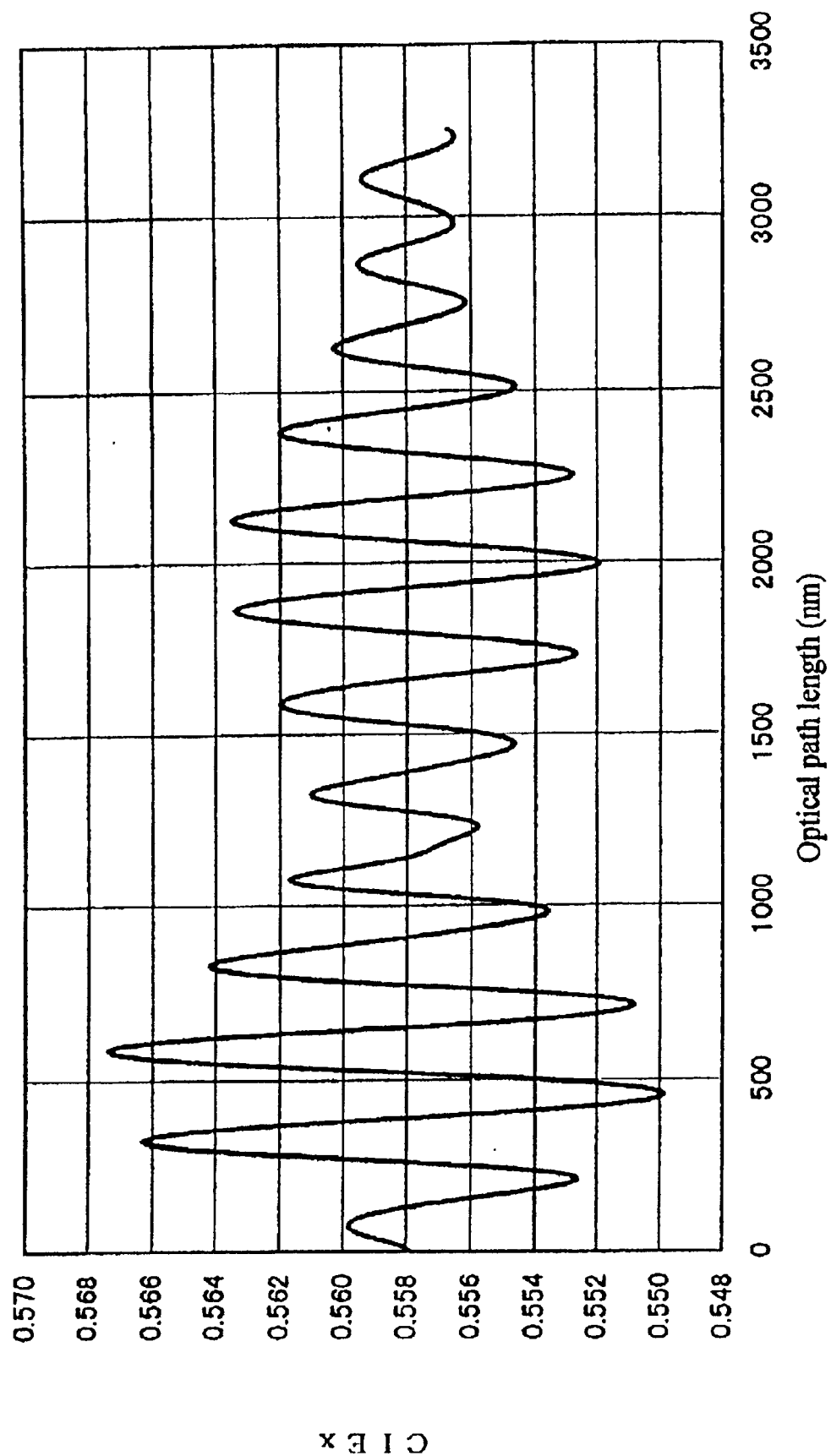
FIG. 30 is a drawing showing the relationship between the total optical path length and each CIEx chromaticity coordinate value of EL luminescence in the case where a RCCM is combined in the first embodiment.
Figure 31:
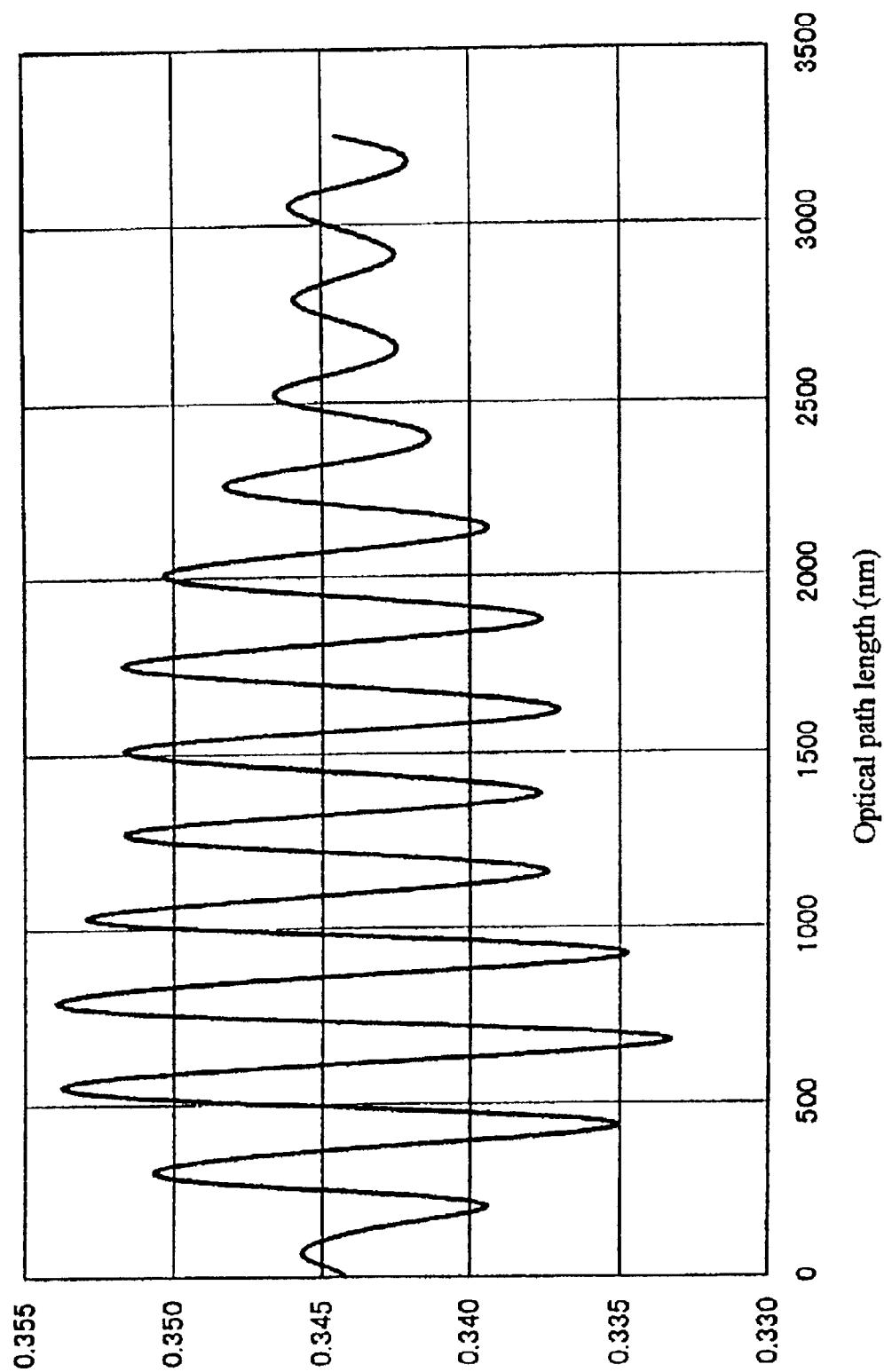
FIG. 31 is a drawing showing the relationship between the total optical path length and each CIEy chromaticity coordinate value of EL luminescence in the case where a RCCM is combined in the first embodiment.

In addition, when a red color conversion layer (hereinafter may be called "RCCM" of "red color changing medium") is provided on the luminescence side, the relationship between the total optical path including the RCCM and the CIEx chromaticity coordinates is shown in FIG. 30, and the relationship between the total optical path including the RCCM and the CIEy chromaticity coordinates is shown in FIG. 31.

(Second Embodiment)

The organic EL device of the second embodiment is substantially the same as that of the first embodiment shown in FIG. 2, wherein the former employs a green light emitting organic layer with a intensity peak wavelength (S3) of 500 to 570 nm as organic light-emitting layer. In the organic EL device of the second embodiment, the total optical path length (t3) of the transparent electrode and the green light emitting organic layer satisfies the inequality, Max−20 nm<t3<Max+20 nm, wherein Max is the maximum optical path length at which the CIEy chromaticity coordinates measured according to JIS Z 8701 exhibits a maximum value.

The following description will be focused on the green light emitting organic layer and the description on other components may be omitted as the case allows.

Figure 8:
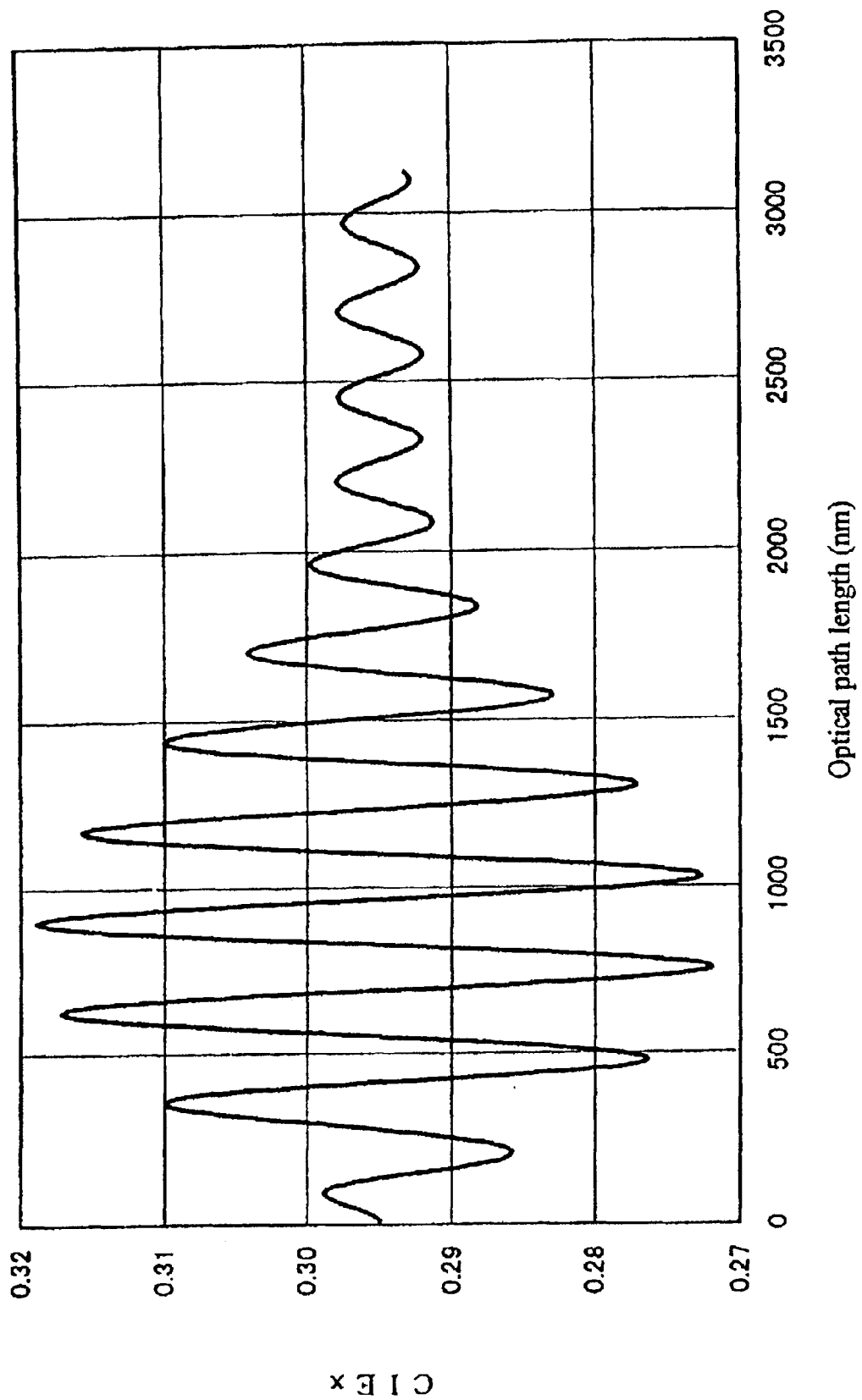
FIG. 8 is a drawing showing the relationship between the total optical path length (t3) of a transparent electrode and a green light emitting organic layer and the CIEx chromaticity coordinate value of EL luminescence.

FIG. 8 is a drawing showing the relationship between the total optical path length (t3) of a transparent electrode and a green light emitting organic layer and the CIEx chromaticity coordinate value of EL luminescence. In FIG. 8, the value (nm) of the total optical path length (t3) is taken along the horizontal axis, and the value of the CIEx chromaticity coordinates is taken along the vertical axis.

Figure 9:
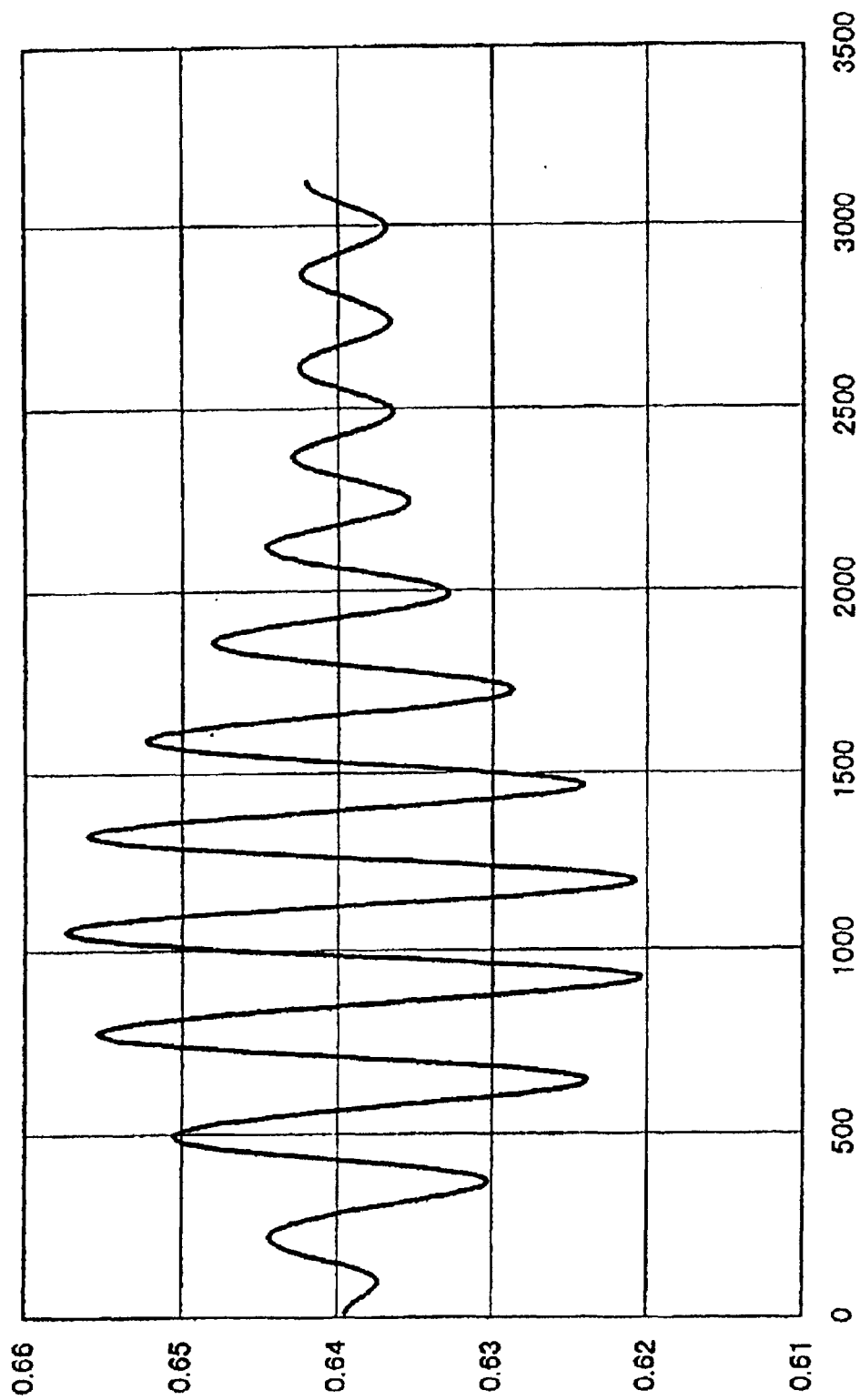
FIG. 9 is a drawing showing the relationship between the total optical path length (t3) of a transparent electrode and a green light emitting organic layer and the CIEy chromaticity coordinate value of EL luminescence.

FIG. 9 is a drawing showing the relationship between the total optical path length (t3) of a transparent electrode and a green light emitting organic layer and the CIEy chromaticity coordinate value of EL luminescence. In FIG. 9, the value (nm) of the total optical path length (t3) is taken along the horizontal axis, and the value of the CTEy chromaticity coordinates is taken along the vertical axis.

Figure 10:
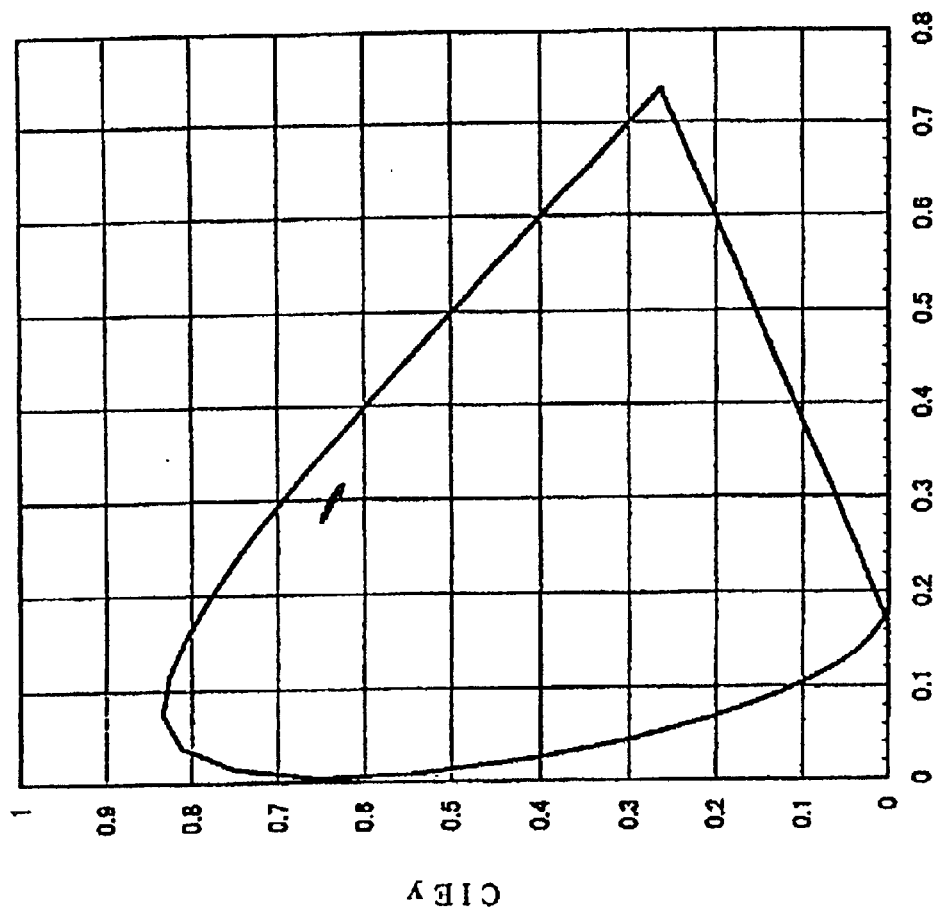
FIG. 10 is a drawing showing the CIE chromaticity coordinates of green light luminescence.
Figure 11:
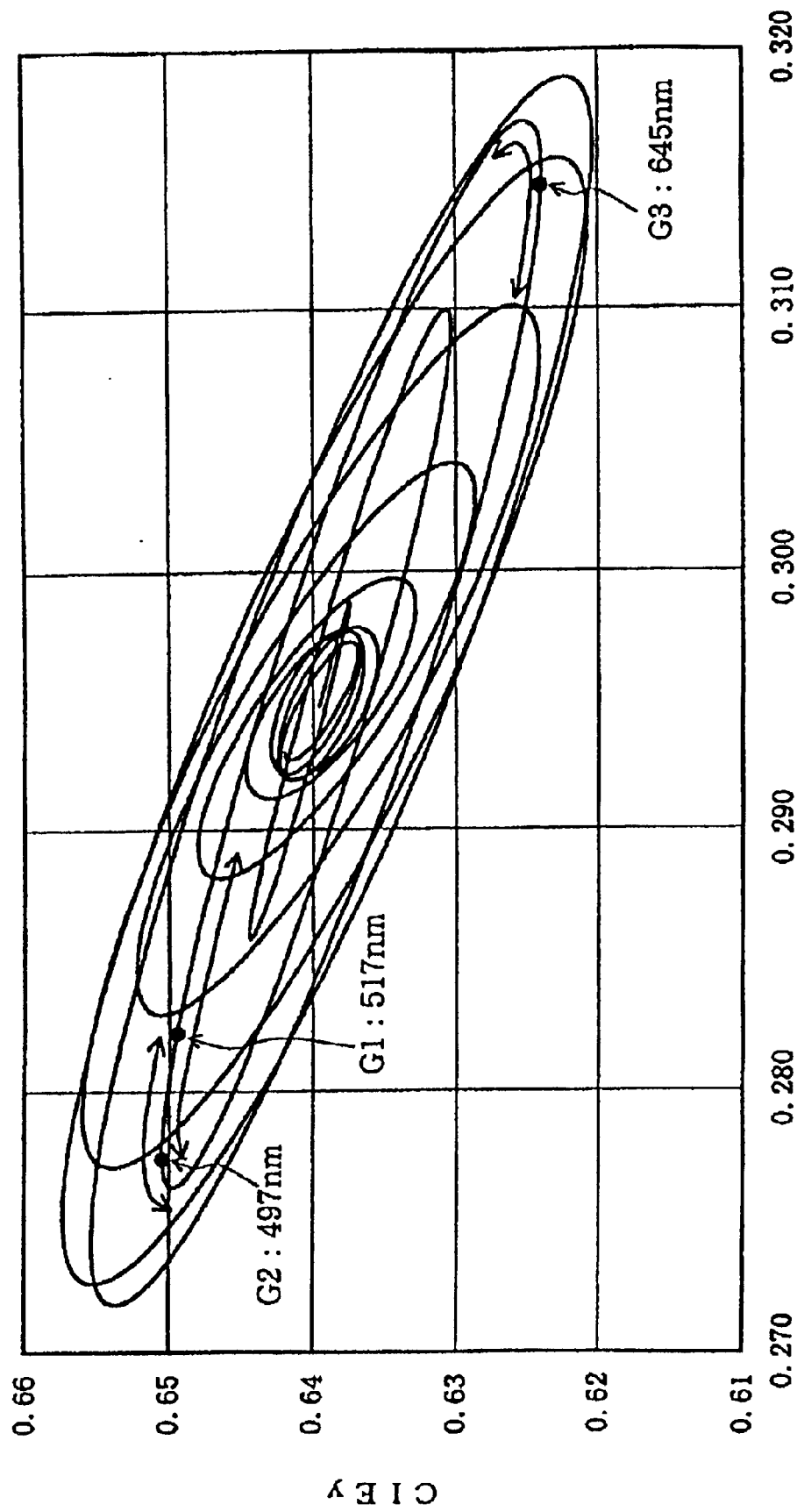
FIG. 11 is a drawing showing an enlarged view of the CIE chromaticity coordinates of green light luminescence.

For reference, the CIE chromaticity coordinates (calculated value) for luminescence from a green light emitting organic layer is shown in FIG. 10 and an enlarged view of FIG. 10 is shown in FIG. 11. In these Figures, the value of the CIEx chromaticity coordinates is taken along the horizontal axis, and the value of the CIEy chromaticity coordinates is taken along the vertical axis. Generally, in the case of green luminescence the CIEx chromaticity coordinate value is about 0.15–0.33 and the CIEy chromaticity coordinate value is about 0.60–0.75.

As can be seen from FIGS. 8 and 9, the values of the CIEx chromaticity coordinates and the CIEy chromaticity coordinates periodically change with the change in the total optical path length of a transparent electrode and a green light emitting organic layer.

The CIEx chromaticity coordinate value exhibits a minimum value in the cycle (hereinafter referred to as minimum vale (Min)) and a maximum value in the cycle (hereinafter referred to as maximum vale (Max)) at each of the following total optical path lengths.

Minimum values (Min): about 200 nm, 470 nm, 745 nm
Maximum vales (Max): about 100 nm, 360 nm, 630 nm, 910 nm The CIEy chromaticity coordinate value exhibits a minimum value in the cycle (hereinafter referred to as minimum vale (Min)) and a maximum value in the cycle (hereinafter referred to as maximum vale (Max)) at each of the following total optical path lengths.

Minimum values (Min): about 100 nm, 360 nm, 640 nm, 910 nm

Maximum vales (Max): about 220 nm, 500 nm, 770 nm

The smaller the fluctuation in the values for the CIEx chromaticity coordinates and the CIEy chromaticity coordinates, the smaller the color change in the green luminescence.

However, in the case of green light, the fluctuation in the CIEy chromaticity coordinates gives a more evident and clear recognition of a green color change to the human eye than the fluctuation in the CIEx chromaticity coordinates.

Therefore, even if there is some fluctuations in the total optical path length of the transparent electrode and the green light emitting organic layer, the change in the CIEy chromaticity coordinate value, which gives a greater effect on the color tone, can be minimized by relating the total optical path length with a minimum value (Min) or a maximum value (Max) of the CIEy chromaticity coordinates.

For example, when the total optical path length of the transparent electrode and the green light emitting organic layer is 517 nm as indicated by G1 in FIG. 11, wherein the total optical path length is related to neither a minimum value (Min) nor maximum value (Max) of the CIEy chromaticity coordinates value, and has the fluctuation of ±20 nm, the CIEy chromaticity coordinates value changes in the range of 0.6482 to 0.6502. The difference between the maximum and minimum values is 0.0020.

In contrast, when the total optical path length of the transparent electrode and the green light emitting organic layer (t3) is 497 nm as indicated by G2 in FIG. 11, wherein the total optical path length is related to a maximum value (Max) of the CIEy chromaticity coordinates value, the CIEy chromaticity coordinates value changes in the range of 0.6502 to 0.6505, with the difference between the maximum and minimum values being as small as 0.0003, even if there is the fluctuation of ±20 nm in the total optical path length. Specifically, the value is only 10% or less of the value when the total optical path length is not related to a maximum value (Max).

In the same manner, when the total optical path length of the transparent electrode and the green luminescence organic layer is 645 nm as indicated by G3 in FIG. 11, wherein the total optical path length is related to a minimum value (Min) of the CIEy chromaticity coordinates value, the CIEy chromaticity coordinates value changes in the range of 0.6239 to 0.6243 even if there is the fluctuation of ±20 nm in the total optical path length. The difference between the maximum and minimum values is 0.0004. Specifically, the value is only 20% or less of the value when the total optical path length is not related to a minimum value (Min).

Figure 12:
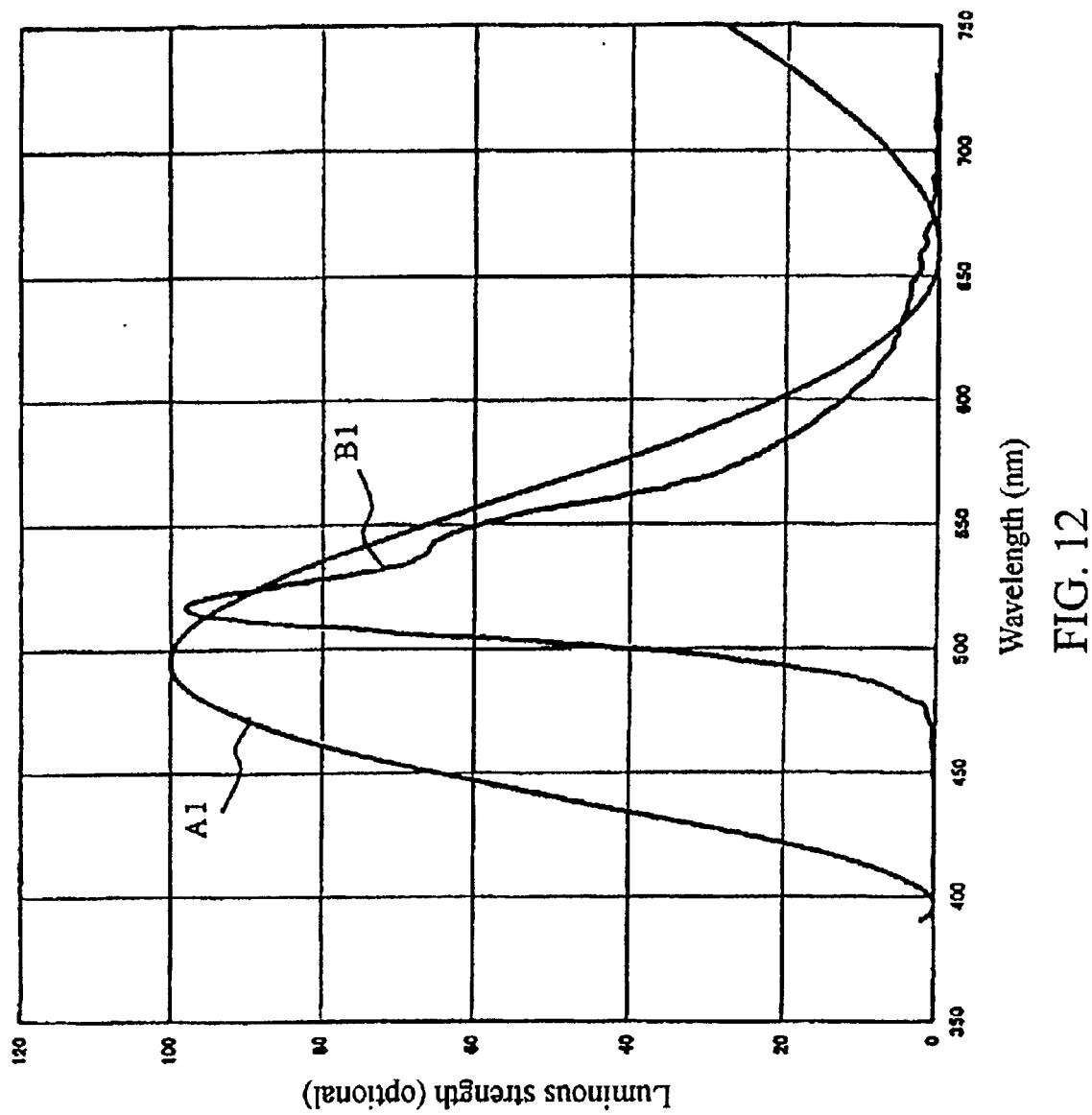
FIG. 12 is a drawing showing the relationship between the interference peak (A1) and the intensity peak (B1) of the green light emitting organic layer in the second embodiment.

FIG. 12 is a drawing showing the relationship between an interference peak and the intensity peak when a green light is emitted in the second embodiment. In FIG. 12, the interference peak is indicated by A1 and the intensity peak is indicated by B1. In this example, the total optical path length of a transparent electrode and a green light emitting organic layer is 497 nm which is related to a maximum value (Max) of the CIEy chromaticity coordinates. In this figure, however, the interference factors are standardized so that the maximum value is 100 and the minimum value is 0 to clearly indicate the interference peak position. On the other hand, actual luminescence values are indicated without standardization.

As can be seen in FIG. 12, there is an about 20 nm wavelength difference between the interference peak A1 (wavelength: about 500 nm) and the intensity peak B1 (wavelength: about 520 nm) in the second embodiment.

Figure 13:
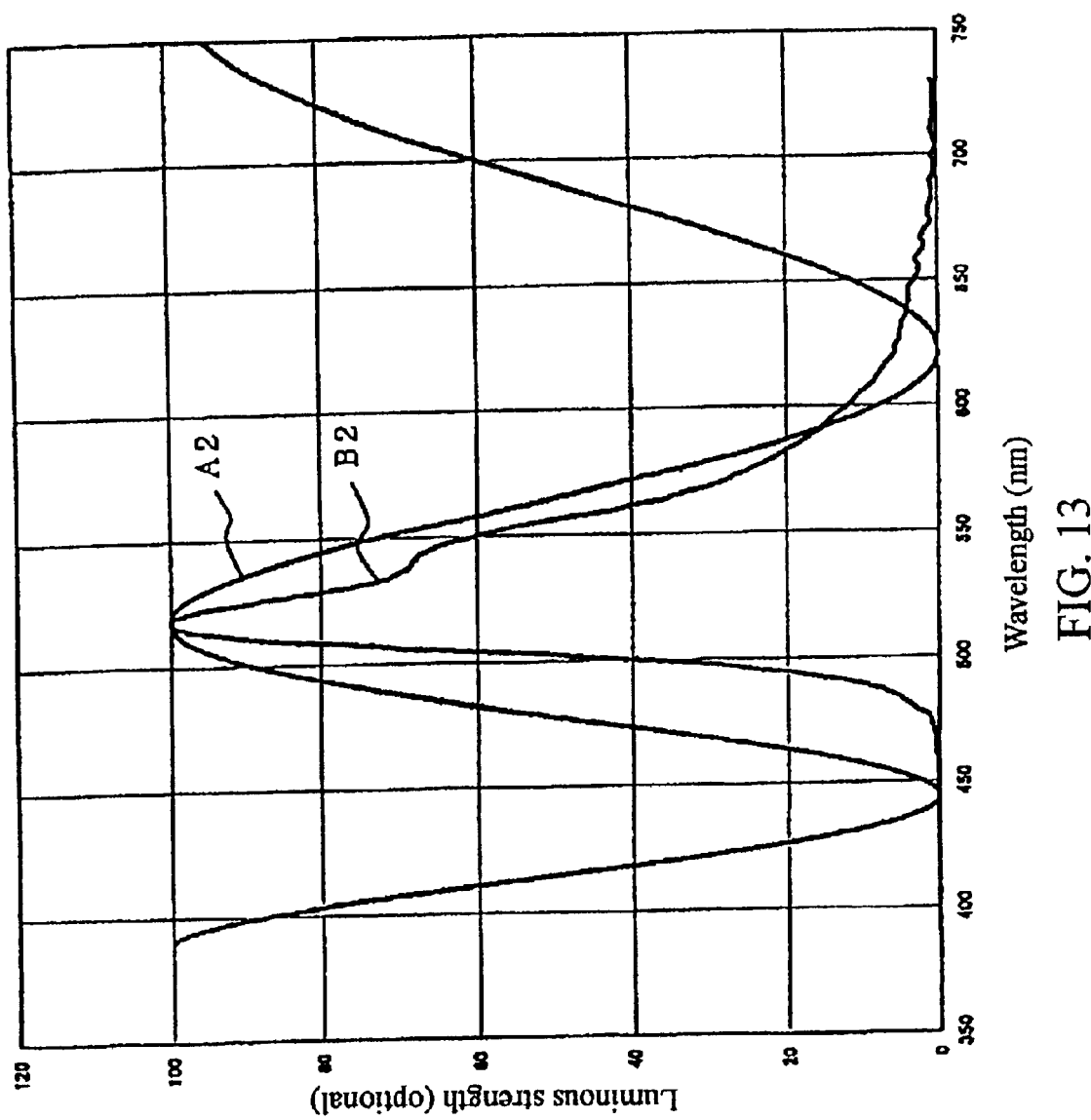
FIG. 13 is a drawing showing the relationship between the interference peak (A2) and the intensity peak (B2) of the green light emitting organic layer in a conventional organic EL device.

On the other hand, FIG. 13 shows the relationship among the interference peak, intensity peak, and wavelength when a green light is emitted by a conventional organic EL device. In FIG. 13, the interference peak is indicated by A2 and the intensity peak is indicated by B2. In this conventional case, the total optical path length (nm) of the transparent electrode and the green light emitting organic layer is 517 nm as indicated G1 in FIG. 11 in order to accord the interference peak A2 with the intensity peak B2. However, in the case of this total optical path length, the CIEy chromaticity coordinate value exhibits neither a maximum value (Max) nor a minimum value (Min).

Therefore, if the relationship shown in FIG. 8 and FIG. 9 is taken into consideration, the change in the CIE chromaticity coordinates value in the organic EL device of the second embodiment is decreased by relating the total optical path length of the transparent electrode and the green organic layer to either a maximum value (Max) or a minimum value (Min), preferably to a maximum value (Max) of the CIEy chromaticity coordinates, even if there is the certain fluctuation in the total optical path length and there is a difference between the interference peak (A1) and the intensity peak (B1). This eventually decreases a color change.

On the other hand, in the conventional organic EL device in which the total optical path length of the transparent electrode and green light emitting organic layer is related to neither a maximum value (Max) nor a minimum value (Min), the change in the CIEy chromaticity coordinates value originating from the fluctuation of the total optical path length is bigger and significant problems even if the interference peak A2 is coincided with the intensity peak B2. As a result, the change in a visualized green color becomes bigger and significant problems.

Although the value of EL luminescence is somehow decreased by the discrepancy of the interference peak (A1) of a green light emitting organic layer and the intensity peak (B1) in the organic EL device of the second embodiment, the decrease is as small as about 2% as compared with a conventional organic EL device in which the interference peak (A2) and the intensity peak (B2) are identical. Thus, with regard to the decrease of the EL luminescence, there are no problems in practical use.

(Third Embodiment)

Figure 14:
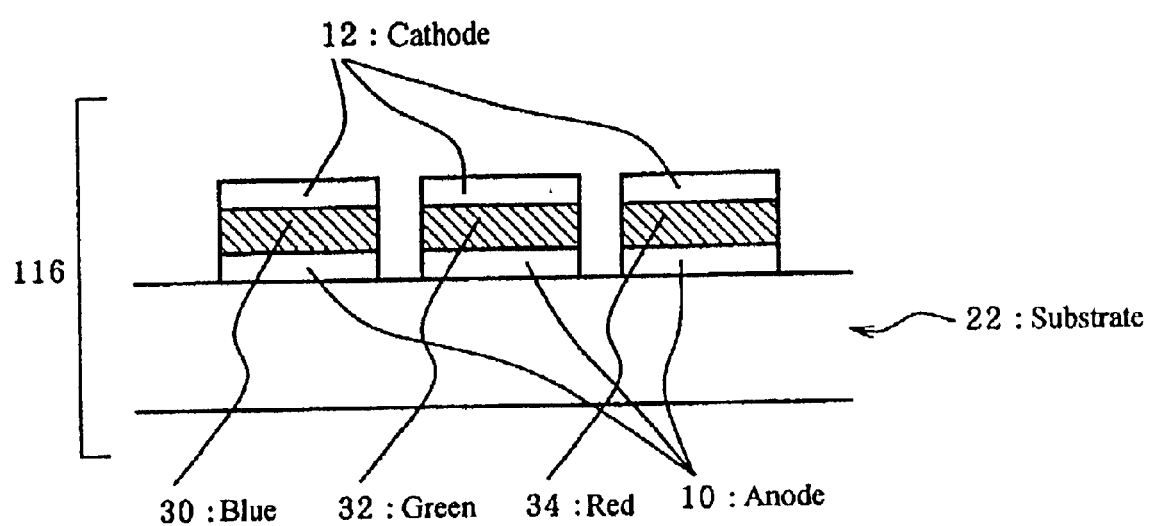
FIG. 14 shows a cross-sectional view of the organic EL device in the third embodiment.

As shown in FIG. 14, the organic EL device 116 of the third embodiment has a blue light emitting organic layer 30 of which the intensity peak wavelength is between 400 and 490 nm, a green light emitting organic layer 32 of which the intensity peak wavelength is between 500 and 570 nm, and a red light emitting organic layer 34 of which the intensity peak wavelength is between 580 and 700 nm, each formed between a transparent electrode layer (an anode layer) 10 and a cathode layer 12, with the resulting layers being formed on a glass substrate 22.

In the organic EL device 116 of the third embodiment, the total optical path length (t1) of the transparent electrode 10 and the blue light emitting organic layer 30 satisfies the inequality Min−20 nm<t1<Min+20 nm, wherein Min is the optical path length at which the CIEy chromaticity coordinates measured according to JIS Z 8701 exhibits a minimum value.

In addition, the total optical path length (t3) of the transparent electrode 10 and the green light emitting organic layer 32 satisfies the inequality, Max−20 nm<t3<Max+20 nm, wherein Max is the optical path length at which the CIEy chromaticity coordinates measured according to JIS Z 8701 exhibits a maximum value.

Furthermore, the total optical path length (t2) of the transparent electrode 10 and the red light emitting organic layer 34 satisfies the inequality, Max−20 nm<t3<Max+20 nm, wherein Max is the optical path length at which the CIEx chromaticity coordinates measured according to JIS Z 8701 exhibits a maximum value.

Therefore, the organic EL device of the third embodiment is the same as that of the first embodiment, except that the former has not only a blue light emitting organic layer 30 of which the intensity peak wavelength is between 400 and 490 nm, but also a green light emitting organic layer 32 of which the intensity peak wavelength is between 500 and 570 nm, and a red light emitting organic layer 34 of which the intensity peak wavelength is between 580 and 700 nm, as organic layers.

Also, the green light emitting organic layer of which the intensity peak wavelength is between 500 and 570 nm is same as that of the second embodiment.

Therefore, the following description will be focused on the red light emitting organic layer 34 of which the intensity peak wavelength is between 580 and 700 nm, and the description on other components may be omitted as the case allows.

Figure 15:
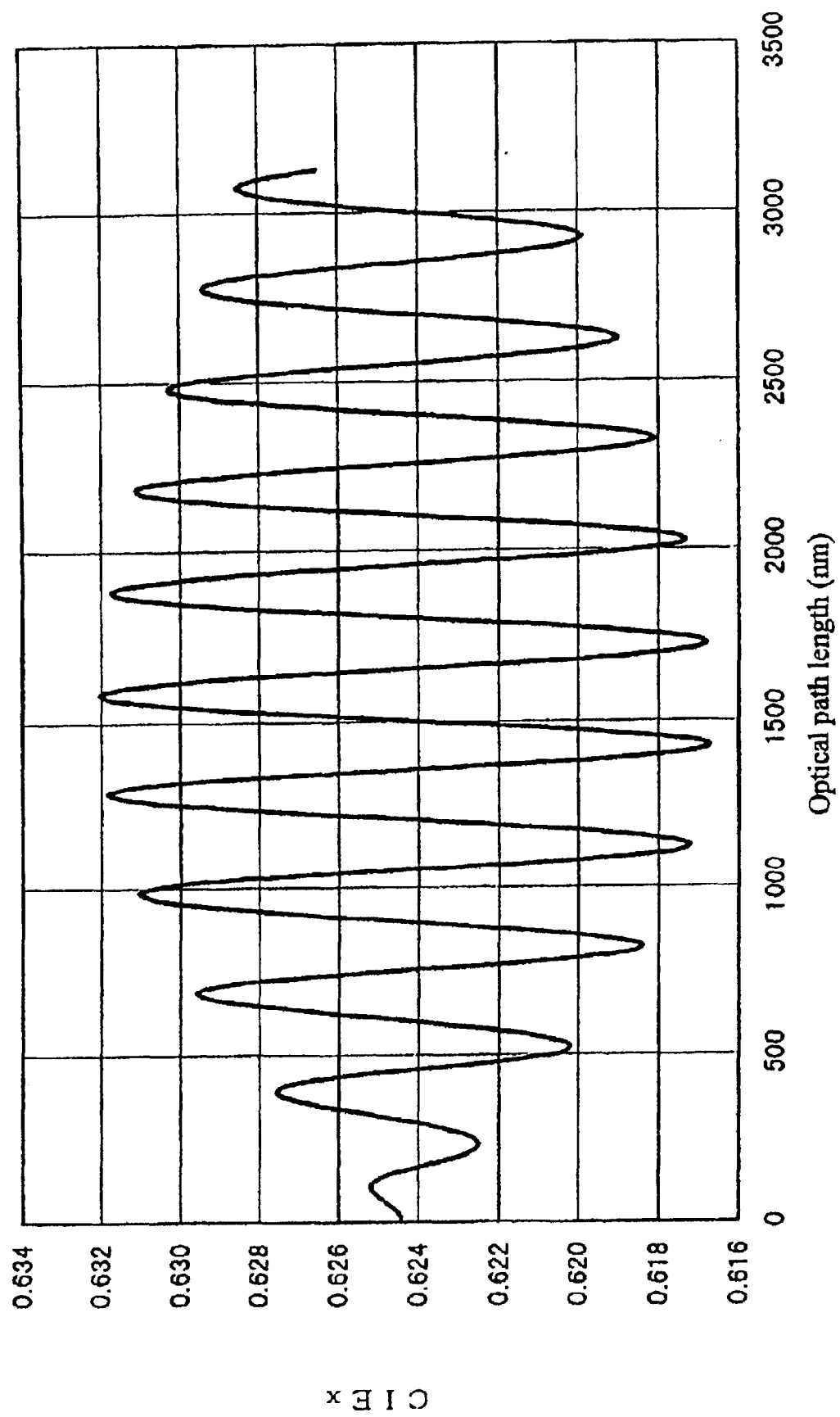
FIG. 15 is a drawing showing the relationship between the total optical path length (t2) of a transparent electrode and a red light emitting organic layer and the CIEx chromaticity coordinate value of EL luminescence.

FIG. 15 is a drawing showing the relationship between the total optical path length (t2) of a transparent electrode and a red light emitting organic layer and the CIEx chromaticity coordinate value of EL luminescence. In FIG. 15, the value (nm) of the total optical path length (t2) is taken along the horizontal axis, and the value of the CIEx chromaticity coordinates is taken along the vertical axis.

Figure 16:
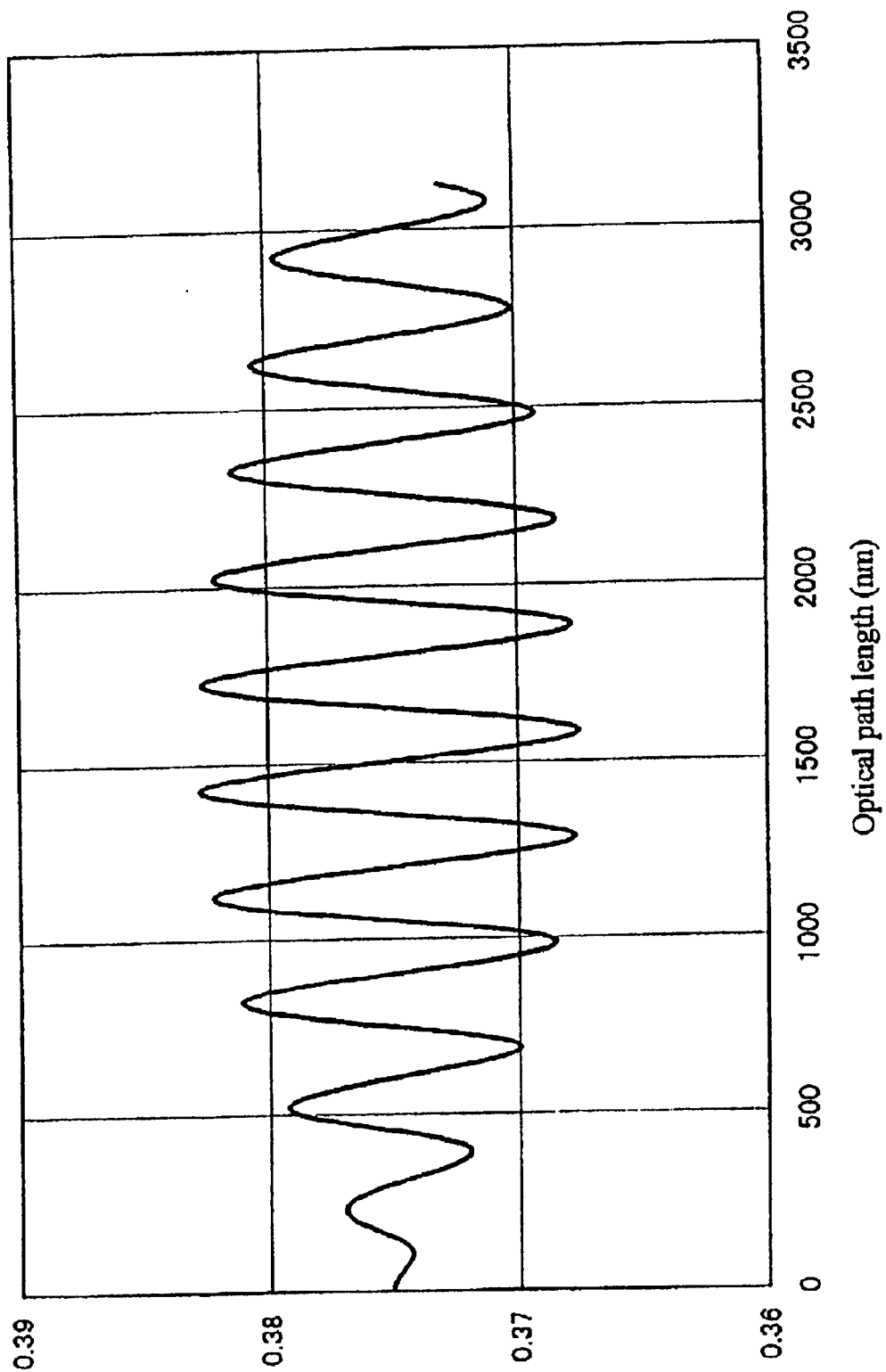
FIG. 16 is a drawing showing the relationship between the total optical path length (t2) of a transparent electrode and a red light emitting organic layer and the CIEy chromaticity coordinate value of EL luminescence.

FIG. 16 is a drawing showing the relationship between the total optical path length (t2) of a transparent electrode and a red light emitting organic layer and the CIEy chromaticity coordinate value of EL luminescence. In FIG. 16, the value (nm) of the total optical path length (t2) is taken along the horizontal axis, and the value of the CIEy chromaticity coordinates is taken along the vertical axis.

Figure 17:
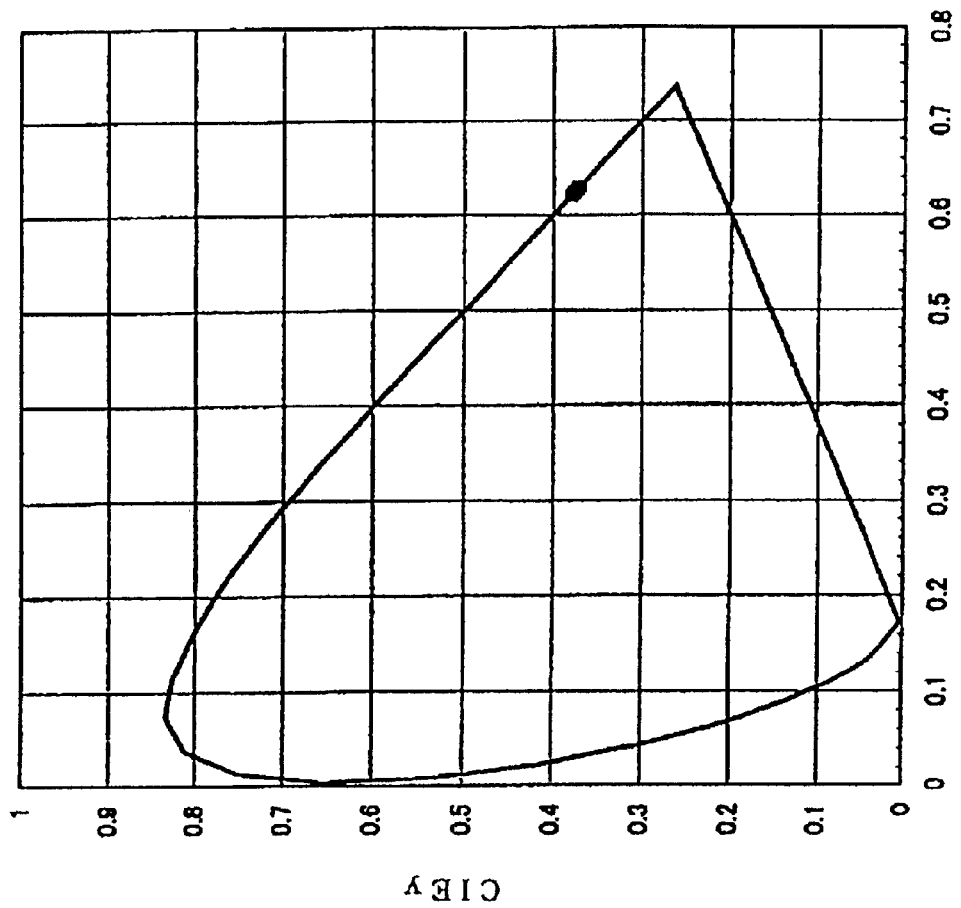
FIG. 17 is a drawing showing the CIE chromaticity coordinates of red light luminescence.
Figure 18:
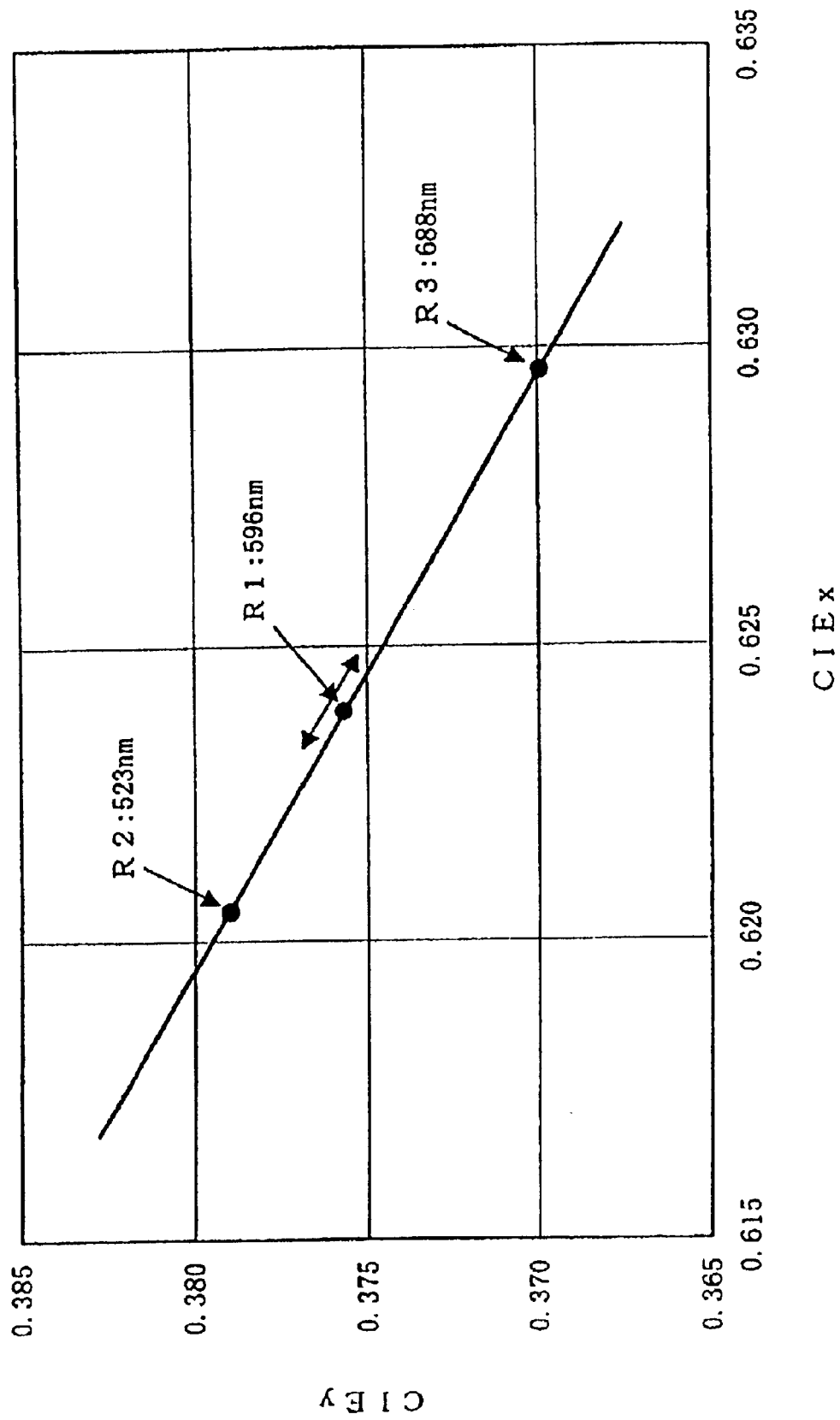
FIG. 18 is a drawing showing an enlarged view of the CIE chromaticity coordinates of red light luminescence.

For reference, the CIE chromaticity coordinates (calculated value) for luminescence from a red light emitting organic layer is shown in FIG. 17 and an enlarged view of FIG. 17 is shown in FIG. 18. In these Figures, the value of the CIEx chromaticity coordinates is taken along the horizontal axis, and the value of the CIEy chromaticity coordinates is taken along the vertical axis. Generally, in the case of red luminescence the CIEx chromaticity coordinate value is about 0.60–0.70 and the CIEy chromaticity coordinate value is about 0.30–0.38.

As can be seen from FIGS. 15 and 16, the values of the CIEx chromaticity coordinates and the CIEy chromaticity coordinates periodically change with the change in the total optical path length of a transparent electrode and a red light emitting organic layer.

The CIEx chromaticity coordinate value exhibits a minimum value in the cycle (hereinafter referred to as minimum vale (Min)) and a maximum value in the cycle (hereinafter referred to as maximum vale (Max)) at each of the following total optical path lengths.

Minimum values (Min): about 230 nm, 530 nm, 820 nm
Maximum vales (Max): about 100 nm, 390 nm, 680 nm, 980 nm The CIEy chromaticity coordinate value exhibits a minimum value in the cycle (hereinafter referred to as minimum vale (Min)) and a maximum value in the cycle (hereinafter referred to as maximum vale (Max)) at each of the following total optical path lengths.

Minimum values (Min): about 100 nm, 390 nm, 690 nm, 980 nm
Maximum vales (Max): about 230 nm, 520 nm, 820 nm The smaller the fluctuation in the values for the CIEx chromaticity coordinates and the CIEy chromaticity coordinates, the smaller the color change in the red luminescence. However, in the case of red light, the fluctuation in the CIEx chromaticity coordinates gives a more evident recognition of a red color change to the human eye than the fluctuation in the CIEy chromaticity coordinates.

Therefore, even if there is some fluctuation in the total optical path length of the red light emitting organic layer, the change in the CIEx chromaticity coordinate value, which gives a greater effect on the color tone, can be minimized by relating the total optical path length with a minimum value (Min) or maximum value (Max) of the CIEx chromaticity coordinates.

For example, when the total optical path length of the transparent electrode and the red light emitting organic layer is 596 nm as indicated by R1 in FIG. 18, wherein the total optical path length is related to neither a minimum value (Min) nor maximum value (Max) of the CIEx chromaticity coordinates value, and has the fluctuation of ±20 nm, the CIEx chromaticity coordinates value changes in the range of 0.6231 to 0.6247. The difference between the maximum and minimum values is 0.0016.

In contrast, when the total optical path length (t2) of the transparent electrode and the red light emitting organic layer (t2) is 523 nm as indicated by R2 in FIG. 18, wherein the total optical path length is related to a minimum value (Min) of the CIEx chromaticity coordinates value, the CIEx chromaticity coordinate value changes in the range of 0.6202 to 0.6203, with the difference between the maximum and minimum values being as small as 0.0001, even if there is the fluctuation of ±20 nm in the total optical path length. Specifically, the value is only 7% or less of the value when the total optical path length is not related to a minimum value (Min).

In the same manner, when the total optical path length (t2) of the transparent electrode and the red light emitting organic layer is 688 nm as indicated by R3 in FIG. 18, wherein the total optical path length is related to maximum value (Max) of the CIEx chromaticity coordinates value, the CIEx chromaticity coordinates value changes in the range of 0.6295 to 0.6296. The difference between the maximum and minimum values is 0.0001. Specifically, the value is only 7% or less of the value when the total optical path length is not related to a maximum value (Max).

Figure 19:
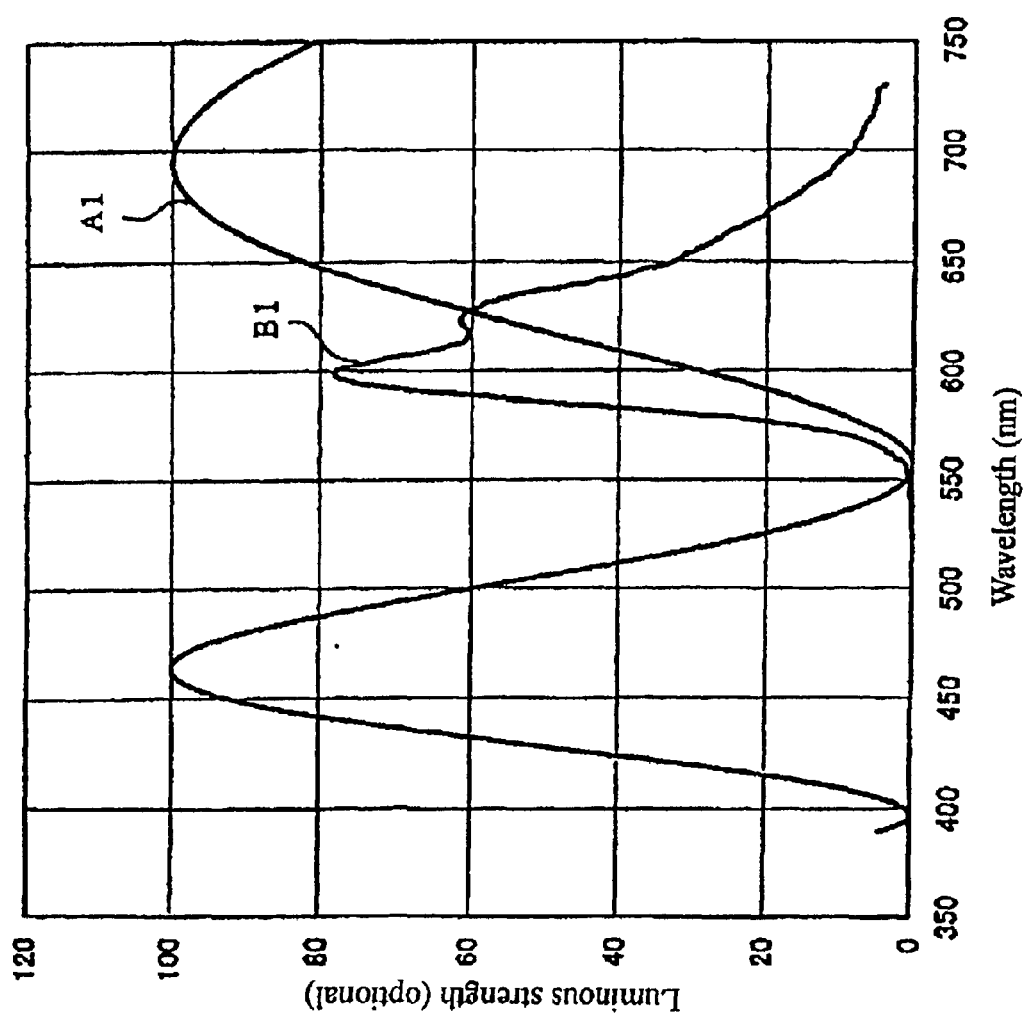
FIG. 19 is a drawing showing the relationship between the interference peak (A1) and the intensity peak (B1) of the red light emitting organic layer in the third embodiment.

FIG. 19 is a drawing showing the relationship between an interference peak and the intensity peak when a red light is emitted in the third embodiment. In FIG. 19, the interference peak is indicated by A1 and the intensity peak is indicated by B1. In this example, the total optical path length of a transparent electrode and a red light emitting organic layer is 680 nm which is related to a maximum value (Max) of the CIEx chromaticity coordinates. In this figure, however, the interference factors are standardized so that the maximum value is 100 and the minimum value is 0 to clearly indicate the interference peak position. On the other hand, actual intensity values are indicated without standardization.

As can be seen in FIG. 19, there is an about 100 nm wavelength difference between the interference peak A1 (wavelength: about 700 nm) and the intensity peak B1 (wavelength: about 600 nm) in the red light emitting organic layer of the third embodiment.

Figure 20:
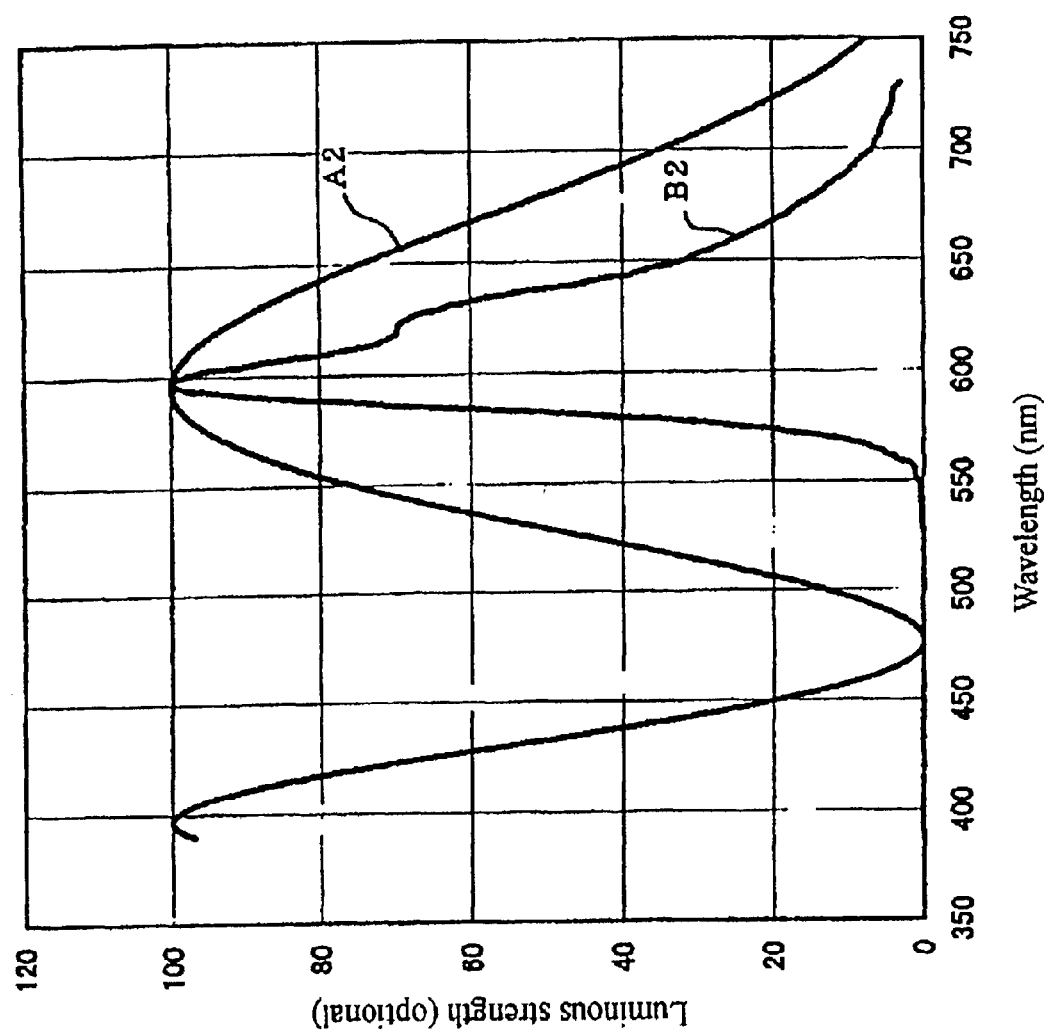
FIG. 20 is a drawing showing the relationship between the interference peak (A2) and the intensity peak (B2) of the red light emitting organic layer in a conventional organic EL device.

On the other hand, FIG. 20 shows the relationship among the interference peak, intensity peak, and wavelength when a red light is emitted by a conventional organic EL device. In FIG. 20, the interference peak is indicated by A2 and the intensity peak is indicated by B2. In this conventional case, the total optical path length (nm) of the transparent electrode and the red light emitting organic layer is 596 nm as indicated by R1 in FIG. 18 in order to accord the interference peak A2 with the intensity peak B2.

Therefore, if the relationship shown in FIG. 15 and FIG. 16 is taken into consideration, the color change in the red light emitting organic layer of the third embodiment is decreased by relating the total optical path length of the transparent electrode and the red organic layer to either a maximum value (Max) or a minimum value (Min), preferably to a maximum value (Max) or minimum value (Min) of the CIEx chromaticity coordinates, even if there is the certain fluctuation in the total optical path length and there is a difference between the interference peak (A1) and the intensity peak (B1).

On the other hand, in the conventional organic EL device in which the total optical path length of the transparent electrode and red light emitting organic layer is related to neither a maximum value (Max) nor a minimum value (Min), the change in the CIEx chromaticity coordinates value originating from the fluctuation of the total optical path length is bigger and significant problems even if the interference peak A2 is coincided with the intensity peak B2. As a result, the change in a visualized red color becomes bigger and significant problems.

Although the value of EL luminescence is somehow decreased by the discrepancy of the interference peak (A1) of a red light emitting organic layer and the intensity peak (B1) in the organic EL device of the third embodiment, the decrease is as small as about 20% as compared with a conventional organic EL device in which the interference peak (A2) and the intensity peak (B2) are identical. Thus, with regard to the decrease of the EL luminescence, there are no problems in practical use.

(Fourth Embodiment)

Figure 21:
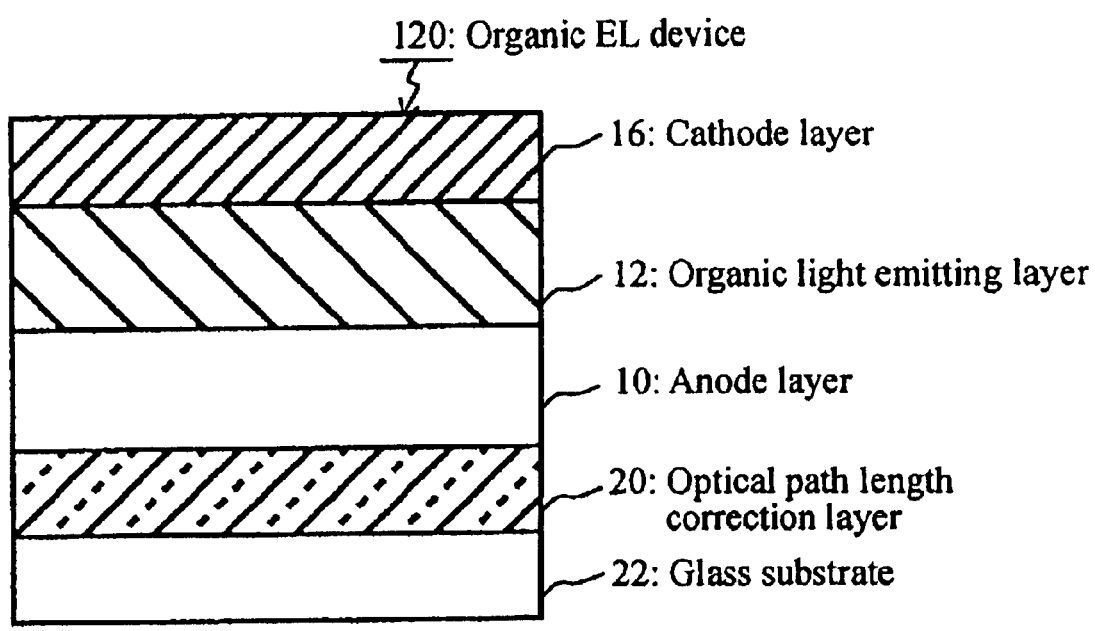
FIG. 21 shows a cross-sectional view of the organic EL device in the fourth embodiment.

As shown in FIG. 21, an organic EL device 120 of the fourth embodiment has an optical path length correction layer 20, a transparent electrode layer (an anode layer) 10, a blue light emitting organic layer 12 of which the intensity peak wavelength (S1) is between about 400 and 490 nm, and a cathode layer 16 formed on a glass substrate 22 in that order. In the organic EL device 120 of the fourth embodiment, the total optical path length (t4) of the transparent electrode 10 and the blue light emitting organic layer 12 satisfies the inequality Min−20 nm<t4<Min 20 nm, wherein Min is the minimum optical path length at which the CIEy chromaticity coordinates measured according to JIS Z 8701 exhibits a minimum value.

Thus, the organic EL device of the fourth embodiment is same as that of the first embodiment, except that an optical path length correction layer 20 is provided between a transparent electrode layer (an anode layer) 10 and a blue light emitting organic layer 12, and the total optical path length (t4) is limited in the fixed range.

Therefore, the following description will be focused on the optical path length correction layer 20 and the description on other components may be omitted as the case allows.

The transparent electrode is not necessarily the anode layer, but the cathode layer may be the transparent layer, or both the anode layer and cathode layer may be the transparent layer. However, when both the anode layer and the cathode layer are transparent layers, the length of the anode layer and the cathode layer is further added to the total optical path length.

(1) Optical Path Length Correction Method by Optical Path Length Correction Layer A method of correcting the optical path length using an optical path length correction layer will be described referring to FIGS. 2 to 7. As previously described, FIG. 7 is a drawing showing the relationship among the interference factor by the blue light emitting organic layer, radiant intensity spectrum, and wavelength (nm) in a conventional organic EL device. In the case of FIG. 7, the total optical path length (t3) of the transparent electrode and blue light emitting organic layer is 468 nm, which is related to neither a maximum value (Max) nor minimum value (Min) of the CIEx chromaticity coordinates or the CIEy chromaticity coordinates, as can be seen from FIGS. 2 and 3.

Then, the total optical path length (t1) of the transparent electrode and blue light emitting organic layer which coincides with, for example, a minimum vale (Min) of the CIEx chromaticity coordinates or the CIEy chromaticity coordinates, is selected from FIGS. 2 and 3.

In this instance, any minimum value (Min) among three to four minimum values (Min) indicated in FIGS. 2 and 3 may be used in selecting the total optical path length (t1). It is preferable, however, to select the minimum value (Min) around which the values for the CIEx chromaticity coordinates and the CIEy chromaticity coordinates exhibit least fluctuation. The fluctuation in the CIEx chromaticity coordinate value and the CIEy chromaticity coordinate value due to the change in the total optical path length may be minimized by selecting such a minimum value (Min).

Accordingly, the difference between the total optical path length of the transparent electrode and blue light emitting organic layer in a conventional organic EL device and the total optical path length (t1) of the transparent electrode and blue light emitting organic layer corresponding to the selected the minimum value (Min) for the CIEx chromaticity coordinates and the CIEy chromaticity coordinates is the optical path length due to the optical path length correction layer.

Accordingly, the thickness for the optical path length correction layer and other constitution materials may be selected so that such an optical path length for correction may be added. In this instance, to accord the total optical path length with the optical path length 670 nm, which corresponds to one of the minimum values (Min) of the CIEy chromaticity coordinates, 468 nm which is the total optical path length of the transparent electrode and blue light emitting organic layer before the optical path length correction, is subtracted from 670 nm. The resultant optical path length 202 nm should be the length for the optical path length correction layer. Providing the optical path length correction layer makes it unnecessary to increase the thickness of the organic material layer to be provided between the electrodes for optical correction, thereby obviating a voltage rise due to a thick organic material layer. This is additional advantage of the optical path length correction layer.

(2) Materials

Inorganic and organic substances may be used without specific limitations as the material for the optical path length correction layer. As inorganic substances, glass, quartz, oxides such as tin oxide, indium oxide, lead oxide, aluminum oxide, and lithium oxide, fluorides such as lithium fluoride, calcium fluoride, and magnesium fluoride, and the like may be used. In addition, metals such as gold, silver, copper, aluminum, and molybdenum, which are transparent in a thin film, may be used. These inorganic substances may be used either individually or in combination of two or more.

As organic substances, organic EL materials, polypropylene resins, polyethylene resins, fluorine-containing resins, acrylic resins, polyether sulfone resins, polycarbonate resins, and the like are given. These organic substances may be used either individually or in combination of two or more. These substances must allow electric charges to pass through when formed between electrodes, but may be a complete insulating material when formed outside the electrodes.

Because the optical path length is dependent upon the film thickness and refractive index, the refractive index of the material is preferably in the range of 1.0 to 3.0 (determined by Abbe's refractometer at 25° C. It is difficult to find available materials with a refractive index of less than 1.0. On the other hand, the selection of materials is unduly limited if the required refractive index is more than 3.0.

Therefore, in view of good balance between the thin film thickness requirement and the selectivity, the refractive index of the material is preferably between 1.3 and 2.5, and more preferably between 1.7 and 2.1.

(3) Thickness

Although the thickness of the optical path length correction layer is not specifically restricted, this thickness is preferably in the range of 1 nm to 2,000 nm, for example. If the thickness of the optical path length correction layer is less than 1 nm, it may be difficult to form a uniform thickness layer or the effect of the optical path length correction layer may not be sufficient. On the other hand, if the optical path length correction layer is thicker than 2,000 nm, the effect of an uneven thickness of the optical path length correction layer may not be neglected, so that it may be difficult to adjust the total optical path length of the transparent electrode layer and the organic light emitting layer.

Therefore, the thickness of the optical path length correction layer is more preferably between 2 nm and 500 nm, and still more preferably between 5 nm and 100 nm.

(4) Method of Forming

Although the method of forming the optical path length correction layer is not specifically limited, a vapor deposition method, sputtering method, EB (Electron Beam) method, MBE (Molecular Beam Epitaxy) method, LB (Langumuir Blodgett) method, CVD (Chemical Vapor Deposition) method, spin coat method, and casting method, for example, are preferable.

(5) Configuration Examples

Although the organic EL device 120 of the fourth embodiment with the following structure (i) comprising the optical path length correction layer 20 between the substrate and the transparent electrode layer (anode layer) 10, as shown in FIG. 21, has been described, it is also preferable to employ the following structures (ii) to (vii) in which other structural elements such as a hole injection layer and an electron injection layer are combined. The structures (i) and (v) to (vii), in which the optical path length correction layer is provided between the substrate and the anode layer, are particularly preferable because these do not alter the structure of the anode layer/organic light-emitting layer/cathode layer in conventional organic EL devices.

The substrate is not necessarily limited to an anode base, but a cathode base is also acceptable. In addition, the number optical path length correction layer is not necessarily limited to one, but two optical path length correction layers as in the following structure (iv) is also acceptable.

(i) Substrate/optical path length correction layer/anode layer/organic light-emitting layer/cathode layer (ii) Substrate/anode layer/optical path length correction layer/organic light-emitting layer/cathode layer (iii) Substrate/anode layer/organic light-emitting layer/optical path length correction layer/cathode layer (iv) Substrate/optical path length correction layer/anode layer/optical path length correction layer/organic light-emitting layer/cathode layer (v) Substrate/optical path length correction layer/anode layer/hole injection layer/organic light-emitting layer/cathode layer (vi) Substrate/optical path length correction layer/anode layer/organic light-emitting layer/electron injection layer/cathode layer (vii) Substrate/optical path length correction layer/anode layer/hole injection layer/organic light-emitting layer/electron injection layer/cathode layer (Fifth Embodiment)

The fifth embodiment is a method of manufacturing the organic EL device 120 of the fourth embodiment. The method comprises a step of forming the transparent electrode, organic layer, and optical path length correction layer so that the total optical path length (t) (nm) of the transparent electrode, organic layer, and optical path length correction layer satisfies the following inequality (a) or inequality (b) or both: wherein Min is the optical path length (nm) at which the CIEx chromaticity coordinates or CIEy chromaticity coordinates measured according to JIS Z 8701 exhibit a minimum value, and Max is the optical path length (nm) at which the CIEx chromaticity coordinates or CIEy chromaticity coordinates measured according to JIS Z 8701 exhibit a maximum value.

$$\text{Min}-20 \text{ nm} < t < \text{Min}+20 \text{ nm} \tag{a}$$

$$\text{Max}-20 \text{ nm} < t < \text{Max}+20 \text{ nm} \tag{b}$$

Therefore, it is preferable that the fifth embodiment comprise a step of preparing a substrate, a step of forming an optical path length correction layer, a step of forming an anode layer (a transparent electrode), a step of forming an organic layer, and a step of forming a cathode layer in that order.

The step of forming an anode layer (a transparent electrode) may be just providing a substrate made from a transparent electrode of a prescribed material having a prescribed thickness, and using this substrate as is.

The step of forming the optical path length correction layer, which is a feature of the fifth embodiment, may be performed after the determination of the thickness and material for construction of the optical path length correction layer as described in the fourth embodiment. Thereafter, the optical path length correction layer is formed on the substrate. The vacuum deposition method, for example, as also described in the fourth embodiment can be used as the method of forming. Then, a conventional organic EL device described in the fourth embodiment may be formed on the optical path length correction layer.

When preparing such an organic EL device with the optical path length correction layer, the conditions for the conventional fabrication method of organic EL devices may be basically employed as is.

A method of fabrication comprising forming a first optical path length correction layer on the substrate, forming an anode layer thereon, and then forming a second optical path length correction layer may also be used. This method ensures fabrication of an organic EL device with three primary colors (red, blue, green), each requiring the individual material of construction and thickness for the optical path length correction layer.

EXAMPLES

Example 1

(1) Preparation for Manufacturing Organic EL Device

Before fabricating the organic EL device of Example 1, which has a structure shown in FIG. 1, a transparent electrode film with a thickness of 130 nm was formed from ITO as an anode layer 10 on a transparent glass substrate 22 with a dimension of 1.1 mm (thickness)×200 mm (length)×200 mm (width). The glass substrate 22 and the anode layer 10 are collectively called a substrate 30 in the following description.

This substrate 30 was cleaned in isopropyl alcohol with the ultrasonic cleaner, dried in a nitrogen gas atmosphere, and washed for 10 minutes using UV (ultraviolet radiation) and ozone.

Figure 34:
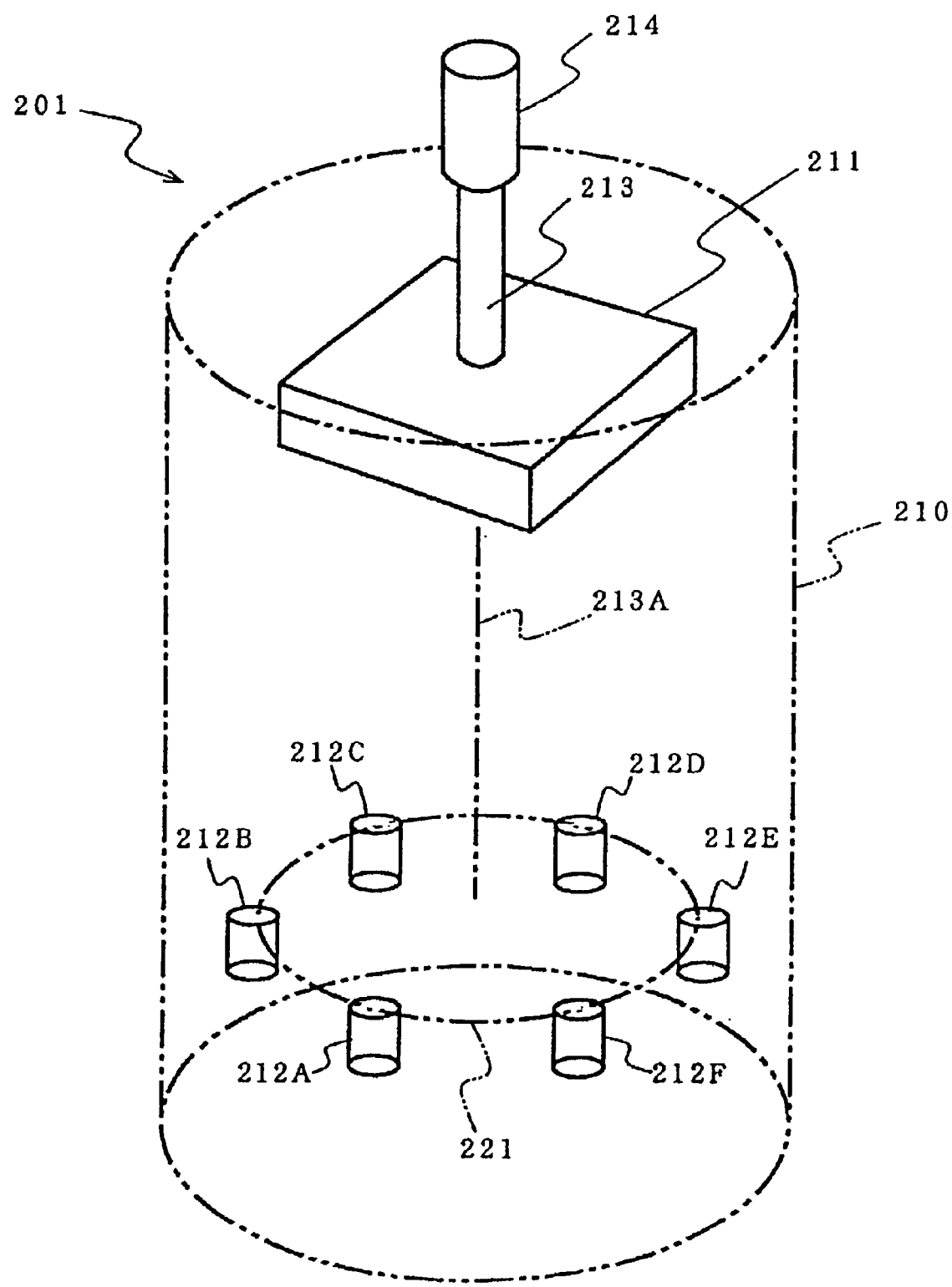
FIG. 34 is a drawing showing a vacuum deposition apparatus.
Figure 35:
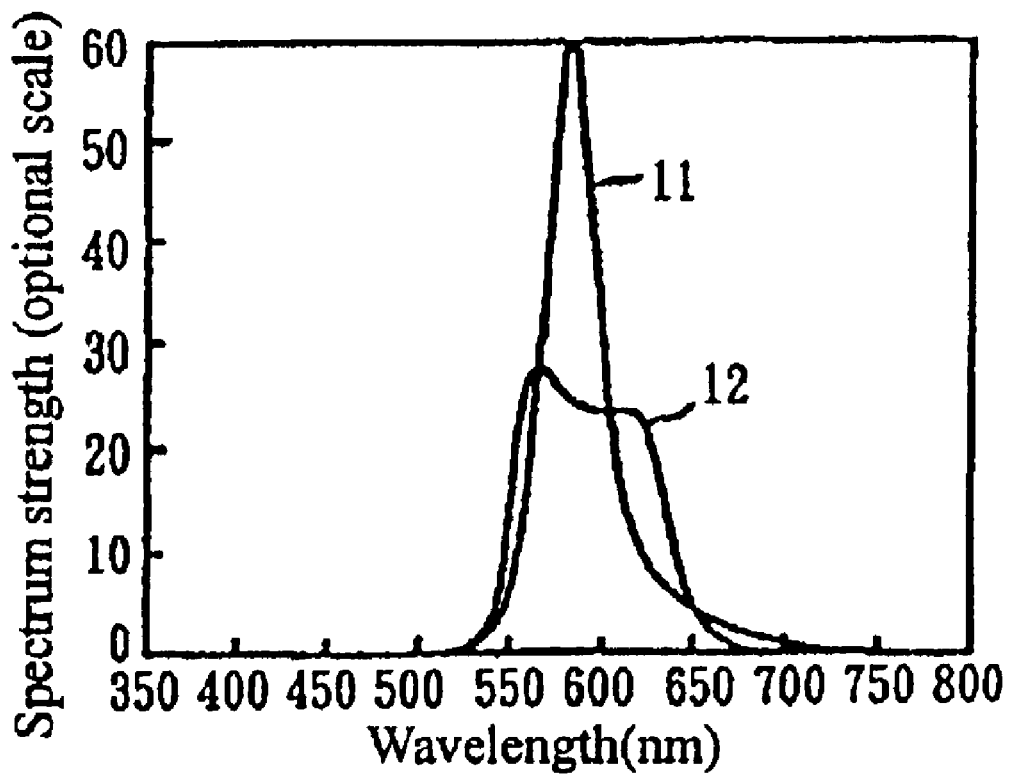
FIG. 35 is a drawing showing the relationship between the interference peak (11) and the intensity peak (12) in a conventional organic EL device.

Then, the substrate 30 was attached in the substrate holder 211 in the vacuum chamber 210 of the vacuum evaprator 201, as shown in FIG. 34. The vapor deposition material container 212A was filled with 4,4'-bis(2,2-diphenylvinyl) biphenyl (hereinafter referred to as (DPVBi)) which forms an organic light-emitting layer 12, the container 212B was filled with 4,4'-bis[2-(4-(N,N-di-p-tolyl)phenyl)vinyl] biphenyl (hereinafter referred to as (DTAVBi)) which forms an organic light-emitting layer, the container 212C was filled with tris(8-quinolinol)aluminum (hereinafter referred to as (Alq)) which forms an electron injection layer u14, the container 212D was filled with a reducing doping material (Li) which forms part of the electron injection layer 14, and the container 212E was filled with a metal (Al) which forms a cathode layer 16.

(2) Fabrication Organic EL Device

Next, after reducing the pressure in the vacuum chamber 210 shown in FIGS. 34 to 6×10$^{-5}$ Pa or less, an organic blue light emitting layer 12 formed from DPVBi and DTAVBi, an electron injection layer 14 formed by simultaneous vapor deposition of Alq and Li, and a cathode layer 16 made of aluminum were laminated in that order on a transparent electrode (ITO film) 10 of the substrate 30, thereby obtaining an organic EL device.

In this instance, the total optical path length (t1) of the transparent electrode and the blue light emitting organic layer was set at 430 nm at which the CIEy chromaticity coordinates exhibit a minimum value (Min).

Thickness of the transparent electrode (refractive index 1.7): 130 nm

Thickness of the organic light emitting layer (refractive index 1.7): 80 nm

Thickness of the electron injection layer (refractive index 1.7): 43 nm

Thickness of the cathode layer: 200 nm (3) Evaluation of Organic EL Device

A DC voltage of 7V was applied between the cathode layer 16 (minus (−) electrode) and the transparent electrode 10 (plus (+) electrode) of the resulting organic EL device 100. At this time, the current density was 1.3 mA/cm$^2$ and the luminance measured by using a luminance meter was 39 cd/m$^2$ (the luminance was measured in the same manner in the following examples). The chromaticity, in terms of the value of the CIE chromaticity coordinates according to JIS Z 8701, was CIEx=0.150 and CIEy=0.223, confirming blue light with an excellent color tone.

In addition, the half life of the organic EL device was measured to confirm that the device had a long half life of 1,000 hours or longer. "Half lifer" means the period of time required for luminance to become one half of the maximum luminance. For instance, in Example 1, the half life is a period of time required for the maximum luminance of 100 cd/m$^2$ to become one half of that value, 50 cd/m$^2$.

Example 2

In Example 2, an organic EL device was prepared in the same manner as in Example 1, except for using a green organic light emitting layer (thickness 120 nm) made by vapor deposition of Alq and coumarin 6 with the total optical path length (t3) of 497 nm, close to 500 nm at which the CIEy exhibits a maximum optical path length (Max).

The performance of the organic EL device was evaluated by applying a DC voltage of 7V to confirm that the current density was 1.1 mA/Cm$^2$ and luminance was 70 cd/m$^2$. The CIE chromaticity coordinates according to JIS Z 8701 were CIEx=0.256 and CIEy=0.655, confirming green light with an excellent color tone.

Example 3

In Example 3, an organic EL device was prepared in the same manner as in Example 1, except for using a red organic light emitting layer (thickness 57 nm) made by vapor deposition of Alq and 4-dicyanomethylene-2-methyl-6-(P-dimethylaminostyryl)-4H-pyrane with the total optical path length (t2) of 390 which coincides with an optical path length at which the CIEx exhibits a maximum value (Max).

The performance of the organic EL device was evaluated by applying a DC voltage of 7V between the electrodes to confirm that the current density was 0.98 mA/cm$^2$ and luminance was 25 cd/M$^2$.

The CIE chromaticity coordinates according to JIS Z 8701 were CIEx=0.655 and CIEy=0.352, confirming red light with an excellent color tone.

Example 4

In Example 4, an organic EL device was prepared in the same manner as in Example 1, except that a magnesium oxide layer (thickness: 20 nm) was inserted between the glass substrate and the transparent electrode as an optical path length correction layer and an organic light emitting layer with a thickness of 58 nm was used. The total optical path length was 430 nm which coincides with the optical path length at which CIEy exhibits a minimum value (Min).

The performance of the organic EL device was evaluated by applying a DC voltage of 7V between the electrodes to confirm that the current density was 1.1 mA/cm$^2$ and luminance was 33 cd/m$^2$.

The CIE chromaticity coordinates according to JIS Z 8701 were CIEx=0.151 and CIEy=0.224. This means that insertion of the optical path length correction layer decreased the CIEy value by 0.01 as compared with the organic EL device with no optical path length correction layer in the comparative example1, confirming that blue light with an excellent color tone was obtained.

Example 5

In Example 5, an organic EL device was prepared in the same manner as in Example 1, except that a magnesium oxide layer (thickness: 20 nm) was inserted between an electronic injection layer and a cathode, and an organic light emitting layer with a thickness of 58 nm was used. The total optical path length was 430 nm which coincides with the optical path length at which CIEy exhibits a minimum value (Min).

The performance of the organic EL device was evaluated by applying a DC voltage of 7V between the electrodes to confirm that the current density was 0.90 mA/cm² and luminance was 26 cd/m².

The CIE chromaticity coordinates according to JIS Z 8701 were CIEx=0.151 and CIEy=0.224. This means that insertion of the optical path length correction layer decreased the CIEy value by 0.01 as compared with the organic EL device with no optical path length correction layer in the comparative example1, confirming that blue light with an excellent color tone was obtained.

Example 6

In Example 6, an organic EL device was prepared in the same manner as in Example 1, except that a copper phthalocyanine layer (thickness: 19 nm) was inserted between the transparent electrode and organic light emitting layer as an optical path length correction layer, and an organic light emitting layer with a thickness of 58 nm was used. The total optical path length was 430 nm which coincides with the optical path length at which CIEy exhibits a minimum value (Min).

The performance of the organic EL device was evaluated by applying a DC voltage of 7V between the electrodes to confirm that the current density was 1.2 mA/cm² and luminance was 38 cd/m².

The CIE chromaticity coordinates according to JIS Z 8701 were CIEx=0.151 and CIEy=0.225. This means that insertion of the optical path length correction layer decreased the CIEy value by 0.01 as compared with the organic EL device with no optical path length correction layer in the comparative example1, confirming that blue light with an excellent color tone was obtained.

Comparative Example 1

In Comparative Example 1, an organic EL device was prepared in the same manner as in Example 1 except for using an organic light-emitting layer with a thickness of 58 nm. The total optical path length was 392 nm, which satisfied neither of the following inequalities indicating the relationship between the total optical path length and the optical path length Min or Max at which CIEx chromaticity coordinates or CIEy chromaticity coordinates exhibits a maximum value or a minimum value.

Min−20 nm<Optical path length<Min+20 nm

Max−20 nm<Optical path length<Max+20 nm

The performance of the organic EL device was evaluated by applying a DC voltage of 7V between the electrodes to confirm that the current density was 1.5 mA/cm² and luminance was 35 cd/m².

The CIE chromaticity coordinates measured according to JIS Z 8701 were CIEx=0.158 and CIEy=0.235, indicating that the value of CIEy is a greenish blue significantly staggered to the green color side.

Figure 26:
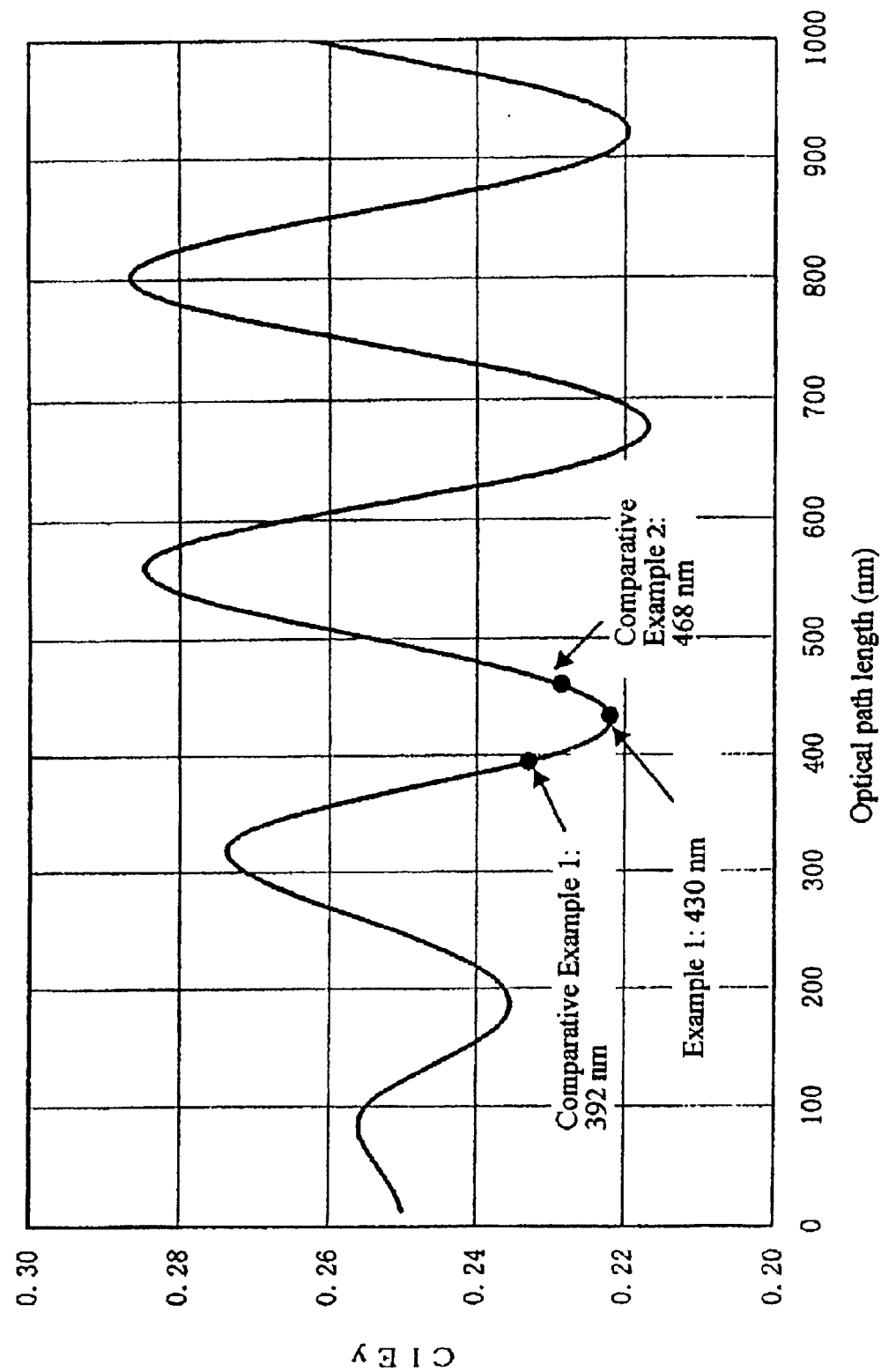
FIG. 26 is a drawing for comparing the relationship between the total optical path length and the CIEy chromaticity coordinate value of EL luminescence in Example 1 and Comparative Examples 1 and 2.

The relationship between the total optical path length and the CIEy in the Comparative Example 1 and Example 1 is shown in FIG. 26.

Comparative Example 2

In Comparative Example 2, an organic EL device was prepared in the same manner as in Example 1 except for using an organic blue light emitting layer with a thickness of 102 nm. The total optical path length was 468 nm, at which an interference peak and a intensity peak coincided and which satisfied neither of the following inequalities relating to the optical path length Min or Max at which CIEx chromaticity coordinates or CIEy chromaticity coordinates exhibits a maximum value or a minimum value.

Min−20 nm<Optical path length<Min+20 nm

Max−20 nm<Optical path length<Max+20 nm

The performance of the organic EL device was evaluated by applying a DC voltage of 7V between the electrodes to confirm that the current density was 1.1 mA/cm² and luminance was 33 cd/M².

The CIE chromaticity coordinates measured according to JIS Z 8701 were CIEx=0.148 and CIEy=0.232, indicating that the value of CIEy is a greenish blue color significantly staggered to the green color side.

The relationship between the total optical path length and the CIEy in the comparative example 2 and example 1 is shown in FIG. 26.

Comparative Example 3

In Comparative Example 3, an organic EL device was prepared in the same manner as in Example 2 except for using an organic green light emitting layer with a thickness of 81 nm. The total optical path length was 430 nm, which satisfied neither of the following inequalities indicating the relationship between the total optical path length and the optical path length Min or Max at which CIEx chromaticity coordinates or CIEy chromaticity coordinates exhibits a maximum value or a minimum value.

Min−20 nm<Optical path length<Min+20 nm

Max−20 nm<Optical path length<Max+20 nm

The performance of the organic EL device was evaluated by applying a DC voltage of 7V between the electrodes to confirm that the current density was 1.5 mA/cm² and luminance was 27 cd/m².

The CIE chromaticity coordinates measured according to JIS Z 8701 were CIEx=0.288 and CIEy=0.640, indicating that the value of CIEy is small as compared with in Example 2 and a yellowish green color significantly staggered to the yellow color side.

Figure 24:
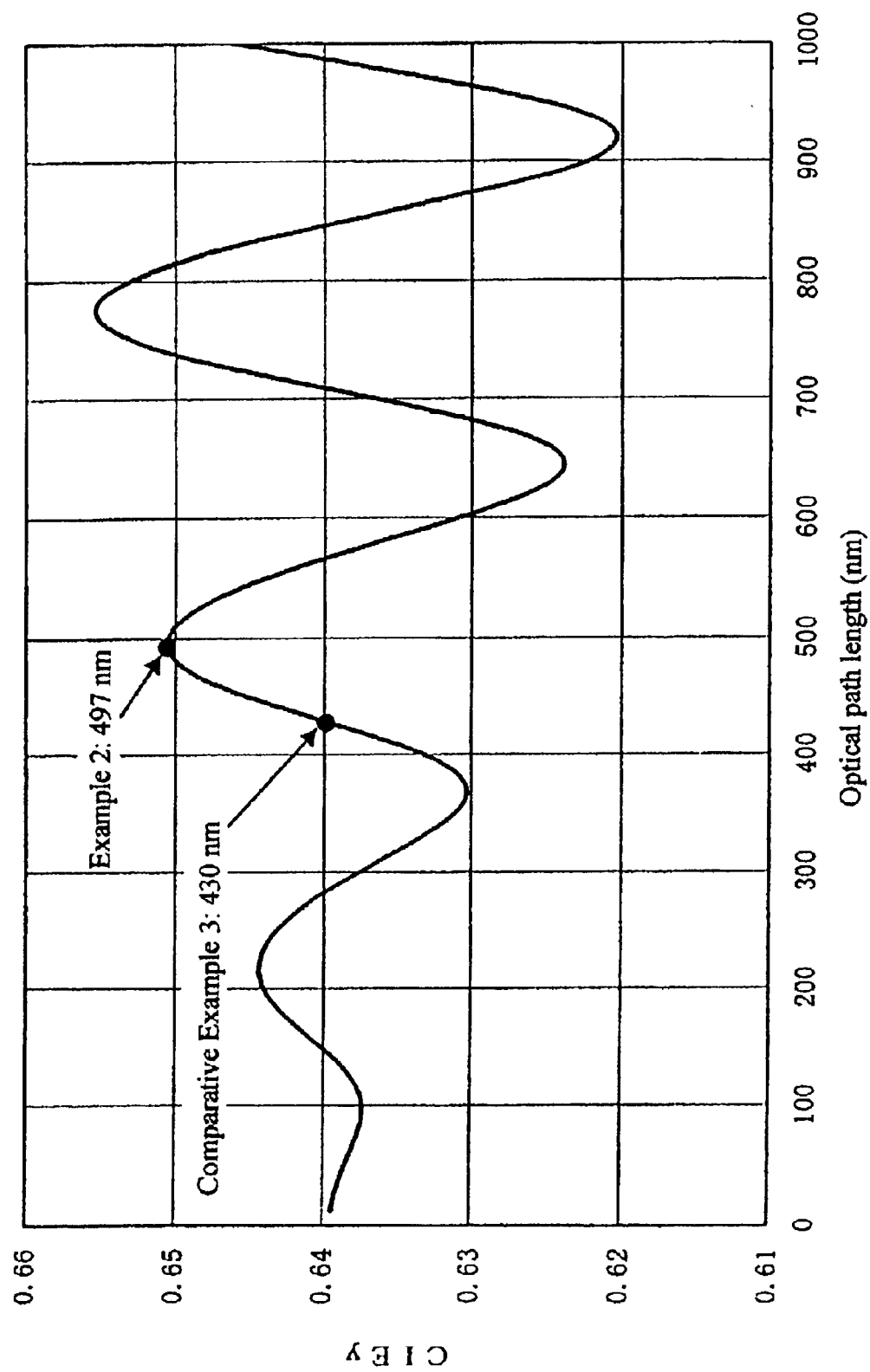
FIG. 24 is a drawing for comparing the relationship between the total optical path length and the CIEy chromaticity coordinate value of EL luminescence in Example 2 and Comparative Example 3.

The relationship between the total optical path length and the CIEy in the Comparative Example 3 and Example 2 is shown in FIG. 24.

Comparative Example 4

In Comparative Example 4, an organic EL device was prepared in the same manner as in Example 3 except for using an organic red light emitting layer with a thickness of 92 nm. The total optical path length was 450 nm, which satisfied neither of the following inequalities indicating the relationship between the total optical path length and the optical path length Min or Max at which CIEx chromaticity coordinates or CIEy chromaticity coordinates exhibits a maximum value or a minimum value.

Min−20 nm<Optical path length<Min+20 nm

Max−20 nm<Optical path length<Max+20 nm

The performance of the organic EL device was evaluated by applying a DC voltage of 7V between the electrodes to confirm that the current density was 1.5 mA/cm² and the luminance was 27 cd/m².

The CIE chromaticity coordinates measured according to JIS Z 8701 were CIEx=0.625 and CIEy=0.375, indicating that the value of CIEx is considerably small as compared with in Example 3 and a yellowish red color significantly staggered to the yellow color side.

Figure 22:
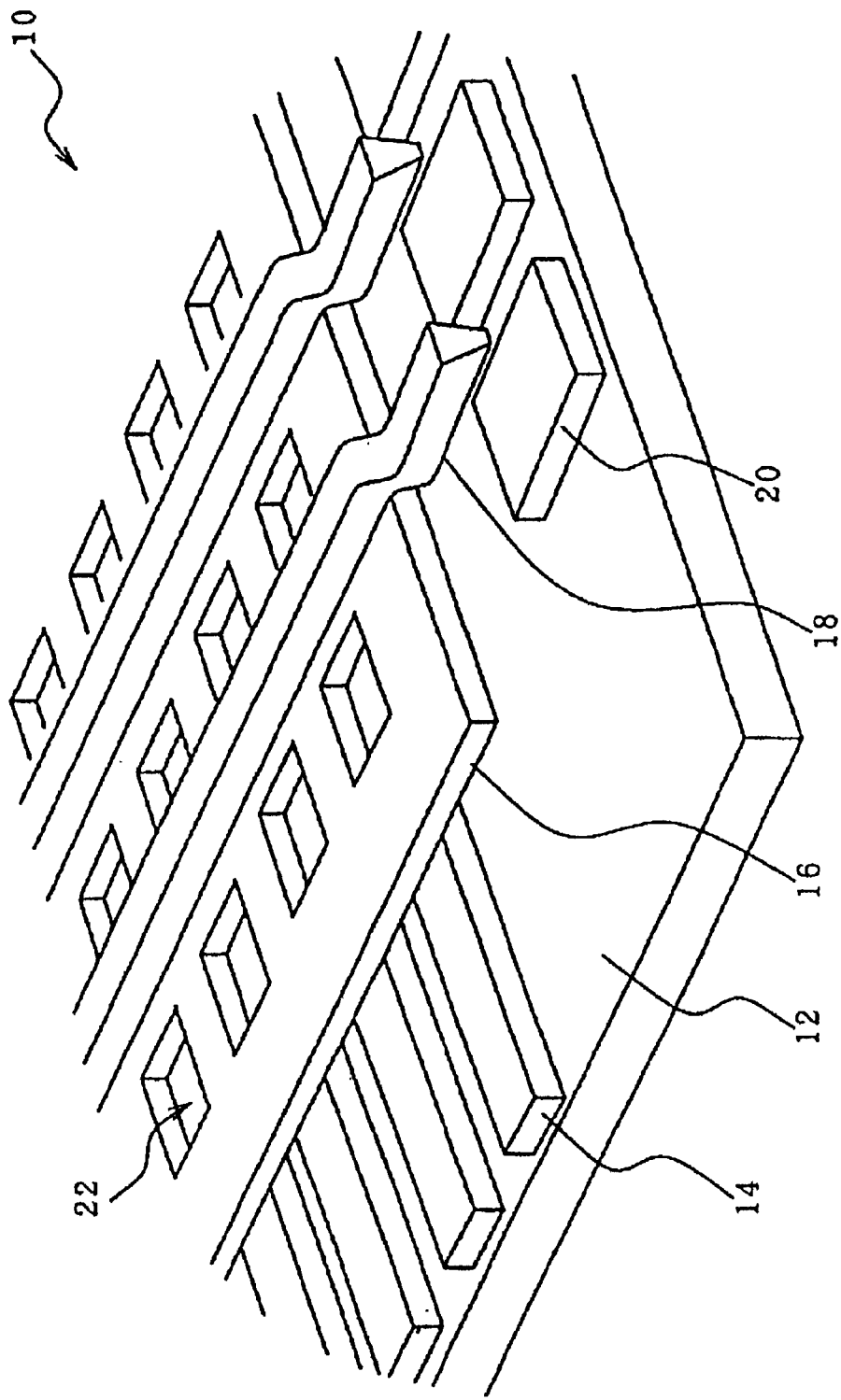
FIG. 22 is a drawing showing the organic EL device in Example 7.
Figure 25:
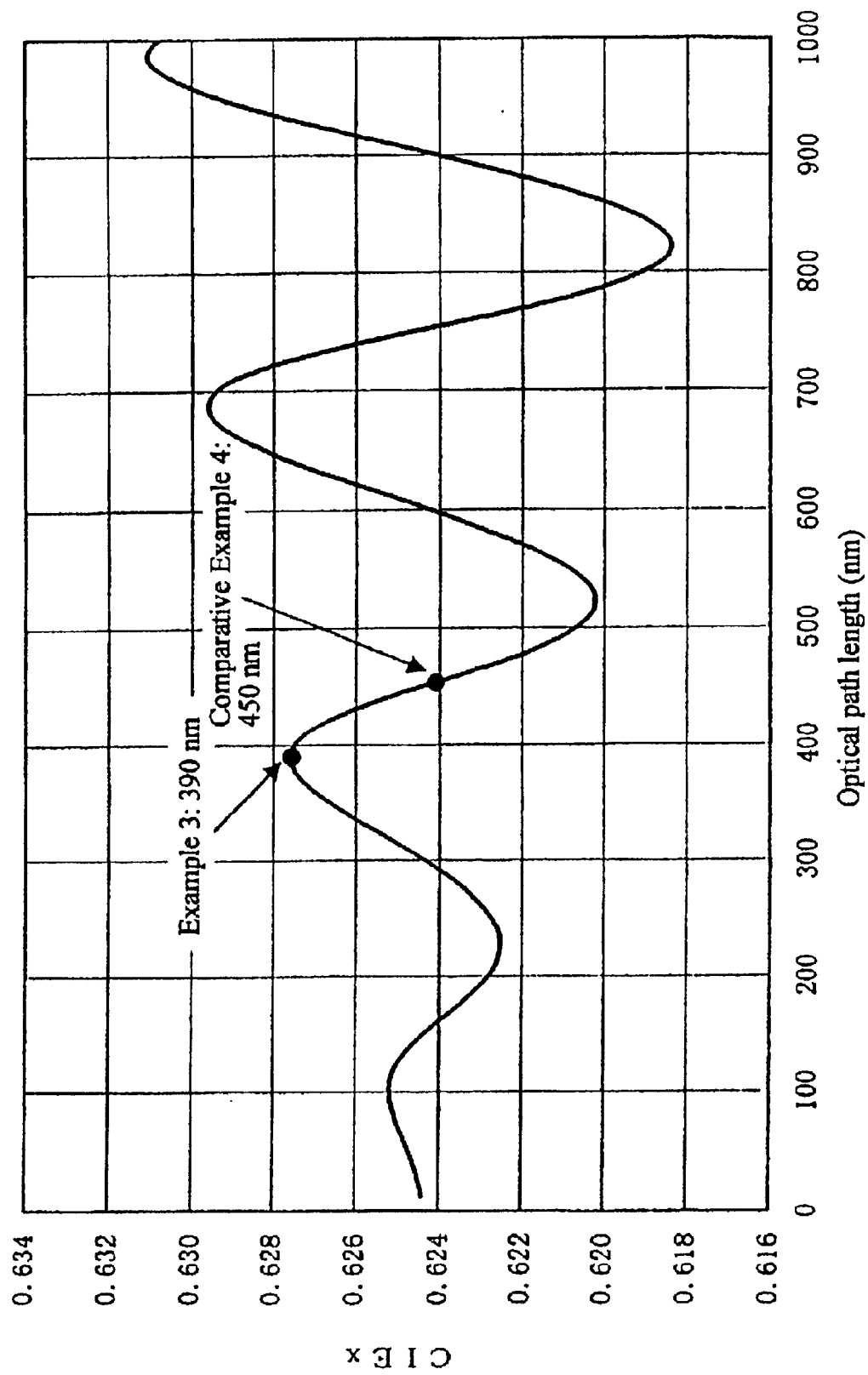
FIG. 25 is a drawing for comparing the relationship between the total optical path length and the CIEx chromaticity coordinate value of EL luminescence in Example 3 and Comparative Example 4.

The relationship between the total optical path length and the CIEx in the Comparative Example 4 and Example 3 is shown in FIG. 25.

removed by using a releasing solution N303 (manufactured by Nagase & Co., Ltd.) to obtain a stripe IZO pattern (the number of lines: 960) 14 as an anode (a lower electrode) on the glass substrate 12 as shown in FIG. 22.

(ii) Formation of First Intermediate Insulating Layer

An acrylic negative tone resist V259PH (manufactured by Nippon Steel Chemical Co., Ltd.) was spin coated onto the IZO pattern via a stripe pattern photo-mask (line width: 90

TABLE 1

|  | Example |  |  |  |  |  | Comparative Example |  |  |  |
|---|---|---|---|---|---|---|---|---|---|---|
|  | 1 | 2 | 3 | 4 | 5 | 6 | 1 | 2 | 3 | 4 |
| Optical path length correction layer | Not provided | Not provided | Not provided | Provided | Provided | Provided | Not provided | Not provided | Not provided | Not provided |
| Total optical path length (nm) | 430 | 497 | 390 | 430 | 430 | 430 | 392 | 468 | 430 | 450 |
| Max/Min Relationship | Coincide with 430 nm (CIEy Min) | Close to 500 nm (CIEy Max) | Coincide with 390 nm (CIEx Max) | Coincide with 430 nm (CIEy Min) | Coincide with 430 nm (CIEy Min) | Coincide with 430 nm (CIEy Min) | Close neither to Max nor Min | Close neither to Max nor Min | Close neither to Max nor Min | Close neither to Max nor Min |
| CIEx | 0.150 | 0.256 | 0.655 | 0.151 | 0.151 | 0.151 | 0.158 | 0.148 | 0.288 | 0.625 |
| CIEy | 0.223 | 0.655 | 0.352 | 0.224 | 0.224 | 0.225 | 0.235 | 0.232 | 0.640 | 0.375 |
| color | Blue | Green | Red | Blue | Blue | Blue | Greenish blue | Greenish blue | Yellowish green | Yellowish red |
| Current density (mA/cm$^2$) | 1.5 | 1.1 | 0.98 | 1.1 | 0.9 | 1.2 | 1.5 | 1.1 | 1.5 | 1.5 |
| luminance (cd/m$^2$) | 27 | 70 | 25 | 33 | 26 | 38 | 35 | 35 | 27 | 27 |

Example 7

(1) Preparation of Organic EL Device (i) Formation of Anode (Lower Electrode)

A glass substrate (OA2 glass manufactured by Nippon Electric Glass Co., Ltd.) with a dimension of 112 mm(length)×143 mm(width)×1.1 mm(thickness) was spin-coated with V259BK (manufactured by Nippon Steel Chemical Co., Ltd.) which is a material for a black matrix (BM). The coating was irradiated with ultraviolet rays through a grating pattern mask and unexposed areas were developed by using an aqueous solution of 2 wt % sodium carbonate. The coating was baked at 200° C. to form a black matrix (thickness: 1.5 micrometer).

An acrylic thermosetting resin V259PH (manufactured by Nippon Steel Chemical Co., Ltd.) which is a material for a flattening film was spin coated over a black matrix and baked at 160° C. to obtain a flattening film (thickness: 5 micrometer).

Then, a layer of indium zinc oxide (IZO) with a thickness of 200 nm was formed on the flattening film by a sputtering method.

Next, a positive tone resist HPR 204 (manufactured by Fuji Hunt Electronics Technology Co., Ltd.) was spin coated on the indium zinc oxide layer, and dried at 80° C. for 10 minutes.

Then, the coating was exposed to radiation using a high pressure mercury lamp as a light source through a stripe pattern photo-mask (line width: 90 micrometer, gap width: 20 micrometer), using an extraction 20 of the cathode also as a mask as shown in FIG. 22, followed by development of the exposed area by using tetramethylammonium hydroxide (TMAH). The coating was baked at 130° C. for 10 minutes to obtain a resist film.

Then, the indium zinc oxide layer exposed in the resist coating was etched using 5 wt % oxalic acid aqueous solution as an etchant. The positive tone resist HPR 204 was micronmeter, gap width: 20 micronmeter) perpendicularly crossing with the IZO pattern, dried at 80° C. for 10 minutes, and contact exposed using a high pressure mercury lamp as a light source.

The unexposed area was developed using TMAH as a developer and post baked in an oven at 160° C. for 10 minutes to obtain a first intermediate insulating layer (an IZO aperture 70 micrometer×290 micrometer) 16 shown in FIG. 22.

(iii) Formation of Second Intermediate Insulating Layer

A negative tone resist ZPN 11 00 (manufactured by Nippon Zeon Co., Ltd.) was spin coated from the first intermediate insulating layer, dried at 80° C. for 10 minutes, and contact exposed through a photo-mask having a stripe pattern (line width: 20 micrometer, gap width: 310 micrometer) parallel to the IZO pattern which is the lower electrode at a dose of 100 mJ/cm$^2$ using a high pressure mercury lamp as a light source. The unexposed area was developed using TMAH as a developer and post baked in an oven at 160° C. for 10 minutes to obtain a second intermediate insulating layer (a line width: 20 micrometer, gap width 310 micrometer) 18 as a separator shown in FIG. 22.

(iv) Washing Step

The glass substrate on which IZO patterns, etc. have been formed (hereinafter may be simply called "glass substrate") was ultrasonically washed using isopropyl alcohol, dried by injecting dry air, and washed with ultraviolet radiation for 30 minutes using a UV ozone washing apparatus (manufactured by Samco Co.).

(v) Formation of Organic Light Emitting Layer

Next, the glass substrate on which IZO patterns, etc. have been formed was secured on a substrate holder 211 in a vacuum evaporator (manufactured by ULVAC JAPAN Co.) 201 shown in FIG. 34.

The following materials were filled in a heating boats 212 A–E made of molybdenum in the vacuum evaporator 201 shown in FIG. 34.

Hole injection material: 4,4',4"-Tris[N-(3-methylphenyl)-N-phenylamino] triphenylamine (MTDATA) Hole transport material: 4,4'-Bis[N-(1-naphthyl)-N-phenylamino]-biphenyl (NPD) Organic light-emitting material: 4,4'-Bis(2,2-diphenylvinyl)biphenyl (DPVBi) and 4,4'-bis[2-(4-(N,N-di-p-tolyl)phenyl)vinyl]biphenyl (DTAVBi) Electron injection material: Tris(8-quinolinol)aluminum (Alq)

In addition, an Al—Li alloy (Li content: 10 atom %) was installed as a counter electrode (cathode) material on a filament BF-1 made of the tungsten (manufactured by Japan Backs Metal Co.) (212F in FIG. 34).

Next, the pressure of the vacuum evaporator was reduced to $6 \times 10^{-5}$ Pa and the following layers from the hole injection layer to cathode later were in-situ laminated. DPVBi and DTAVBi were co-deposited by to obtain the layers with the total thickness of 40 nm.

Figure 27:
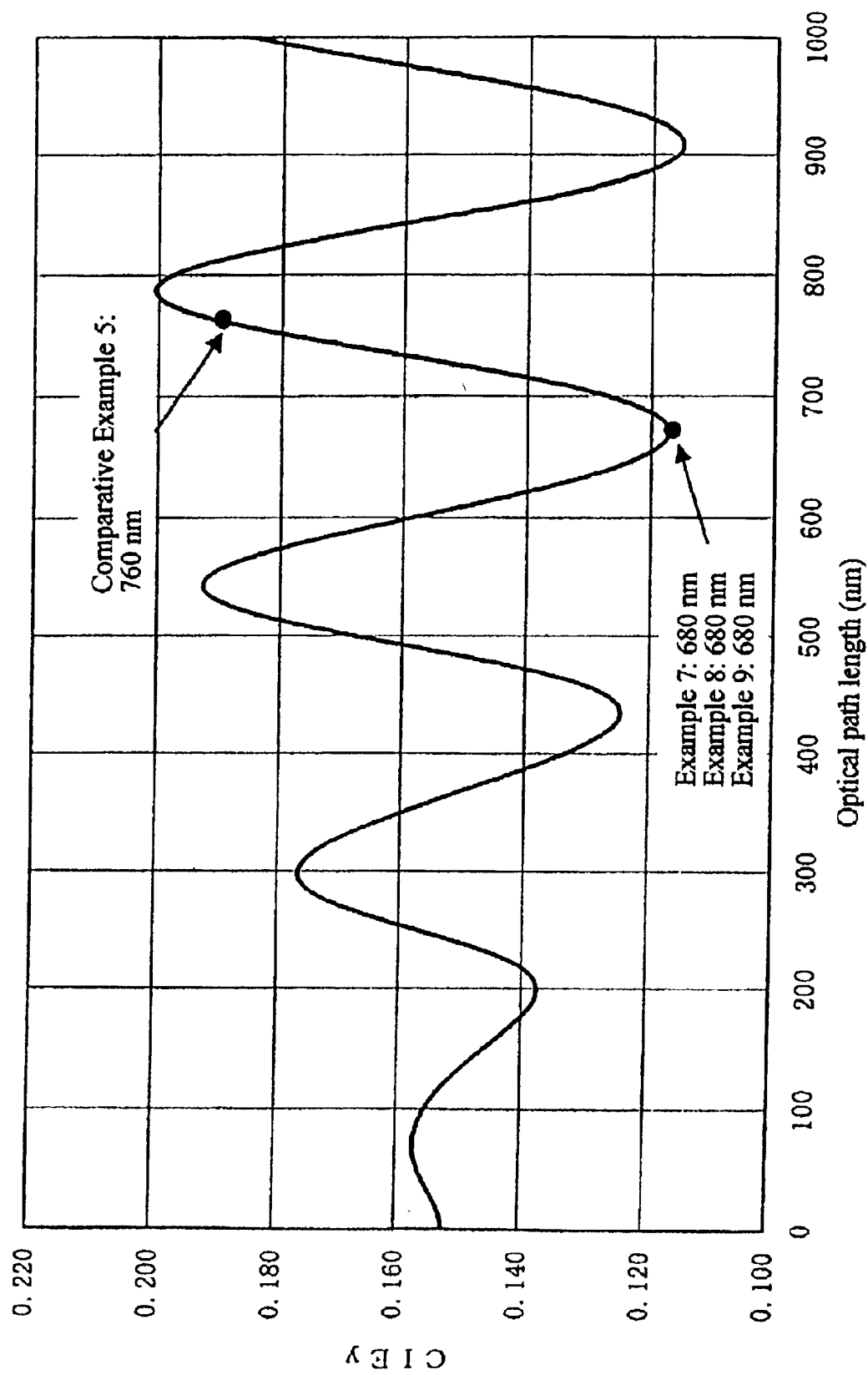
FIG. 27 is a drawing for comparing the relationship between the total optical path length and the CIEy chromaticity coordinate value of EL luminescence in Examples 7 to 9 and Comparative Example 5.

The thickness of each organic light emitting layer below is the value in the center of the layer. The total optical path length in the center of all layers was 680 nm, with the total optical path length of the transparent electrode and the organic light emitting layer (blue light emitting organic layer) being close to 670 nm which is the minimum value of the CIEy chromaticity coordinates as shown in FIG. 27.

In addition, the thickness distribution of each organic light emitting layer measured by the Elipsometer was ±1% of the mean value. Accordingly, the distribution of the total optical path length is also ±1% of the mean value, because there is substantially no thickness distribution of the transparent electrode.

MTDATA: Vapor deposition rate 0.1–0.3 nm/sec, thickness 76 nm
NPD: Vapor deposition rate 0.1–0.3 nm/sec, thickness 20 nm
DPVBi: Vapor deposition rate 0.4 nm/sec, thickness 40 nm
DTAVBi: Vapor deposition rate 0.1 nm/sec
Alq: Vapor deposition rate 0.1–0.3 nm/sec, thickness 20 nm
Al—Li: Vapor deposition rate 0.5–1.0 nm/sec, thickness 150 nm (vi) Sealing Step In the sealing step, a glass substrate (a soda-lime glass) for sealing was bonded on the cathode side by using a cationic curable adhesive TB3102 (manufactured by ThreeBond Co., Ltd.), thus obtaining an organic EL device (number of pixels 320×240, an aperture factor 56%) in which the lower electrode and upper electrode form an XY matrix.

(2) Evaluation of Organic EL Device

A DC voltage of 7V was applied between the transparent electrodes (anodes) and the counter electrodes (cathodes) of the resulting organic EL device to confirm that light was emitted at crossing points (pixels) of each electrode. Luminance and chromaticity distribution were determined using a luminous distribution measurement equipment CA-1000 (manufactured by Minolta Co., Ltd.).

As a result, the organic EL device was found to have a difference between the maximum and minimum values of CIEx of 0.0046 and a difference between the maximum and minimum values of CIEy of 0.0010, confirming that this is an organic EL device exhibiting an excellent blue light tone which is subject only to minimum change.

In addition, distribution of luminance on the plane was determined by using a luminance meter to confirm that the distribution was as small as 5% or less of the mean value.

Comparative Example 5

In Comparative Example 5, an organic EL device (the number of pixels 320×240, an aperture factor 56%) was prepared and evaluated in the same manner as in Example 7, except that the thickness of MTDATA was 120 nm and the total optical path length was 760 nm.

As a result, the organic EL device was found to have the total optical path length of the central part of about 760 nm, a difference between the maximum and minimum values of CIEx of 0.0039, and a difference between the maximum and minimum values of CIEy of 0.023. The distribution of luminance on the plane was confirmed to be as small as 5% or less of the mean value.

Accordingly, as compared with the organic EL device of Example 7, this organic EL device was confirmed to have a larger difference between the maximum and minimum values of CIEy of 20 times or more, indicating that the organic EL device exhibits a poor blue color purity and the color is recognized as bluish green according to the luminous location of pixels.

Example 8

(1) Preparation of Organic EL Device

In Example 8, an organic EL device (the number of pixels 320×240, the aperture factors 56%) was prepared in the same manner as in Example 7, except that the following blue color filter forming step, green color transformation layer forming step, and red color transformation layer forming step were provided between the black matrix (BM) forming step and the flattening layer forming step.

Specifically, a blue color filter material V259B (manufactured by Nippon Steel Chemical Co., Ltd.) was spin coated. Contact exposure was performed at a dose of 100 mJ/cm$^2$ using a high pressure mercury lamp as a light source through a stripe pattern photo-mask (line width: 90 micrometer, gap width: 240 micrometer, the number of stripes 320) with the position of the photo-mask being mated with the black matrix. The coating was then developed using an aqueous solution of 2 wt % sodium carbonate and baked at 200° C. for 10 minutes to obtain a blue color filter (thickness: 1.5 micrometer).

A mixture of 0.04 mol/Kg (for solid component) of coumarin 6 and an acrylic negative tone resist V259PA (solid content: 50 wt %, manufactured by Nippon Steel Chemical Co., Ltd.) was spin coated over the blue color filter as a material of a green color transformation film. Then, contact exposure was performed at a dose of 100 mJ/cm$^2$ using a high pressure mercury lamp as a light source through the same photo-mask as used for the formation of the blue color filter with the position of the photo-mask being staggered by a pitch of 110 micrometer against the stripe pattern of the blue color filter in the longitudinal direction of the plane. The coating was then developed using an aqueous solution of 2 wt % sodium carbonate and baked at 200° C. for 10 minutes to obtain a green color transformation film (thickness 10 micrometer).

A mixture of 0.53 g of coumarin G, 1.5 g of basic violet 11, 1.5 g of Rhodamine 6G, and 100 g of an acrylic negative tone resist V259PA (solid content: 50 wt %, manufactured by Nippon Steel Chemical Co., Ltd.) was spin coated over the green color filter as a material for a red color transformation film. Then, contact exposure was performed at a dose of 100 mJ/cm$^2$ using a high pressure mercury lamp as a light source through the same photo-mask as used for the formation of the blue color filter with the position of the photo-mask being staggered by a pitch of 220 micrometer against the stripe pattern of the blue color filter in the longitudinal direction of the plane. The coating was then developed using an aqueous solution of 2 wt % sodium carbonate and baked at 160° C. for 10 minutes to obtain a red color transformation film (thickness: 10 micrometer).

Figure 23:
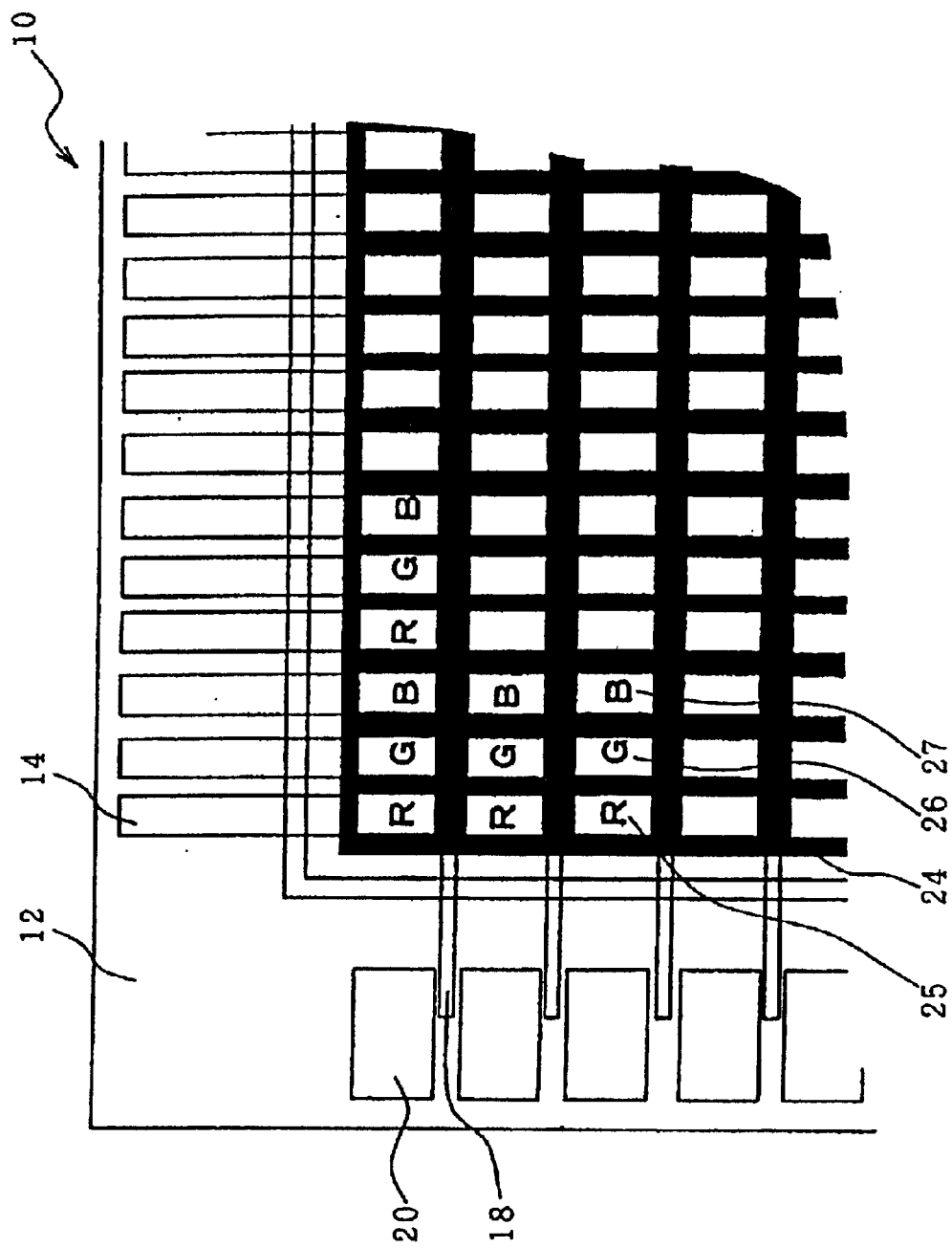
FIG. 23 is a drawing showing the organic EL device in Example 8.

In this manner, a color filter 10 comprising a blue color transformation film 27, a green color transformation film 26, a red color transformation film 25, and a black matrix 24 as shown in FIG. 23 was prepared.

The total optical path length of the transparent electrode, blue color filter, flattening layer, and organic light emitting medium (a blue light emitting organic layer) was 680 nm, close to 670 nm of the minimum value of CIEy chromaticity coordinates as shown in FIG. 27.

(2) Evaluation of Organic EL Device

A DC voltage of 7V was applied between the transparent electrodes (anodes) and the counter electrodes (cathodes) of the resulting organic EL device to confirm that light was emitted at crossing points (pixels) of each electrode. Luminance and chromaticity distribution were determined using a luminous distribution measurement equipment CA-1000 (manufactured by Minolta Co., Ltd.).

As a result, the organic EL device was found to emit an excellent blue color tone with a high color purity at pixels corresponding to the blue color filter and to have a difference between the maximum and minimum values of CIEx of 0.0017 and a difference between the maximum and minimum values of CIEy of 0.0029. In addition, distribution of luminace was measured using a luminance meter to confirm that the plane distribution was as small as 8% or less of the mean value.

To compare these results with Comparative Example 6, the results of CIEx and CIEy values, luminance distribution, and luminous color obtained for blue color light emission are shown in Table 2.

In addition, the organic EL device was confirmed to emit an excellent green color tone at pixels corresponding to the green color transformation film and to have a difference between the maximum and minimum values of CIEx of 0.0057 and a difference between the maximum and minimum values of CIEy of 0.0008. In addition, distribution of luminance was measured using a luminance meter to confirm that the plane distribution was as small as 5% or less of the mean value.

In addition, an excellent red color tone was emitted at pixels corresponding to the red color transformation film, and the difference between the maximum and minimum values of CIEx was 0.0017 and the difference between the maximum and minimum values of CIEy was 0.00022.

In addition, distribution of luminance was measured using a luminance meter to confirm that the plane distribution was as small as 5% or less of the mean value.

Furthermore, when all lights were emitted, white luminosity was obtained utilizing the effect of optical interference. In this instance, the difference between the maximum and minimum values of CIEx was 0.0036 and the difference between the maximum and minimum values of CIEy was 0.00084. The distribution of luminance on the plane was confirmed to be as small as 5% or less of the mean value.

When the white luminosity was emitted by all pixel lightening, the average luminance of the organic EL device was 96.8 cd/m$^2$, the CIEx chromaticity was 0.2934, and the CIEy chromaticity was 0.3471.

The organic EL device was thus confirmed to exhibits minimum CIEy color difference and to produce blue, green, red, and a full color of white luminosity with excellent color purity.

Comparative Example 6

In Comparative Example 6, an organic EL device (the number of pixels 320×240, an aperture factor 56%) was prepared and evaluated in the same manner as in Example 8, except that the thickness of MTDATA was 120 nm.

The total optical path length of the transparent electrode, blue color filter, flattening layer, and organic light emitting layer (a blue light emitting organic layer) was 760 nm, which satisfied neither of the following inequalities relating to the relationship between the minimum value (Min) and maximum value (Max) of the CIEx chromaticity coordinates or CIEy chromaticity coordinates.

Min−20 nm<Optical path length<Min+20 nm

Max−20 nm<Optical path length<Max+20 nm

As a result, the organic EL device was found to emits an excellent blue color tone at pixels corresponding to the blue color filter and to have a difference between the maximum and minimum values of CIEx of 0.00028 and a difference between the maximum and minimum values of CIEy of 0.013. The distribution of luminance on the plane was as small as 5% or less of the mean value.

To compare these results with Comparative Example 8 and other Examples, the results of CIEx and CIEy values, luminance distribution, and luminous color obtained for blue color light emission are shown in Table 2.

In addition, the organic EL device was confirmed to emit an excellent green color tone at pixels corresponding to the green color transformation film and to have a difference between the maximum and minimum values of CIEx of 0.0019 and a difference between the maximum and minimum values of CIEy of 0.0090. The distribution of luminous brightness on the plane was 5% or less of the mean value.

In addition, the organic EL device was confirmed to emit an excellent red color tone at pixels corresponding to the red color transformation film, and to have the difference between the maximum and minimum values of CIEx of 0.0025 and the difference between the maximum and minimum values of CIEy of 0.0032. The distribution of luminous brightness on the plane was 5% or less of the mean value.

In addition, the organic EL device was confirmed to exhibit white luminosity utilizing the effect of optical interference when all lights were lightened, and to have a difference between the maximum and minimum values of CIEx of 0.0021 and a difference between the maximum and minimum values of CIEy of 0.018. The distribution of luminance on the plane was 5% or less of the mean value. When the white luminosity was emitted, the average luminance of the organic EL device was 120.3 cd/m$^2$, the CIEx chromaticity was 0.2909, and the CIEy chromaticity was 0.4223.

When the white luminosity was emitted, the organic EL device was confirmed to emit greenish white color due to a large CIEy chromaticity difference as compared with that of Example 8.

The average luminance of the organic EL device of Comparative Example 6 is larger than that of Example 8 because of the visual effect due to deviation of the white luminosity to the green color side. Excellent white luminosity is preferable because of the capability of producing desired luminosity when images are displayed. Therefore, in spite of high average brightness, the organic EL device of Comparative Example 6 is inferior to that of Example 8 in color purity.

Example 9

In Example 9, an organic EL device (the number of pixels 640×480, an aperture factor 56%) was prepared and evaluated in the same manner as in Example 8, except for using a glass substrate with a dimension of 260 mm(length)×210 mm(width)×1.1 mm(thickness) (OA2 glass manufactured by Nippon Electric Glass Co., Ltd.) instead of the glass substrate with a dimension of 112 mm(length)×143 mm(width)×1.1 mm(thickness) used in Example 8.

The total optical path length of the transparent electrode, blue color filter, flattening layer, and organic light emitting medium (a blue light emitting organic layer) was 680 nm, close to 670 nm of the minimum value of CIEy chromaticity coordinates as shown in FIG. 27.

The organic EL device was confirmed to emit a blue color at pixels corresponding to the blue color filter and to have a difference between the maximum and minimum values of CIEx of 0.0049 and a difference between the maximum and minimum values of CIEy of 0.010. The distribution of luminance on the plane was 23% or less of the mean value.

To compare these results with Comparative Example 7, the results of CIEx and CIEy values, luminance distribution, and luminous color obtained for blue color emission are shown in Table 2.

In addition, the organic EL device was confirmed to emit a green color at pixels corresponding to the green transformation film, and to have a difference between the maximum and minimum values of CIEx of 0.0017 and a difference between the maximum and minimum values of CIEy of 0.0037. The distribution of luminance on the plane was 12% or less of the mean value.

In addition, the organic EL device was confirmed to emit a red color at pixels corresponding to the red color transformation film, and to have a difference between the maximum and minimum values of CIEx of 0.0053 and a difference between the maximum and minimum values of CIEy of 0.0018. The distribution of luminance on the plane was 15% or less of the mean value.

In addition, the organic EL device was confirmed to exhibit white luminosity utilizing the effect of optical interference when all lights were lightened, and to have a difference between the maximum and minimum values of CIEx of 0.010 and a difference between the maximum and minimum values of CIEy of 0.0068. The distribution of luminance on the plane was 14% or less of the mean value. When the white luminosity was emitted, the average luminance of the organic EL device was 96.8 cd/M$^2$, the CIEx chromaticity was 0.2943, and the CIEy chromaticity was 0.3471.

Accordingly, the organic EL device was confirmed to exhibits minimal CIEy color difference, to produce a full color display of blue, green, red, and white luminosity with excellent color purity, notwithstanding a large panel area and a broad luminance of each color.

Comparative Example 7

In Comparative Example 7, an organic EL device (the number of pixels 640×480, an aperture factor 56%) was prepared in the same manner as in Example 9, except that the thickness of MTDATA was 120 nm.

The total optical path length of the transparent electrode, blue color filter, flattening layer, and organic light emitting medium (a blue light emitting organic layer) was 760 nm, which satisfied neither of the following inequalities relating to the relationship between the minimum value (Min) and maximum value (Max) of the CIEx chromaticity coordinates or CIEy chromaticity coordinates.

Min−20 nm<Optical path length<Min+20 nm

Max−20 nm<Optical path length<Max+20 nm

The organic EL device was confirmed to emit a blue color at pixels corresponding to the blue color filter and to have a difference between the maximum and minimum values of CIEx of 0.0020 and a difference between the maximum and minimum values of CIEy of 0.036. The distribution of luminous brightness on the plane was 7% or less of the mean value.

To compare these results with Example 9 and other Examples, the results of CIEx and CIEy values, luminance distribution, and luminous color obtained for blue color light emission are shown in Table 2.

In addition, the organic EL device was confirmed to emit a green color at pixels corresponding to the green transformation film, and to have a difference between the maximum and minimum values of CIEx of 0.0067 and a difference between the maximum and minimum values of CIEy of 0.025. The distribution of luminance on the plane was 8% or less of the mean value.

In addition, the organic EL device was confirmed to emit a red color at pixels corresponding to the red color transformation film, and to have a difference between the maximum and minimum values of CIEx of 0.0071,and a difference between the maximum and minimum values of CIEy of 0.0091. The distribution of luminance on the plane was 8% or less of the mean value.

In addition, the organic EL device was confirmed to exhibit white luminosity utilizing the effect of optical interference when all lights were lightened, and to have a difference between the maximum and minimum values of CIEx of 0.0031 and a difference between the maximum and minimum values of CIEy of 0.037. The distribution of luminance on the plane was 5% or less of the mean value. When the white luminosity was emitted, the average luminance of the organic EL device was 120.3 cd/m$^2$, the CIEx chromaticity was 0.2909, and the CIEy chromaticity was 0.4223. When the white luminosity was emitted, the organic EL device was confirmed to emit greenish white color due to a particularly large CIEy chromaticity difference as compared with that of Example 9.

The average luminance of the organic EL device of Comparative Example 7 was larger than that of Example 9. As described in Example 8, this is because of the visual effect due to deviation of the white luminosity to the green color side.

TABLE 2

|  | Example | | Comparative Example | |
| --- | --- | --- | --- | --- |
|  | 8 | 9 | 6 | 7 |
| Optical path length correction layer | Blue | Blue | Blue | Blue |
| Optical path length (nm) | 680 | 680 | 760 | 760 |
| Max/Min relationship | Close to CIEy Min | Close to CIEy Min | No relationship | No relationship |
| CIEx difference | .0017 | .0049 | .00028 | .0020 |
| CIEy difference | .0029 | .010 | .013 | .036 |
| Luminance distribution | 7.9% | 22.9% | 1.9% | 6.4% |
| color | Blue | Blue | Greenish Blue | Greenish Blue |

*Only measurement results relating to luminosity data obtained through blue color filters are presented.

INDUSTRIAL APPLICABILITY THE INVENTION

As described above in detail, in the organic EL device of the present invention, the total optical path length of a transparent electrode and an organic layer is determined taking into consideration the minimum value (Min) and maximum value (Max) of the CIE chromaticity coordinates measured in accordance with JIS Z 8701. This minimizes the change in the CIE chromaticity coordinates and ensures luminosity with excellent color tone, even if there is some fluctuation in the total optical path length of the organic layer.

Therefore, the technology of the present invention is extremely effective for obtaining luminosity with an excellent color tone in an organic EL device with a large area (for example 10 inches or more) of an organic layer, even if there is some fluctuation in the thickness of the organic layer.

In addition, using the method of manufacturing of the organic EL device of the present invention, an organic EL device exhibiting an excellent color tone and minimal change in the CIE chromaticity coordinates can be efficiently produced even if there is some fluctuation in the total optical path length of the organic layer due to a large area of the organic layer, for example.

What is claimed is:

1. A method of manufacturing an organic electroluminescence device containing an organic layer formed between electrodes at least one of which is a transparent electrode, wherein the method comprises a forming step of the transparent electrode and the organic layer that satisfies the following inequality (a) or inequality (b) or both:

$$\text{Min}-20 \text{ nm} < t < \text{Min}+20 \text{ nm} \quad (a)$$

$$\text{Max}-20 \text{ nm} < t < \text{Max}+20 \text{ nm} \quad (b)$$

wherein t is the total optical path length (nm), Min is the optical path length (nm) at which the CIEx chromaticity coordinates or CIEy chromaticity coordinates measured according to JIS Z 8701 exhibit a minimum value, and Max is the optical path length (nm) at which the CIEx chromaticity coordinates or CIEy chromaticity coordinates measured according to JIS Z 8701 exhibit a maximum value.

2. The method of manufacturing the organic electroluminescence device according to claim 1, wherein the total optical path length (t) is adjusted by forming an organic layer on a previously fabricated transparent electrode.

3. The method of manufacturing the organic electroluminescence device according to claim 1, which comprises a step of forming an optical path length correcting layer for adjusting the value of the total optical path length (t) of the transparent electrode and the organic layer.

4. The method of manufacturing the organic electroluminescence device according to claim 2, which comprises a step of forming an optical path length correcting layer for adjusting the value of the total optical path length (t) of the transparent electrode and the organic layer.

* * * * *